(12) United States Patent
Choi et al.

(10) Patent No.: US 12,324,238 B2
(45) Date of Patent: Jun. 3, 2025

(54) SEMICONDUCTOR DEVICE

(71) Applicant: SAMSUNG ELECTRONICS CO., LTD., Suwon-si (KR)

(72) Inventors: Kyubong Choi, Seoul (KR); Yeonho Park, Seoul (KR); Junmo Park, Seoul (KR); Eunsil Park, Hwaseong-si (KR); Junseok Lee, Suwon-si (KR); Jinseok Lee, Busan (KR); Wangseop Lim, Cheonan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 512 days.

(21) Appl. No.: 17/733,143

(22) Filed: Apr. 29, 2022

(65) Prior Publication Data
US 2023/0023711 A1    Jan. 26, 2023

(30) Foreign Application Priority Data

Jul. 26, 2021   (KR) .................. 10-2021-0098064

(51) Int. Cl.
*H10D 84/90*    (2025.01)
*H10D 30/01*    (2025.01)
(Continued)

(52) U.S. Cl.
CPC ......... *H10D 84/907* (2025.01); *H10D 30/031* (2025.01); *H10D 30/6713* (2025.01);
(Continued)

(58) Field of Classification Search
CPC .......... H01L 29/0665; H01L 29/66545; H01L 29/41766; H01L 29/66742; H01L 29/78618; H01L 29/0847; H01L 29/42392; H01L 29/0673; H01L 29/775; H01L 29/66553; H01L 27/11807; H01L 29/78696; H01L 29/66439; H01L 29/161; H01L 29/7848; H01L 29/165;
(Continued)

(56) References Cited

U.S. PATENT DOCUMENTS 9,831,306 B2   11/2017   Webb et al.
10,008,601 B2   6/2018   Cheng et al.
(Continued)

*Primary Examiner* — Mouloucoulaye Inoussa
(74) *Attorney, Agent, or Firm* — Sughrue Mion, PLLC

(57) ABSTRACT

A semiconductor device is provided. The semiconductor device includes: first, second and third active patterns on a logic cell region of a substrate and are spaced apart from each other in a first direction; first and second gate electrodes, the first gate electrode crossing the first active pattern and the second gate electrode crossing the second active pattern; a first separation pattern provided between the first and second active patterns; a second separation pattern provided between the second and third active patterns; a first gate insulating layer interposed between the first gate electrode and the first active pattern; and a first gate cutting pattern interposed between the first and second gate electrodes, and in contact with a top surface of the first separation pattern. The first separation pattern is wider than the second separation pattern, and the first gate insulating layer extends between the first gate electrode and the first separation pattern, and contacts side and top surfaces of the first separation pattern.

19 Claims, 39 Drawing Sheets

(51) Int. Cl.
*H10D 30/67* (2025.01)
*H10D 62/10* (2025.01)
*H10D 64/01* (2025.01)

(52) U.S. Cl.
CPC ..... *H10D 30/6735* (2025.01); *H10D 30/6757* (2025.01); *H10D 62/118* (2025.01); *H10D 64/017* (2025.01); *H10D 64/018* (2025.01); *H10D 84/931* (2025.01); *H10D 84/953* (2025.01)

(58) Field of Classification Search
CPC ............. H01L 27/0886; H01L 27/0207; H01L 21/823821; H01L 21/823431; H01L 27/0924; H01L 29/6681; H01L 27/0928; H01L 29/785; H01L 21/823871; H01L 27/092; H01L 21/823814; H01L 29/4966; H01L 29/41791; H01L 21/823807; H01L 2027/11831; H01L 2027/11853; H01L 2029/7858; H01L 2027/11887; B82Y 10/00; H10B 10/125; H10B 10/12; H10B 10/18; G11C 11/419; G11C 5/025; G11C 11/412

See application file for complete search history.

(56) References Cited

U.S. PATENT DOCUMENTS

| | | | |
|---|---|---|---|
| 10,062,784 B1 | 8/2018 | Lee et al. | |
| 10,347,751 B2 | 7/2019 | Ching et al. | |
| 10,366,930 B1 | 7/2019 | Xie et al. | |
| 10,510,620 B1* | 12/2019 | Chanemougame | H01L 27/0924 |
| 10,629,701 B1 | 4/2020 | Xie et al. | |
| 10,741,401 B1 | 8/2020 | Xu et al. | |
| 10,832,916 B1 | 11/2020 | Xie et al. | |
| 10,861,752 B2 | 12/2020 | Perng et al. | |
| 10,872,891 B2* | 12/2020 | Lin | H01L 21/823481 |
| 11,158,632 B1* | 10/2021 | Liaw | H01L 27/0886 |
| 2016/0078922 A1* | 3/2016 | Liaw | H01L 29/7827 365/51 |
| 2018/0254287 A1* | 9/2018 | Seo | H01L 23/528 |
| 2019/0139830 A1 | 5/2019 | Xie et al. | |
| 2020/0027992 A1* | 1/2020 | Jung | H01L 29/78696 |
| 2020/0035567 A1* | 1/2020 | Chanemougame | H01L 29/401 |
| 2020/0058653 A1* | 2/2020 | Chiang | H01L 29/24 |
| 2020/0066725 A1* | 2/2020 | Bhuwalka | H01L 29/7831 |
| 2020/0083222 A1* | 3/2020 | Kim | H01L 21/823821 |
| 2020/0135848 A1* | 4/2020 | Lim | H01L 21/76237 |
| 2020/0312844 A1* | 10/2020 | Jeon | H01L 29/78696 |
| 2020/0395354 A1* | 12/2020 | Lee | G06F 30/394 |
| 2021/0028068 A1* | 1/2021 | Dentoni Litta | H01L 21/823828 |
| 2021/0074697 A1* | 3/2021 | Baek | H01L 29/0649 |
| 2021/0126014 A1* | 4/2021 | Kim | H10B 51/20 |
| 2021/0134785 A1* | 5/2021 | Yang | H01L 23/528 |
| 2021/0134837 A1* | 5/2021 | You | H01L 27/11807 |
| 2021/0151426 A1* | 5/2021 | Chae | H01L 27/0207 |
| 2021/0167090 A1* | 6/2021 | Yu | H01L 27/0207 |
| 2021/0174001 A1* | 6/2021 | Kim | G06F 30/398 |
| 2021/0183859 A1* | 6/2021 | Jeong | H01L 29/78696 |
| 2021/0202498 A1* | 7/2021 | Liaw | H01L 29/0673 |
| 2021/0305232 A1* | 9/2021 | You | H01L 29/42392 |
| 2021/0305427 A1* | 9/2021 | Bae | H01L 29/66545 |
| 2021/0313310 A1* | 10/2021 | Yu | G06F 30/392 |
| 2021/0343713 A1* | 11/2021 | Ju | H01L 29/42392 |
| 2021/0351123 A1* | 11/2021 | Bark | H01L 23/528 |
| 2021/0391433 A1* | 12/2021 | Kim | H01L 27/0924 |
| 2022/0020691 A1* | 1/2022 | You | H01L 27/0924 |
| 2022/0020753 A1* | 1/2022 | Jung | H01L 27/0924 |
| 2022/0045051 A1* | 2/2022 | You | H01L 21/823437 |
| 2022/0052155 A1* | 2/2022 | Liaw | H01L 29/66545 |
| 2022/0108989 A1* | 4/2022 | Kang | G11C 11/412 |
| 2022/0130957 A1* | 4/2022 | Kim | H01L 29/4236 |
| 2022/0173097 A1* | 6/2022 | Yang | H01L 27/0886 |
| 2022/0278110 A1* | 9/2022 | Liaw | H01L 29/41733 |
| 2022/0344461 A1* | 10/2022 | Jung | H01L 29/66545 |
| 2023/0154990 A1* | 5/2023 | Lai | H01L 27/0207 257/213 |

* cited by examiner

SEMICONDUCTOR DEVICE

CROSS-REFERENCE TO RELATED APPLICATION

This application claims priority to Korean Patent Application No. 10-2021-0098064, filed on Jul. 26, 2021, in the Korean Intellectual Property Office, the disclosure of which is by reference herein in its entirety.

BACKGROUND

The present disclosure relates to a semiconductor device, and in particular, to a semiconductor device including a field effect transistor.

A semiconductor device includes an integrated circuit consisting of metal-oxide-semiconductor field-effect transistors (MOSFETs). To meet an increasing demand for a semiconductor device with a small pattern size and a reduced design rule, the MOSFETs are being aggressively scaled down in size, which may lead to deterioration in operational properties of the semiconductor device. A variety of studies are being conducted to overcome technical limitations associated with the scale-down of the semiconductor device and to realize high performance semiconductor devices.

SUMMARY

One or more example embodiments provide a semiconductor device with improved electric characteristics.

According to an example embodiment, a semiconductor device includes: a first active pattern, a second active pattern, and a third active pattern, which are provided on a logic cell region of a substrate and are spaced apart from each other in a first direction; a first gate electrode and a second gate electrode, which are aligned with each other along the first direction, the first gate electrode crossing the first active pattern and the second gate electrode crossing the second active pattern; a first separation pattern provided between the first active pattern and the second active pattern; a second separation pattern provided between the second active pattern and the third active pattern; a first gate insulating layer interposed between the first gate electrode and the first active pattern; and a first gate cutting pattern, which is interposed between the first gate electrode and the second gate electrode and is in contact with a top surface of the first separation pattern, wherein a largest width of the first separation pattern along the first direction is larger than a largest width of the second separation pattern along the first direction, and wherein the first gate insulating layer extends between the first gate electrode and the first separation pattern, and is in contact with side and top surfaces of the first separation pattern.

According to an example embodiment, a semiconductor device includes: a substrate with a peripheral region and a logic cell region; a first active pattern and a second active pattern, which are provided on the logic cell region and are spaced apart from each other in a first direction; a device isolation layer provided on the substrate between the first active pattern and the second active pattern; a first gate electrode and a second gate electrode, which are aligned with each other along the first direction, the first active pattern crossing the first active pattern and the second gate electrode crossing the second active pattern; a third active pattern provided on the peripheral region, the third active pattern including a peripheral channel pattern provided in an upper portion thereof; a peripheral gate electrode crossing the third active pattern; a peripheral gate insulating layer provided between the peripheral gate electrode and the peripheral channel pattern, the peripheral gate insulating layer including an oxide layer provided on the peripheral channel pattern and a high-k dielectric layer provided on the oxide layer; a first separation pattern provided between the first active pattern and the second active pattern, and penetrating an upper portion of the device isolation layer; and a gate cutting pattern interposed between the first gate electrode and the second gate electrode, and contacting the first separation pattern. The oxide layer is conformally provided on top and side surfaces of the peripheral channel pattern, and a bottom surface of the first separation pattern has a convex profile toward the device isolation layer.

According to an example embodiment, a semiconductor device includes: a substrate with a logic cell region; a first active pattern, a second active pattern, and a third active pattern, which are provided on the logic cell region and are spaced apart from each other in a first direction; a device isolation layer provided on the substrate between the first active pattern and the second active pattern, and between the second active pattern and the third active pattern; a pair of first source/drain patterns provided on the first active pattern, a pair of second source/drain patterns provided on the second active pattern, and a pair of third source/drain patterns provided on the third active pattern; a first channel pattern provided between the pair of first source/drain patterns, a second channel pattern provided between the pair of second source/drain patterns, and a third channel pattern provided between the pair of third source/drain patterns; a first gate electrode provided on the first channel pattern; a second gate electrode provided on the second channel pattern; a first gate insulating layer interposed between the first channel pattern and the first gate electrode; a second gate insulating layer interposed between the second channel pattern and the second gate electrode; a first pair of gate spacers provided on sides of the first gate electrode and a second pair of gate spacers provided on sides of the second gate electrode; a gate capping pattern provided on the first gate electrode and the second gate electrode; a first separation pattern provided between the first active pattern and the second active pattern, and penetrating a first upper portion of the device isolation layer; a second separation pattern provided between the second active pattern and the third active pattern, and penetrating a second upper portion of the device isolation layer; a first interlayer insulating layer provided on the gate capping pattern; a first gate cutting pattern, which is interposed between the first gate electrode and the second gate electrode, penetrates the gate capping pattern and is in contact with a top surface of the first separation pattern; an active contact, which penetrates the first interlayer insulating layer and is electrically connected to one of the first to third source/drain patterns; a gate contact, which penetrates the first interlayer insulating layer and the gate capping pattern, and is electrically connected to one of the first and second gate electrodes; a second interlayer insulating layer provided on the first interlayer insulating layer; a first metal layer, which is provided in the second interlayer insulating layer and is electrically connected to the active contact; and a second metal layer provided on the first metal layer. A largest width of the first separation pattern along the first direction is larger than a largest width of the second separation pattern along the first direction, and the first gate insulating layer extends between the first gate electrode and the first separation pattern, and is in contact with side and top surfaces of the first separation pattern.

BRIEF DESCRIPTION OF THE DRAWINGS

The above and other aspects, features, and advantages will be more clearly understood from the following detailed description, taken in conjunction with the accompanying drawings, in which:

FIGS. 3A, 4A, 5A, 8A, 9A, 10A, 11A, 12A, and 13A are sectional views, each of which is taken along the line A-A' of FIG. 1.

FIGS. 10B, 11B, 12B, and 13B are sectional views, each of which is taken along the line B-B' of FIG. 1.

FIGS. 10C, 11C, 12C, and 13C are sectional views, each of which is taken along the line C-C' of FIG. 1.

FIGS. 3B, 4B, 5B, 6, 7, 8B, 9B, 10D, 12D, and 13D are sectional views, each of which is taken along the line D-D' of FIG. 1.

DETAILED DESCRIPTION

Example embodiments will now be described more fully with reference to the accompanying drawings, in which example embodiments are shown. It will be understood that when an element or layer is referred to as being "on," "connected to" or "coupled to" another element or layer, it can be directly on, connected or coupled to the other element or layer, or intervening elements or layers may be present. By contrast, when an element is referred to as being "directly on," "directly connected to" or "directly coupled to" another element or layer, there are no intervening elements or layers present. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Figure 1:
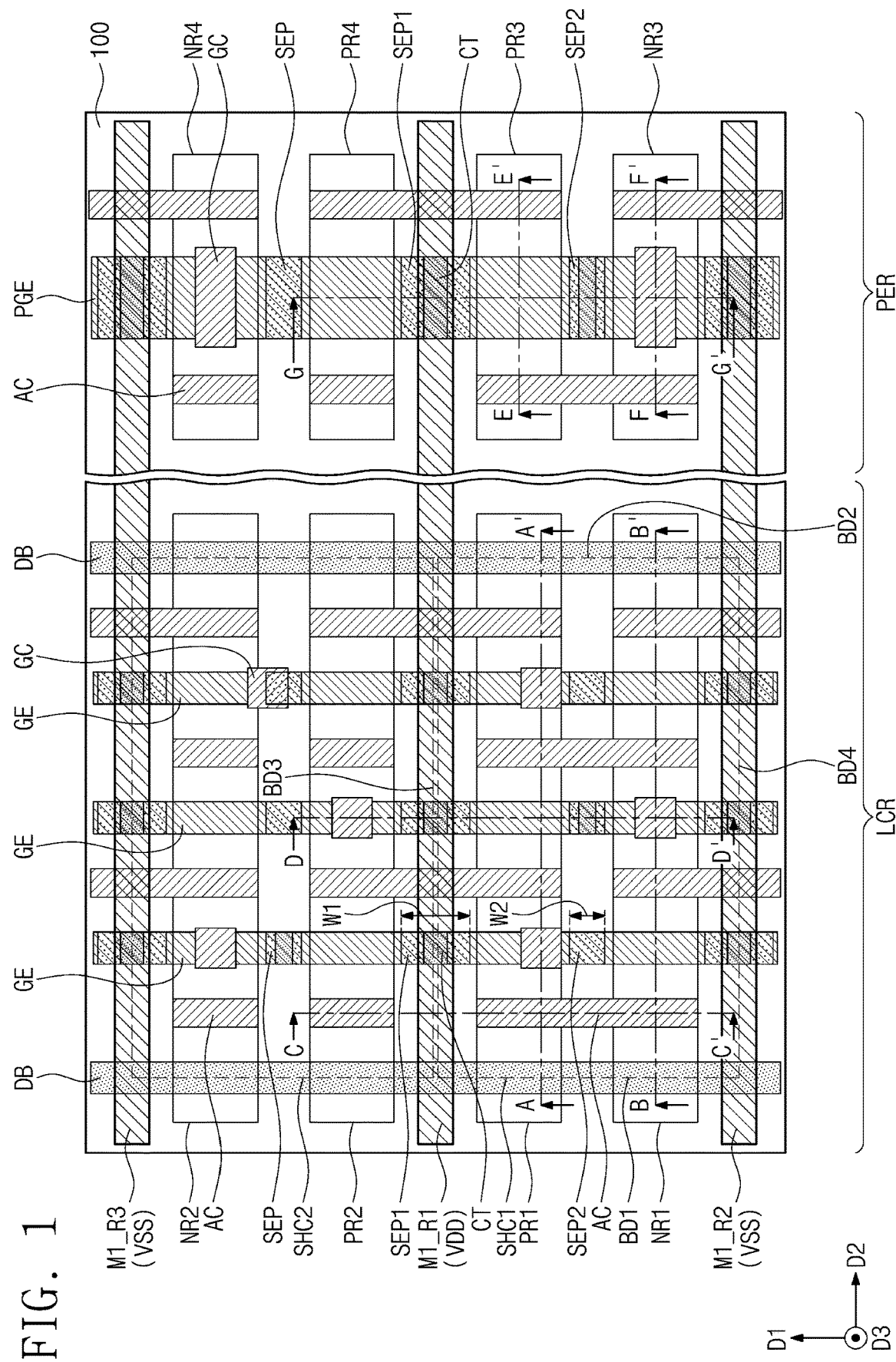
FIG. 1 is a plan view illustrating a semiconductor device according to an example embodiment.

FIG. 1 is a plan view illustrating a semiconductor device according to an example embodiment. FIGS. 2A to 2G are sectional views which are respectively taken along lines A-A', B-B', C-C', D-D', E-E', F-F', and G-G' of FIG. 1.

Referring to FIG. 1, a substrate 100 including a logic cell region LCR and a peripheral region PER may be provided. The substrate 100 may be a semiconductor substrate that is formed of or includes silicon, germanium, silicon-germanium, a compound semiconductor material, or the like. In an example embodiment, the substrate 100 may be a silicon wafer.

The logic cell region LCR may be a region, on which a standard cell (i.e., a logic cell) constituting a logic circuit is disposed. A first single height cell SHC1 and a second single height cell SHC2 may be provided on the logic cell region LCR. Each of the first and second single height cells SHC1 and SHC2 may constitute a single logic cell. In the present specification, the logic cell may indicate a logic device (e.g., AND, OR, XOR, XNOR, inverter, and so forth), which is configured to execute a specific logic function. In other words, the logic cell may include transistors constituting the logic device and interconnection lines connecting transistors to each other.

The peripheral region PER may be a region, on which transistors constituting a processor core or I/O terminals are disposed. The transistor on the peripheral region PER may operate under high power conditions, compared with the transistor on the logic cell region LCR. Hereinafter, the logic cell region LCR will be described in more detail with reference to FIGS. 1 and 2A to 2D.

The substrate 100 may have a first PMOSFET region PR1, a second PMOSFET region PR2, a first NMOSFET region NR1, and a second NMOSFET region NR2. Each of the first PMOSFET region PR1, the second PMOSFET region PR2, the first NMOSFET region NR1, and the second NMOSFET region NR2 may extend in a second direction D2. The first single height cell SHC1 may include the first NMOSFET region NR1 and the first PMOSFET region PR1, and the second single height cell SHC2 may include the second PMOSFET region PR2 and the second NMOSFET region NR2.

A first active pattern AP1 and a second active pattern AP2 may be defined by a trench TR, which is formed in an upper portion of the substrate 100. The first active pattern AP1 may be provided on each of the first and second PMOSFET regions PR1 and PR2. The second active pattern AP2 may be provided on each of the first and second NMOSFET regions NR1 and NR2. The first and second active patterns AP1 and AP2 may extend in the second direction D2. The first and second active patterns AP1 and AP2 may be vertically protruding portions of the substrate 100.

A width between the first active patterns AP1, which are adjacent to each other, may be larger than a width between the first and second active patterns AP1 and AP2, which are adjacent to each other. In an example embodiment, the width between the first and second active patterns AP1 and AP2 may be variously changed.

A device isolation layer ST may be provided within, for example to fill, the trench TR. The device isolation layer ST may include a silicon oxide layer. The device isolation layer ST may not cover first and second channel patterns CH1 and CH2, which will be described below.

A liner layer OLI may be interposed between the first and second active patterns AP1 and AP2 and the device isolation layer ST. The liner layer OLI may be directly provided on, and for example may cover, a side surface of each of the first and second active patterns AP1 and AP2. In other words, the liner layer OLI may be directly provided on, and for example may cover, a side surface of the trench TR. The liner layer OLI may be directly provided on, and for example may cover, a bottom surface of the trench TR. For example, the liner layer OLI may include at least one of a silicon oxide layer or a silicon nitride layer. In an example embodiment, the liner layer OLI may be formed of or include the same material as the device isolation layer ST, and in this case, there may be no observable interface between the liner layer OLI and the device isolation layer ST.

The first channel pattern CH1 may be provided on the first active pattern AP1. The second channel pattern CH2 may be provided on the second active pattern AP2. Each of the first and second channel patterns CH1 and CH2 may include a first semiconductor pattern SP1, a second semiconductor pattern SP2, and a third semiconductor pattern SP3, which are sequentially stacked. The first to third semiconductor patterns SP1, SP2, and SP3 may be spaced apart from each other in a vertical direction (i.e., a third direction D3). Each of the first to third semiconductor patterns SP1, SP2, and SP3 may be formed of or include at least one of silicon (Si), germanium (Ge), or silicon-germanium (SiGe). In an example embodiment, each of the first to third semiconductor patterns SP1, SP2, and SP3 may be formed of or include crystalline silicon. In an example embodiment, each of the first and second channel patterns CH1 and CH2 may include four semiconductor patterns SP1, SP2, SP3, and SP4.

A plurality of first source/drain patterns SD1 may be provided on the first active pattern AP1. The first source/drain patterns SD1 may be provided in first recesses RS1, respectively, which are formed in an upper portion of the first active pattern AP1. The first source/drain patterns SD1 may be impurity regions of a first conductivity type (e.g., p-type). The first channel pattern CH1 may be interposed between each pair of the first source/drain patterns SD1. In other words, each pair of the first source/drain patterns SD1 may be connected to each other by the stacked semiconductor patterns (i.e., the first to third semiconductor patterns SP1, SP2, and SP3).

A plurality of second source/drain patterns SD2 may be provided on the second active pattern AP2. The second source/drain patterns SD2 may be provided in second recesses RS2, respectively, which are formed in an upper portion of the second active pattern AP2. The second source/drain patterns SD2 may be impurity regions of a second conductivity type (e.g., n-type). The second channel pattern CH2 may be interposed between each pair of the second source/drain patterns SD2. In other words, the pair of the second source/drain patterns SD2 may be connected to each other by the stacked semiconductor patterns (i.e., the first to third semiconductor patterns SP1, SP2, and SP3).

The first and second source/drain patterns SD1 and SD2 may be epitaxial patterns, which are formed by a selective epitaxial growth (SEG) process. As an example, each of the first and second source/drain patterns SD1 and SD2 may have a top surface that is located at substantially the same level as a top surface of the third semiconductor pattern SP3. Alternatively, the top surface of each of the first and second source/drain patterns SD1 and SD2 may be higher than the top surface of the third semiconductor pattern SP3.

The first source/drain patterns SD1 may be formed of or include a semiconductor material (e.g., SiGe) having a lattice constant greater than that of the substrate 100. In this case, the pair of the first source/drain patterns SD1 may exert a compressive stress on the first channel patterns CH1 therebetween. The second source/drain patterns SD2 may be formed of or include the same semiconductor material (e.g., Si) as the substrate 100.

Each of the first source/drain patterns SD1 may include a first semiconductor layer SEL1 and a second semiconductor layer SEL2, which are sequentially stacked. The first semiconductor layer SEL1 may be provided on, and for example may cover, an inner surface of a first recess RS1. The first semiconductor layer SEL1 may have a decreasing thickness in an upward direction. For example, the thickness of the first semiconductor layer SEL1, which is measured in the third direction D3 at the bottom level of the first recess RS1, may be larger than the thickness of the first semiconductor layer SEL1, which is measured in the second direction D2 at the top level of the first recess RS1. The first semiconductor layer SEL1 may have a 'U'-shaped section, due to the sectional profile of the first recess RS1. The second semiconductor layer SEL2 may be provided within, and for example may fill, a remaining space of the first recess RS1 excluding the first semiconductor layer SEL1. A volume of the second semiconductor layer SEL2 may be larger than a volume of the first semiconductor layer SEL1.

Each of the first and second semiconductor layers SEL1 and SEL2 may be formed of or include silicon-germanium (SiGe). In detail, the first semiconductor layer SEL1 may be provided to have a relatively low germanium concentration. In another example embodiment, the first semiconductor layer SEL1 may contain only silicon (Si) but not germanium (Ge). The germanium concentration of the first semiconductor layer SEL1 may range from 0 atomic percentage (at. %) to 10 at. %.

The second semiconductor layer SEL2 may be provided to have a relatively high germanium concentration. As an example, the germanium concentration of the second semiconductor layer SEL2 may range from 30 at. % to 70 at. %. The germanium concentration of the second semiconductor layer SEL2 may increase in the third direction D3.

The first and second semiconductor layers SEL1 and SEL2 may include impurities (e.g., boron), allowing the first source/drain pattern SD1 to have the p-type conductivity. In an example embodiment, a concentration of impurities in the second semiconductor layer SEL2 (in at. %) may be greater than that in the first semiconductor layer SEL1.

The first semiconductor layer SEL1 may protect the second semiconductor layer SEL2, in a process of replacing sacrificial layers SAL with first to third portions PO1, PO2, and PO3 of a gate electrode GE, which will be described below. For example, the first semiconductor layer SEL1 may prevent the second semiconductor layer SEL2 from being undesirably etched by an etching material, which is used to remove the sacrificial layers SAL.

The gate electrodes GE may be provided to cross the first and second channel patterns CH1 and CH2 and to extend in a first direction D1. The gate electrodes GE may be arranged with a first pitch in the second direction D2. Each of the gate electrodes GE may be vertically overlapped with the first and second channel patterns CH1 and CH2.

Each of the gate electrodes GE may include the first portion PO1 interposed between the active pattern AP1 or AP2 and the first semiconductor pattern SP1, the second portion PO2 interposed between the first semiconductor pattern SP1 and the second semiconductor pattern SP2, the third portion PO3 interposed between the second semiconductor pattern SP2 and the third semiconductor pattern SP3, and a fourth portion PO4 on the third semiconductor pattern SP3. In an example embodiment, each of the first and second channel patterns CH1 and CH2 may further include a fourth semiconductor pattern SP4, the gate electrode GE may include the first to third portions PO1, PO2, and PO3, the fourth portion PO4 interposed between the third semiconductor pattern SP3 and the fourth semiconductor pattern SP4, and a fifth portion PO5 provided on the fourth semiconductor pattern SP4.

Referring back to FIG. 2A, the first to third portions PO1, PO2, and PO3 of the gate electrode GE on the first PMOSFET region PR1 may have different widths from each other.

For example, the largest width of the third portion PO3 in the second direction D2 may be larger than the largest width of the second portion PO2 in the second direction D2. The largest width of the first portion PO1 in the second direction D2 may be larger than the largest width of the third portion PO3 in the second direction D2.

Referring back to FIG. 2D, the gate electrode GE may be provided on a top surface, a bottom surface, and at least one of side surfaces of each of the first to third semiconductor patterns SP1, SP2, and SP3. In other words, the transistor may be a three-dimensional field effect transistor (e.g., a multi-bridge channel field effect (MBCFET) transistor or a gate all around field effect transistor (GAAFET)), in which the gate electrode GE is provided to three-dimensionally surround the channel pattern.

Separation patterns SEP may be provided between adjacent ones of the active patterns AP1 and/or AP2. The separation patterns SEP may include a first separation pattern SEP1 and a second separation pattern SEP2. The first separation pattern SEP1 may be provided between the first active pattern AP1 on the first PMOSFET region PR1 and the first active pattern AP1 on the second PMOSFET region PR2. The second separation pattern SEP2 may be provided between the first and second active patterns AP1 and AP2, which are adjacent to each other. In an example embodiment, each of the separation patterns SEP may be formed of or include at least one of silicon nitride, high-k dielectric materials, or low-k dielectric materials.

The separation pattern SEP may be provided to penetrate an upper portion of the device isolation layer ST. A bottom surface SEPb of the separation pattern SEP may be located at a level that is lower than a bottom surface of the gate electrode GE and a top surface of the device isolation layer ST. The bottom surface SEPb of the separation pattern SEP may have a convex profile toward the device isolation layer ST. The bottom surface SEPb of the separation pattern SEP may have a curved profile.

The largest width of the first separation pattern SEP1 may be a first width W1. The largest width of the second separation pattern SEP2 may be a second width W2. The first width W1 may be larger than the second width W2. A distance between the first separation pattern SEP1 and the first active pattern AP1 may be a first distance DD. Here, the first distance DI1 may be a distance between the first separation pattern SEP1 and the first channel pattern CH1. In other words, a distance between the first separation pattern SEP1 and the first channel pattern CH1 on the first PMOSFET region PR1 may be substantially equal to a distance between the first separation pattern SEP1 and the first channel pattern CH1 on the second PMOSFET region PR2. A ratio of the distance between the first separation pattern SEP1 and the first channel pattern CH1 on the second PMOSFET region PR2 to the distance between the first separation pattern SEP1 and the first channel pattern CH1 on the first PMOSFET region PR1 may range from 0.9 to 1.1.

A distance between the second separation pattern SEP2 and the first active pattern AP1 and a distance between the second separation pattern SEP2 and the second active pattern AP2 may be a second distance DI2. Here, the second distance DI2 may be a distance between the second separation pattern SEP2 and the first channel pattern CH1 and a distance between the second separation pattern SEP2 and the second channel pattern CH2. In other words, the distance between the second separation pattern SEP2 and the first channel pattern CH1 may be substantially equal to the distance between the second separation pattern SEP2 and the second channel pattern CH2. A ratio of the distance between the second separation pattern SEP2 and the second channel pattern CH2 to the distance between the second separation pattern SEP2 and the first channel pattern CH1 may range from 0.9 to 1.1. The first distance DI1 may be substantially equal to the second distance DI2. A ratio of the second distance DI2 to the first distance DI1 may range from 0.9 to 1.1.

As will be described below, the separation patterns SEP may be formed in a self-aligned manner using a conformally-formed first sacrificial layer. If a gate cutting pattern is formed to penetrate a sacrificial gate pattern using a photolithography process as in a related technology, the gate cutting pattern may be formed to have a short distance to a channel pattern, due to a misalignment issue. In this case, a portion of the sacrificial gate pattern may not be removed or the gate cutting pattern may not be formed to completely penetrate the sacrificial gate pattern. Similarly, in the case where a gate electrode is formed and then the gate cutting pattern is formed to penetrate the gate electrode, the gate cutting pattern may be misaligned, and in this case, a work function metal of the gate electrode may be partially removed. By contrast, according to an example embodiment, because the separation pattern is formed in a self-aligned manner, it may be possible to secure a sufficiently large distance to the channel pattern and thereby to prevent the afore-described problems. As a result, electric characteristics of the semiconductor device may be improved.

As an example, the first single height cell SHC1 may have a first border BD1 and a second border BD2, which are opposite to each other in the second direction D2. The first and second borders BD1 and BD2 may extend in the first direction D1. The first single height cell SHC1 may have a third border BD3 and a fourth border BD4, which are opposite to each other in the first direction D1. The third and fourth borders BD3 and BD4 may extend in the second direction D2.

The separation pattern SEP may be disposed on a border of each of the first and second single height cells SHC1 and SHC2, which is parallel to the second direction D2. For example, the separation patterns SEP may be disposed on the third and fourth borders BD3 and BD4 of the first single height cell SHC1. In addition, the separation patterns SEP may be disposed between the first PMOSFET region PR1 and the first NMOSFET region NR1 and between the second PMOSFET region PR2 and the second NMOSFET region NR2.

Gate cutting patterns CT may be disposed on a border, which is parallel to the second direction D2, of each of the first and second single height cells SHC1 and SHC2. For example, the gate cutting patterns CT may be disposed on the third and fourth borders BD3 and BD4 of the first single height cell SHC1. The gate cutting patterns CT may be formed of or include at least one of various insulating materials (e.g., silicon oxide, silicon nitride, or combinations thereof).

Portions of the gate electrodes GE provided on the first single height cell SHC1 may be spaced apart from portions of the gate electrodes GE provided on the second single height cell SHC2 by the first separation pattern SEP1 and the gate cutting pattern CT. The gate cutting pattern CT may be interposed between the gate electrodes GE on the first and second single height cells SHC1 and SHC2 which are aligned to each other in the first direction D1. The gate electrode GE extending in the first direction D1 may be divided into a plurality of the gate electrodes GE by the separation patterns SEP and the gate cutting patterns CT.

Referring back to FIGS. 1 and 2D, at least one of the gate cutting patterns CT may be located in a cell, not on a border of the cell. For example, the gate cutting pattern CT may be disposed between the first PMOSFET region PR1 and the first NMOSFET region NR1 of the first single height cell SHC1, and the gate cutting pattern CT may be disposed between the second PMOSFET region PR2 and the second NMOSFET region NR2 of the second single height cell SHC2. In an example embodiment, the gate cutting patterns CT may not be disposed in the cell.

The gate cutting pattern CT may be disposed on one of the separation patterns SEP. The gate cutting pattern CT may be disposed at a position that is suitable for the division of the gate electrode GE. The gate cutting pattern CT may be provided to penetrate a gate capping pattern GP and contact a top surface of one of the separation patterns SEP. The gate cutting pattern CT may gradually increase in width in the third direction D3. The smallest width of the gate cutting pattern CT disposed on the first separation pattern SEP1 may be a third width W3. The third width W3 may be different from the first width W1. As an example, the third width W3 may be smaller than the first width W1. The smallest width of the gate cutting pattern CT disposed on the second separation pattern SEP2 may be different from the second width W2. As an example, the smallest width of the gate cutting pattern CT disposed on the second separation pattern SEP2 may be smaller than the second width W2. As another example, the smallest width of the gate cutting pattern CT disposed on the second separation pattern SEP2 may be larger than the second width W2.

Referring back to FIGS. 1 and 2A to 2D, a pair of gate spacers GS may be respectively disposed on opposite side surfaces of the fourth portion PO4 of the gate electrode GE. The gate spacers GS may extend along the gate electrode GE in the first direction D1. Top surfaces of the gate spacers GS may be higher than a top surface of the gate electrode GE. The top surfaces of the gate spacers GS may be coplanar with a top surface of a first interlayer insulating layer 110, which will be described below. The gate spacers GS may be formed of or include at least one of SiCN, SiCON, or SiN. In an example embodiment, the gate spacers GS may be a multi-layered structure, which includes at least two different materials selected from SiCN, SiCON, and SiN.

The gate capping pattern GP may be provided on the gate electrode GE. The gate capping pattern GP may extend along the gate electrode GE in the first direction D1. The gate capping pattern GP may be formed of or include a material having an etch selectivity with respect to first and second interlayer insulating layers 110 and 120, which will be described below. In detail, the gate capping pattern GP may be formed of or include at least one of SiON, SiCN, SiCON, or SiN.

A gate insulating layer GI may be interposed between the gate electrode GE and the first channel pattern CH1, and between the gate electrode GE and the second channel pattern CH2. The gate insulating layer GI may be provided on, and for example may cover, at least one of a top surface, a bottom surface, and opposite side surfaces of each of the first to third semiconductor patterns SP1, SP2, and SP3. The gate insulating layer GI may be provided on, and for example may cover, the top surface of the device isolation layer ST below the gate electrode GE. The gate insulating layer GI may extend into a region between the gate electrode GE and the separation pattern SEP, and may be in contact with side and top surfaces of the separation pattern SEP.

In an example embodiment, the gate insulating layer GI may include a silicon oxide layer, a silicon oxynitride layer, and/or a high-k dielectric layer. The high-k dielectric layer may be formed of or include at least one of high-k dielectric materials whose dielectric constants are higher than that of silicon oxide. For example, the high-k dielectric material may include at least one of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

In another example embodiment, the semiconductor device may include a negative capacitance (NC) FET using a negative capacitor. For example, the gate insulating layer GI may include a ferroelectric layer exhibiting a ferroelectric property and a paraelectric layer exhibiting a paraelectric property.

The ferroelectric layer may have a negative capacitance, and the paraelectric layer may have a positive capacitance. In the case where two or more capacitors are connected in series and each capacitor has a positive capacitance, a total capacitance may be reduced to a value that is less than a capacitance of each of the capacitors. By contrast, in the case where at least one of serially-connected capacitors has a negative capacitance, a total capacitance of the serially-connected capacitors may have a positive value and may be greater than an absolute value of each capacitance.

In the case where a ferroelectric layer having a negative capacitance and a paraelectric layer having a positive capacitance are connected in series, a total capacitance of the serially-connected ferroelectric and paraelectric layers may be increased. Due to such an increase of the total capacitance, a transistor including the ferroelectric layer may have a subthreshold swing (SS), which is less than 60 mV/decade, at room temperature.

The ferroelectric layer may have the ferroelectric property. The ferroelectric layer may be formed of or include at least one of, for example, hafnium oxide, hafnium zirconium oxide, barium strontium titanium oxide, barium titanium oxide, and/or lead zirconium titanium oxide. Here, the hafnium zirconium oxide may be hafnium oxide that is doped with zirconium (Zr). Alternatively, the hafnium zirconium oxide may be a compound composed of hafnium (Hf), zirconium (Zr), and/or oxygen (O).

The ferroelectric layer may further include dopants. For example, the dopants may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and/or tin (Sn). The kind of the dopants in the ferroelectric layer may vary depending on a ferroelectric material included in the ferroelectric layer.

In the case where the ferroelectric layer includes hafnium oxide, the dopants in the ferroelectric layer may include at least one of, for example, gadolinium (Gd), silicon (Si), zirconium (Zr), aluminum (Al), and/or yttrium (Y).

In the case where the dopants include aluminum (Al), a content of aluminum in the ferroelectric layer may range from 3 to 8 at. %. Here, the content of the dopants (e.g., aluminum atoms) may be a ratio of the number of aluminum atoms to the number of hafnium and aluminum atoms.

In the case where the dopants include silicon (Si), a content of silicon in the ferroelectric layer may range from 2 at. % to 10 at. %. In the case where the dopants include yttrium (Y), a content of yttrium in the ferroelectric layer may range from 2 at. % to 10 at. %. In the case where the dopants include gadolinium (Gd), a content of gadolinium in the ferroelectric layer may range from 1 at. % to 7 at. %. In the case where the dopants include zirconium (Zr), a content of zirconium in the ferroelectric layer may range from 50 at. % to 80 at. %.

The paraelectric layer may have the paraelectric property. The paraelectric layer may be formed of or include at least one of, for example, silicon oxide and/or high-k metal oxides. The metal oxides, which can be used as the paraelectric layer, may include at least one of, for example, hafnium oxide, zirconium oxide, and/or aluminum oxide, but example embodiments are not limited thereto.

The ferroelectric layer and the paraelectric layer may be formed of or include the same material. The ferroelectric layer may have the ferroelectric property, but the paraelectric layer may not have the ferroelectric property. For example, in the case where the ferroelectric and paraelectric layers contain hafnium oxide, a crystal structure of the hafnium oxide in the ferroelectric layer may be different from a crystal structure of the hafnium oxide in the paraelectric layer.

The ferroelectric layer may exhibit the ferroelectric property, only when its thickness is in a specific range. In an example embodiment, the ferroelectric layer may have a thickness ranging from 0.5 to 10 nm, but example embodiments are not limited thereto. Because a critical thickness associated with the occurrence of the ferroelectric property varies depending on the kind of the ferroelectric material, the thickness of the ferroelectric layer may be changed depending on the kind of the ferroelectric material.

As an example, the gate insulating layer GI may include a single ferroelectric layer. As another example, the gate insulating layer may include a plurality of ferroelectric layers spaced apart from each other. The gate insulating layer GI may have a multi-layered structure, in which a plurality of ferroelectric layers and a plurality of paraelectric layers are alternately stacked.

The gate electrode GE may include a first metal pattern and a second metal pattern provided on the first metal pattern. The first metal pattern may be provided on the gate insulating layer GI and may be adjacent to the first to third semiconductor patterns SP1, SP2, and SP3. The first metal pattern may include a work-function metal, which can be used to adjust a threshold voltage of the transistor. By adjusting a thickness and composition of the first metal pattern, it may be possible to realize a transistor having a desired threshold voltage. For example, the first to third portions PO1, PO2, and PO3 of the gate electrode GE may be composed of the first metal pattern or the work-function metal.

The first metal pattern may include a metal nitride layer. For example, the first metal pattern may include at least one metallic material, which is selected from the group consisting of titanium (Ti), tantalum (Ta), aluminum (Al), tungsten (W) and molybdenum (Mo), and nitrogen (N). In an example embodiment, the first metal pattern may further include carbon (C). The first metal pattern may include a plurality of work-function metal layers, which are stacked.

The second metal pattern may be formed of or include a metallic material whose resistance is lower than the first metal pattern. For example, the second metal pattern may be formed of or include at least one metallic material, which is selected from the group consisting of tungsten (W), aluminum (Al), titanium (Ti), and tantalum (Ta). In an example embodiment, the fourth portion PO4 of the gate electrode GE may also include the first metal pattern and the second metal pattern provided on the first metal pattern.

Referring back to FIG. 2B, inner spacers IP may be provided on the first and second NMOSFET regions NR1 and NR2. Each of the inner spacers IP may be interposed between the second source/drain pattern SD2 and a corresponding one of the first to third portions PO1, PO2, and PO3 of the gate electrode GE. The inner spacers IP may be in direct contact with the second source/drain pattern SD2. Each of the first to third portions PO1, PO2, and PO3 of the gate electrode GE may be spaced apart from the second source/drain pattern SD2 by the inner spacer IP.

The first interlayer insulating layer 110 may be provided on the substrate 100. The first interlayer insulating layer 110 may be provided on, and for example may cover, the gate spacers GS and the first and second source/drain patterns SD1 and SD2. The first interlayer insulating layer 110 may have a top surface that is substantially coplanar with the top surface of the gate capping pattern GP and the top surface of the gate spacer GS. The second interlayer insulating layer 120 may be formed on the first interlayer insulating layer 110 to be provided on, and for example may cover, the gate capping pattern GP. A third interlayer insulating layer 130 may be provided on the second interlayer insulating layer 120. A fourth interlayer insulating layer 140 may be provided on the third interlayer insulating layer 130. In an example embodiment, at least one of the first to fourth interlayer insulating layers 110 to 140 may include a silicon oxide layer.

A pair of division structures DB may be provided at both sides of each of the first and second single height cells SHC1 and SHC2 to be opposite to each other in the second direction D2. For example, the pair of the division structures DB may be provided on the first and second borders BD1 and BD2, respectively, of the first single height cell SHC1. The division structure DB may extend in the first direction D1 to be parallel to the gate electrodes GE. A pitch between the division structure DB and the gate electrode GE adjacent thereto may be equal to the first pitch.

The division structure DB may be provided to penetrate the first and second interlayer insulating layers 110 and 120 and may extend into the first and second active patterns AP1 and AP2. The division structure DB may be provided to penetrate an upper portion of each of the first and second active patterns AP1 and AP2. The division structure DB may electrically separate an active region of each of the first and second single height cells SHC1 and SHC2 from an active region of a neighboring cell.

Active contacts AC may be provided to penetrate the first and second interlayer insulating layers 110 and 120, and may be electrically connected to the first and second source/drain patterns SD1 and SD2, respectively. A pair of the active contacts AC may be respectively provided at both sides of the gate electrode GE. When viewed in a plan view, the active contact AC may be a bar-shaped pattern extended in the first direction D1.

The active contact AC may be a self-aligned contact. For example, the active contact AC may be formed by a self-alignment process using the gate capping pattern GP and the gate spacer GS. In an example embodiment, the active contact AC may be provided on at least a portion of the side surface of the gate spacer GS. The active contact AC may be provided on a portion of the top surface of the gate capping pattern GP.

Silicide patterns SC may be respectively interposed between the active contact AC and the first source/drain pattern SD1 and between the active contact AC and the second source/drain pattern SD2. The active contact AC may be electrically connected to the source/drain pattern SD1 or SD2 through the silicide pattern SC. The silicide pattern SC may be formed of or include at least one of metal silicide materials (e.g., titanium silicide, tantalum silicide, tungsten silicide, nickel silicide, and cobalt silicide).

Referring back to FIG. 2C, at least one of the active contacts AC on the first single height cell SHC1 may electrically connect the first source/drain pattern SD1 of the first PMOSFET region PR1 to the second source/drain pattern SD2 of the first NMOSFET region NR1. The active contact AC may include a first body portion BP1 on the first source/drain pattern SD1 and a second body portion BP2 on the second source/drain pattern SD2. The first body portion BP1 may be connected to the top surface of the first source/drain pattern SD1, and the second body portion BP2 may be connected to the top surface of the second source/drain pattern SD2. A first active contact AC1 may further include a protruding pattern PRP, which is interposed between the first body portion BP1 and the second body portion BP2. The protruding pattern PRP may be provided on the device isolation layer ST between the first PMOSFET and NMOSFET regions PR1 and NR1.

The protruding pattern PRP may extend from the first body portion BP1 toward the device isolation layer ST along a slanted side surface of the first source/drain pattern SD1. The protruding pattern PRP may extend from the second body portion BP2 toward the device isolation layer ST along a slanted side surface of the second source/drain pattern SD2. Due to the presence of the protruding pattern PRP, the active contact AC may be in contact with the first and second source/drain patterns SD1 and SD2 with an increased contact area. Thus, an electric resistance between the active contact AC and the first and second source/drain patterns SD1 and SD2 may be lowered. As a result, it may be possible to improve an operation property (e.g., an operation speed) of the semiconductor device according to an example embodiment.

Gate contacts GC may be provided to penetrate the second interlayer insulating layer 120 and the gate capping pattern GP, and may be electrically connected to the gate electrodes GE, respectively. When viewed in a plan view, the gate contacts GC on the first single height cell SHC1 may be disposed to be overlapped with the first PMOSFET region PR1 (e.g., see FIG. 2A). The gate contact GC may be freely disposed on the gate electrode GE, without a limitation in its position.

Figure 2A:
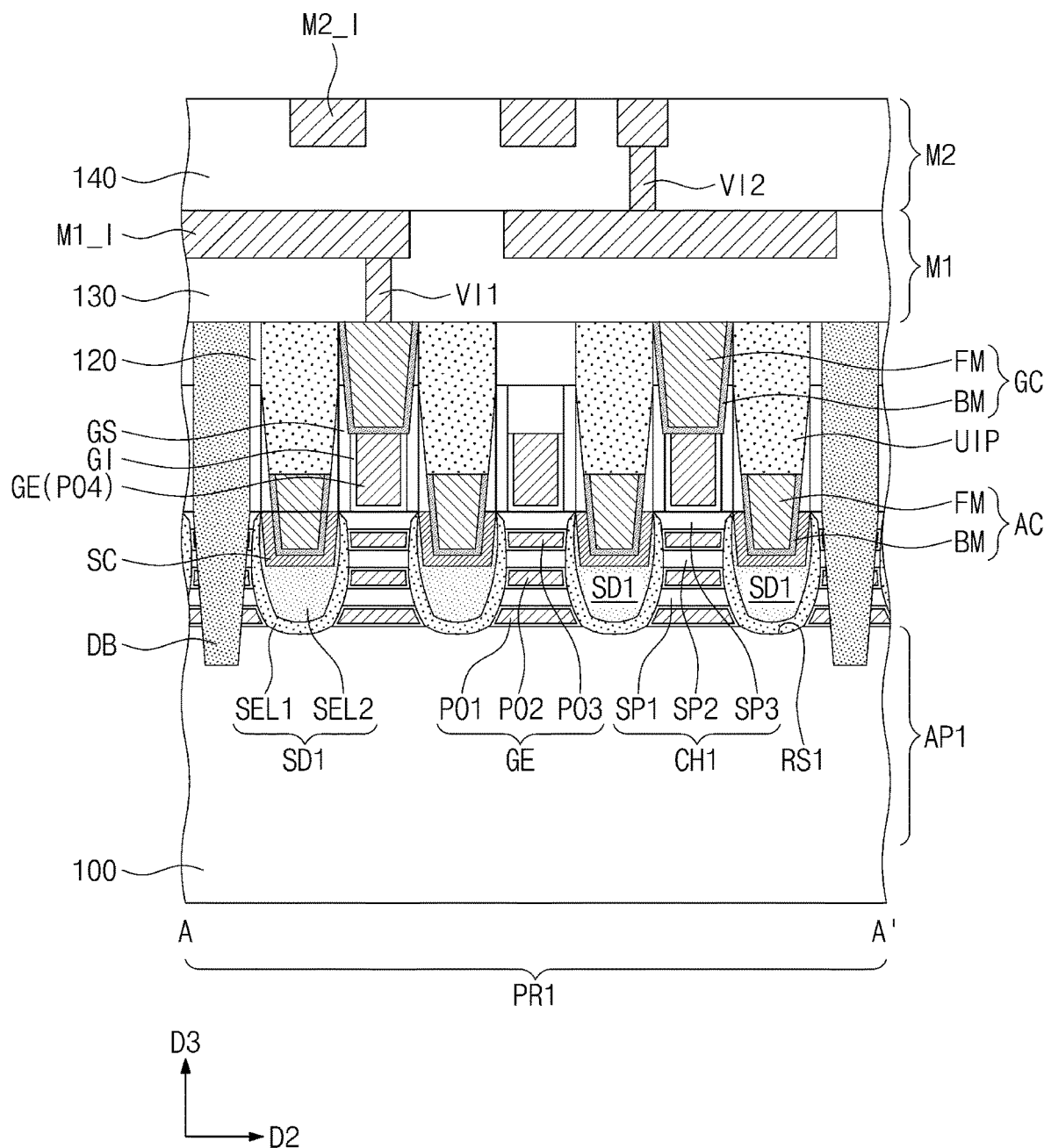
FIGS. 2A, 2B, 2C, 2D, 2E, 2F and 2G are sectional views which are respectively taken along lines A-A', B-B', C-C', D-D', E-E', F-F', and G-G' of FIG. 1.
Figure 2B:
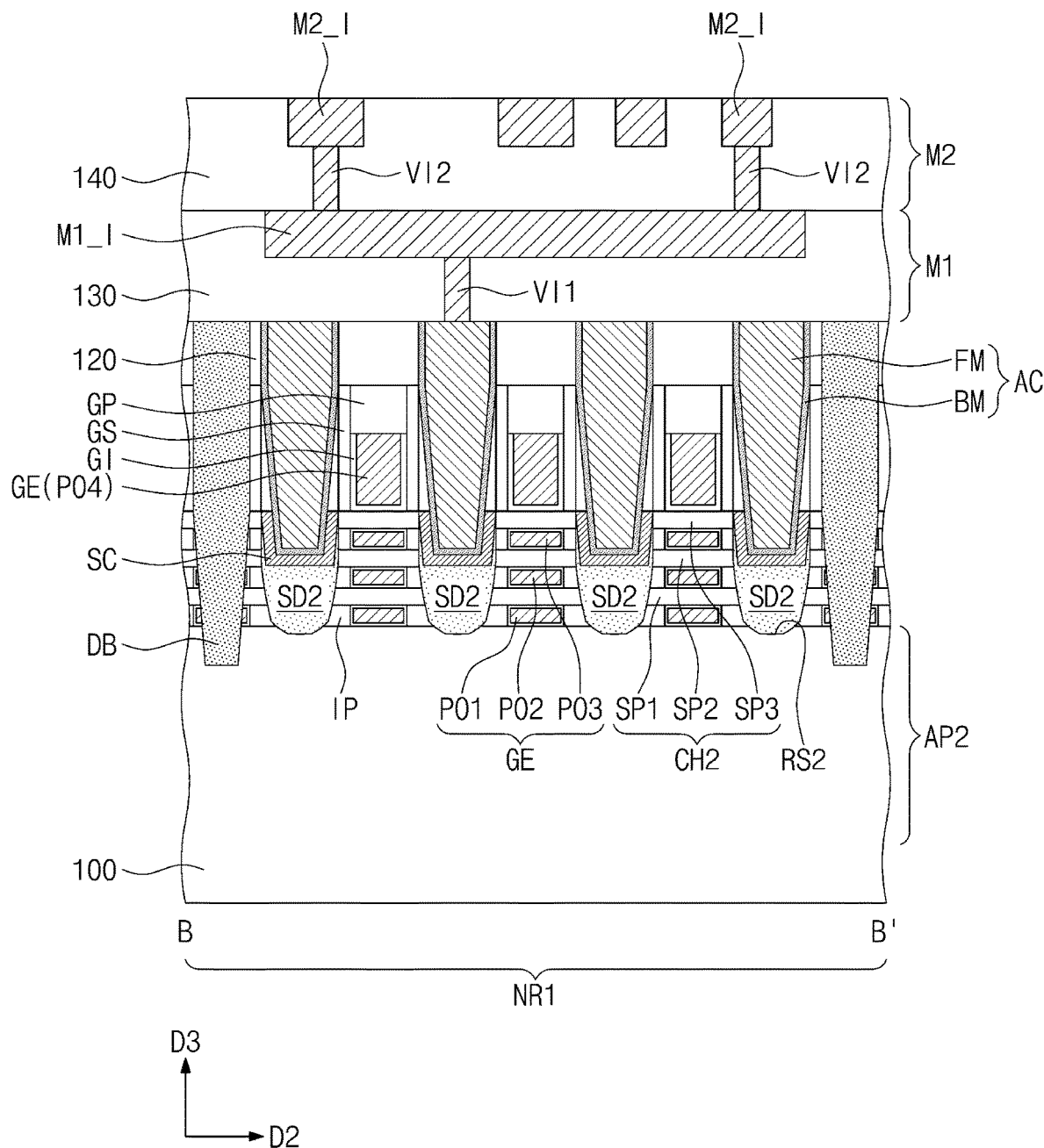
Figure 2C:
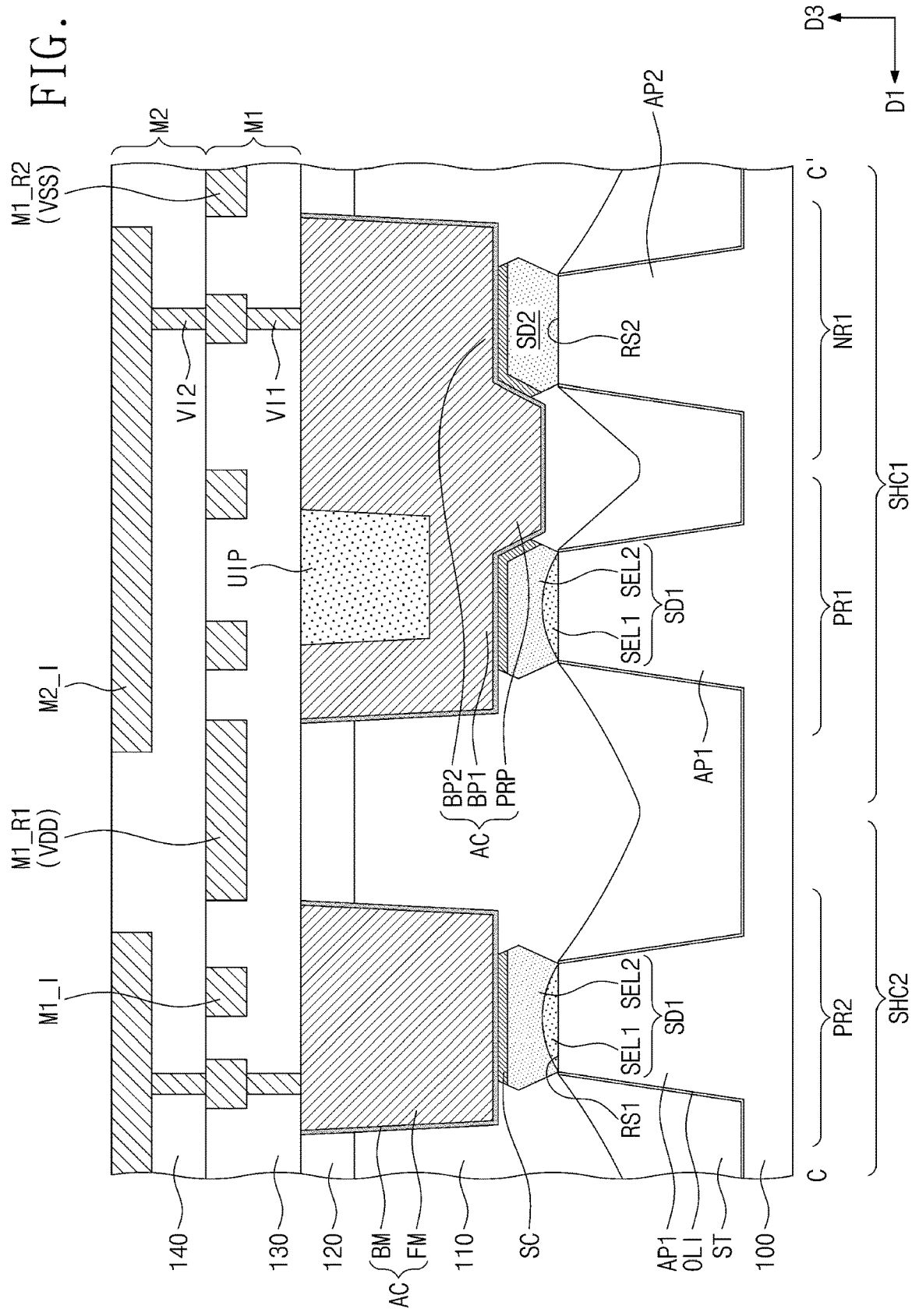
Figure 2D:
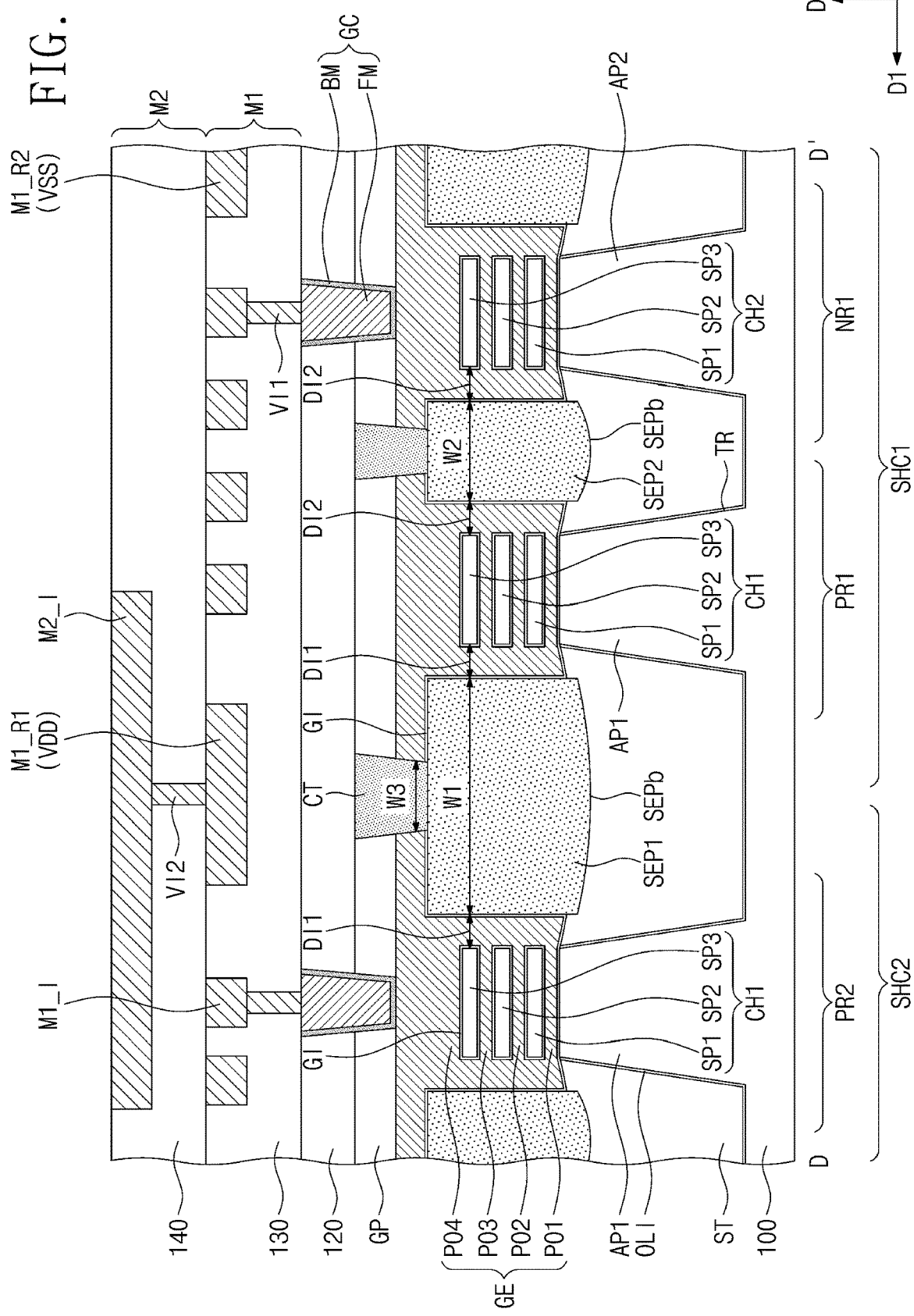

In an example embodiment, referring to FIGS. 2A and 2C, an area above an upper portion of the active contact AC adjacent to the gate contact GC may be provided with an upper insulating pattern UIP. A bottom surface of the upper insulating pattern UIP may be lower than a bottom surface of the gate contact GC. In other words, a top surface of the active contact AC adjacent to the gate contact GC may be formed at a level, which is lower than the bottom surface of the gate contact GC, by the upper insulating pattern UIP. Accordingly, it may be possible to prevent the gate contact GC and the active contact AC, which are adjacent to each other, from being in contact with each other and thereby to prevent a short circuit issue from occurring therebetween.

Each of the active and gate contacts AC and GC may include a conductive pattern FM and a barrier pattern BM enclosing the conductive pattern FM. For example, the conductive pattern FM may be formed of or include at least one of metallic materials (e.g., aluminum, copper, tungsten, molybdenum, and cobalt). The barrier pattern BM may be provided on, and for example may cover, side and bottom surfaces of the conductive pattern FM. In an example embodiment, the barrier pattern BM may include a metal layer and a metal nitride layer. The metal layer may be formed of or include at least one of titanium, tantalum, tungsten, nickel, cobalt, or platinum. The metal nitride layer may be formed of or include at least one of titanium nitride (TiN), tantalum nitride (TaN), tungsten nitride (WN), nickel nitride (NiN), cobalt nitride (CoN), or platinum nitride (PtN).

A first metal layer M1 may be provided in the third interlayer insulating layer 130. For example, the first metal layer M1 may include a first power line M1_R1, a second power line M1_R2, a third power line M1_R3, and first interconnection lines M1_I. The interconnection lines M1_R1, M1_R2, M1_R3, and M1_I of the first metal layer M1 may extend in the second direction D2 to be parallel to each other.

In detail, the first and second power lines M1_R1 and M1_R2 may be provided on the third and fourth borders BD3 and BD4 of the first single height cell SHC1, respectively. The first power line M1_R1 may extend along the third border BD3 in the second direction D2. The second power line M1_R2 may extend along the fourth border BD4 in the second direction D2.

The first interconnection lines M1_I of the first metal layer M1 may be arranged at a second pitch in the first direction D1. The second pitch may be smaller than the first pitch. A line width of each of the first interconnection lines M1_I may be smaller than a line width of each of the first to third power lines M1_R1, M1_R2, and M1_R3.

The first metal layer M1 may further include first vias VI1. The first vias VI1 may be respectively provided below the interconnection lines M1_R1, M1_R2, M1_R3, and M1_I of the first metal layer M1. The active or gate contact AC or GC and the interconnection line of the first metal layer M1 may be electrically connected to each other through the first via VI1.

The interconnection line of the first metal layer M1 and the first via VI1 thereunder may be formed by separate processes. For example, the interconnection line and the first via VI1 of the first metal layer M1 may be independently formed by respective single damascene processes. The semiconductor device may be fabricated using a sub-20 nm process.

A second metal layer M2 may be provided in the fourth interlayer insulating layer 140. The second metal layer M2 may include a plurality of second interconnection lines M2_I. The second interconnection lines M2_I may extend in the first direction D1 in parallel to each other. The second metal layer M2 may further include second vias VI2, which are respectively provided below the second interconnection lines M2_I. The interconnection lines of the first and second metal layers M1 and M2 may be electrically connected to each other through the second via VI2. The interconnection line of the second metal layer M2 and the second via VI2 thereunder may be formed together by a dual damascene process.

The interconnection lines of the second metal layer M2 may be formed of or include a conductive material that is the same as or different from that of the first metal layer M1. A plurality of metal layers (e.g., M3, M4, M5, and so forth) may be additionally stacked on the fourth interlayer insulating layer 140. Each of the stacked metal layers may include interconnection lines, which are used as routing paths between cells.

Figure 2E:
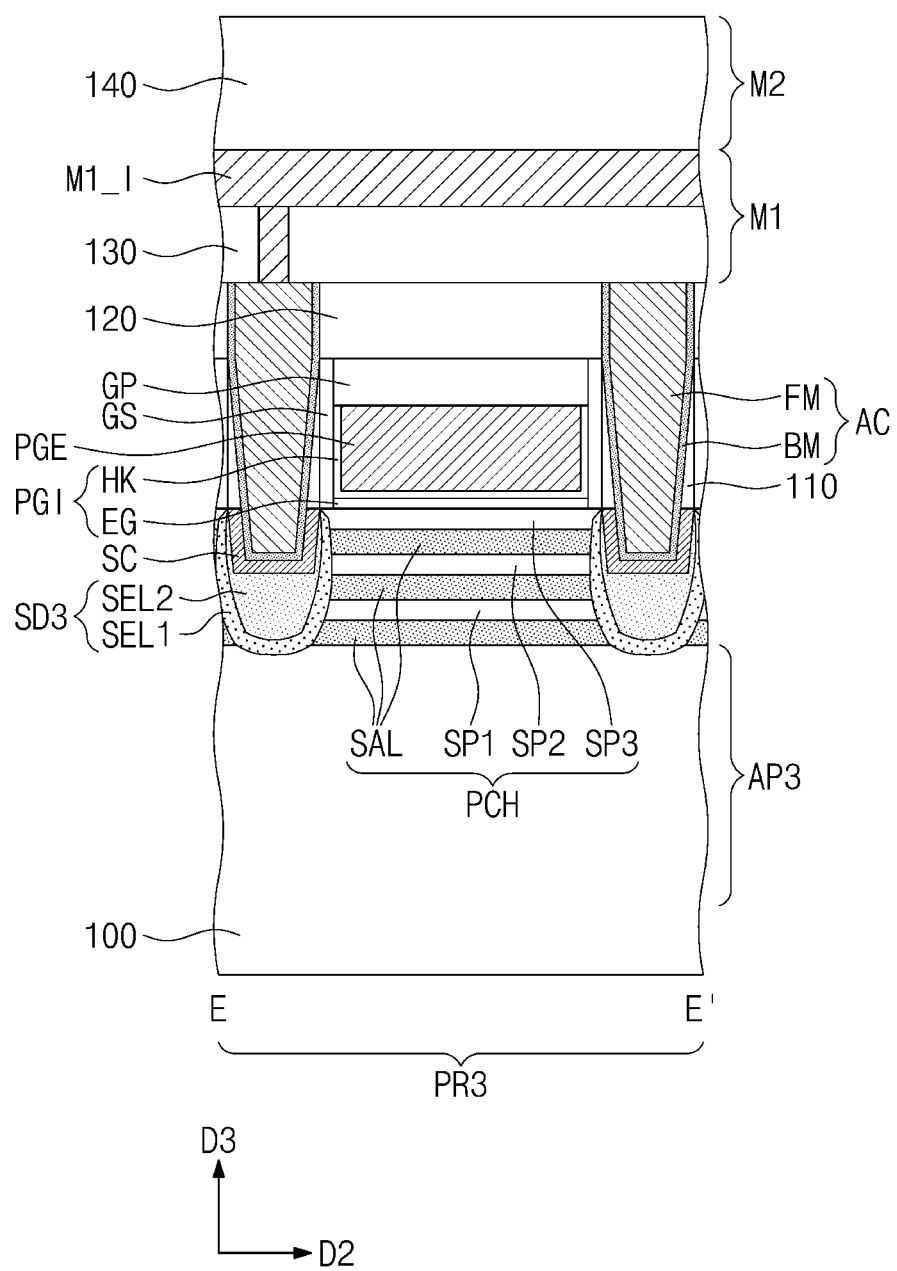
Figure 2F:
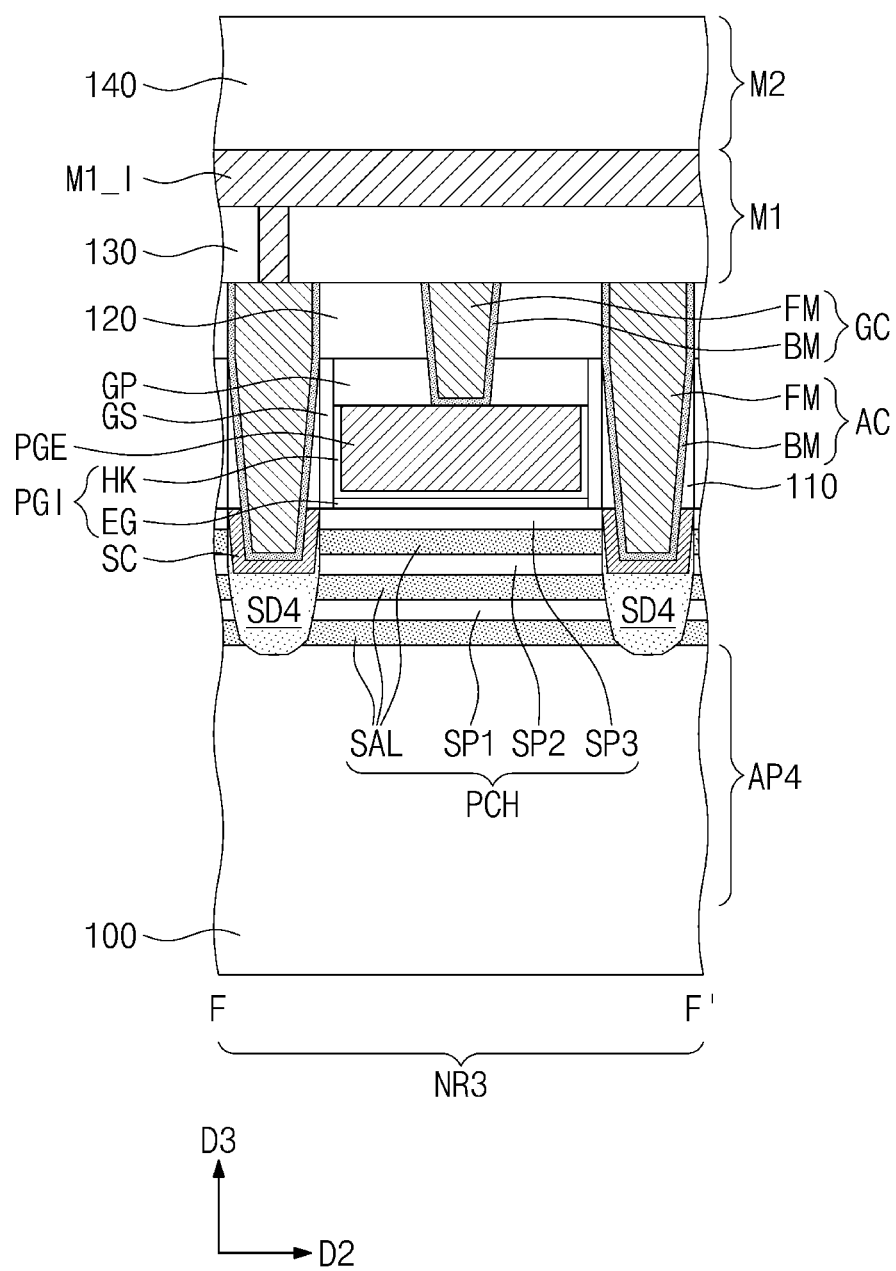
Figure 2G:
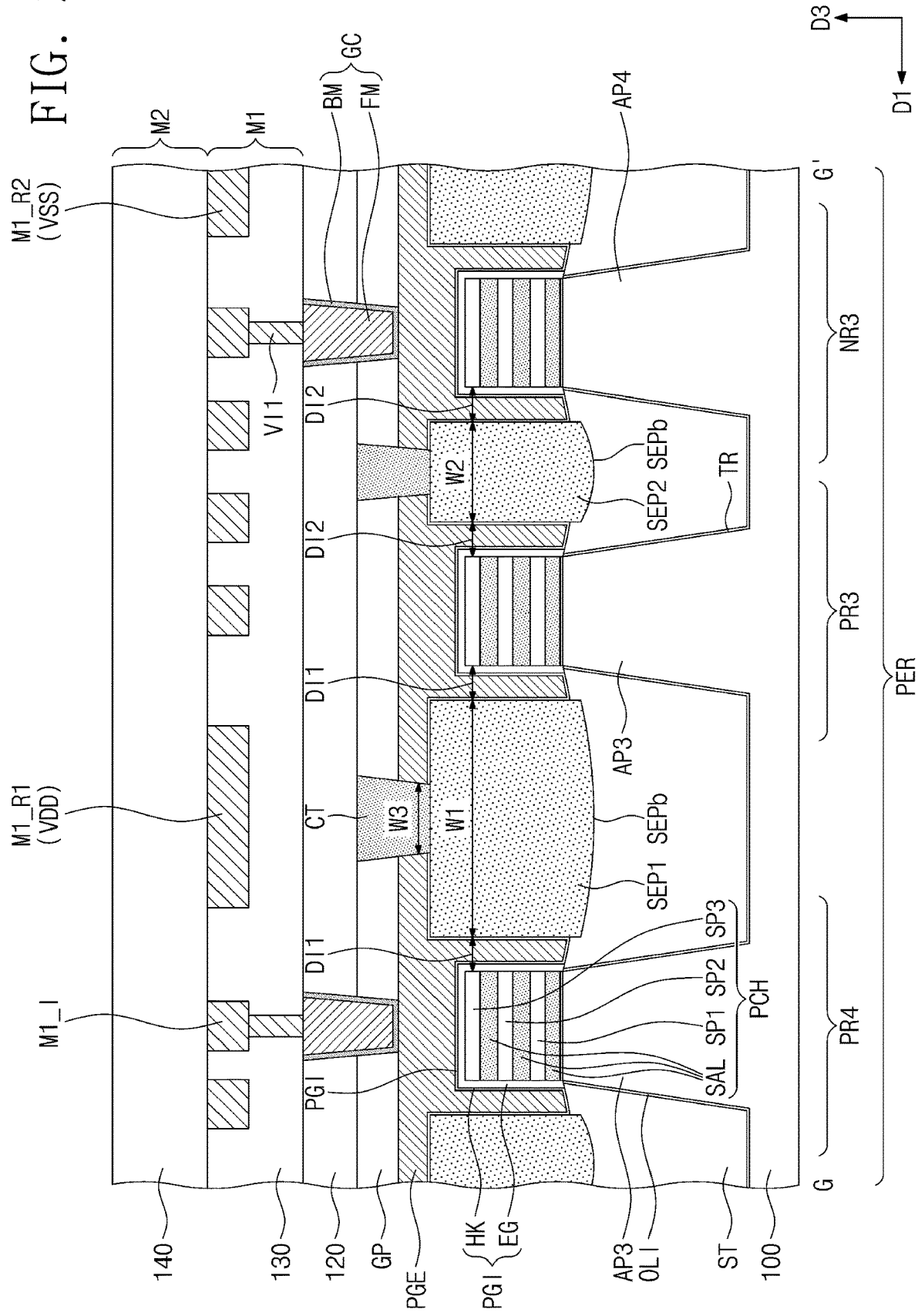

Hereinafter, the peripheral region PER will be described in more detail with reference to FIGS. 2E to 2G. A third PMOSFET region PR3, a fourth PMOSFET region PR4, a third NMOSFET region NR3, and a fourth NMOSFET region NR4 may be provided on the peripheral region PER. Each of the third PMOSFET region PR3, the fourth PMOSFET region PR4, the third NMOSFET region NR3, and the fourth NMOSFET region NR4 may extend in the second direction D2.

A third active pattern AP3 and a fourth active pattern AP4 may be defined by the trench TR, which is formed in an upper portion of the substrate 100. The third active pattern AP3 may be provided on each of the third and fourth PMOSFET regions PR3 and PR4. The fourth active pattern AP4 may be provided on each of the third and fourth NMOSFET regions NR3 and NR4. The third and fourth active patterns AP3 and AP4 may extend in the second direction D2. The third and fourth active patterns AP3 and AP4 may be vertically protruding portions of the substrate 100.

A width between the third active patterns AP3, which are adjacent to each other, may be larger than a width between the third and fourth active patterns AP3 and AP4, which are adjacent to each other. The width between the active patterns AP3 and AP4 may be variously changed.

Each of the third and fourth active patterns AP3 and AP4 may include a peripheral channel pattern PCH provided in an upper portion thereof. The peripheral channel pattern PCH may include the first semiconductor pattern SP1, the second semiconductor pattern SP2, and the third semiconductor pattern SP3, which are sequentially stacked, and the sacrificial layers SAL, which are interposed between the first to third semiconductor patterns SP1, SP2, and SP3. The first to third semiconductor patterns SP1 to SP3 and the sacrificial layers SAL may be alternately stacked on the peripheral channel pattern PCH. In an example embodiment, the peripheral channel pattern PCH may include four semiconductor patterns SP1, SP2, SP3, and SP4.

Figure 17:
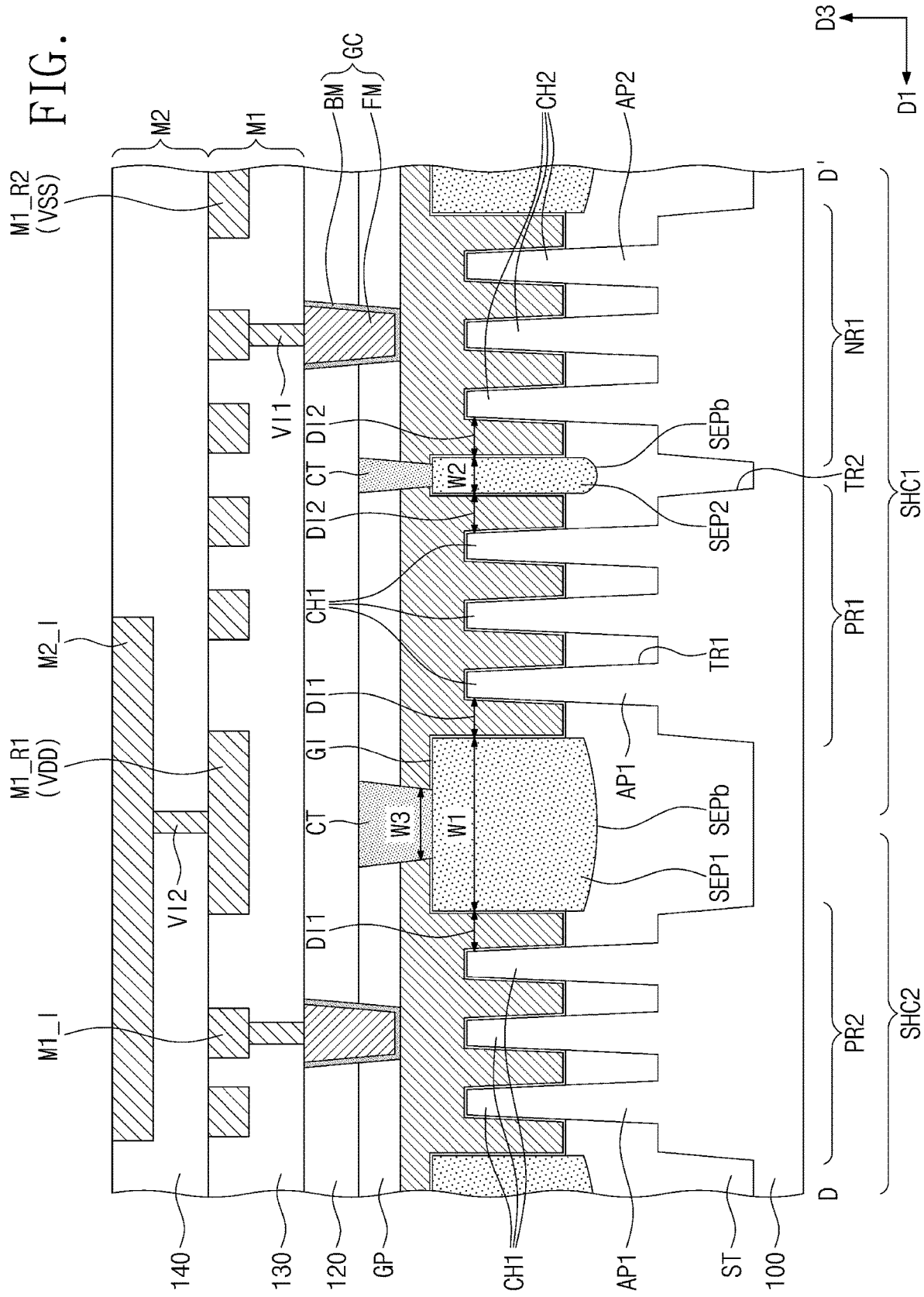
FIG. 17 is a sectional view taken along the line D-D' of FIG. 1 to illustrate a semiconductor device according to an example embodiment.

The first to third semiconductor patterns SP1, SP2, and SP3 may be formed of or include one of silicon (Si), germanium (Ge), and silicon-germanium (SiGe), and the sacrificial layers SAL may be formed of or include another of silicon (Si), germanium (Ge), and silicon-germanium (SiGe). For example, the first to third semiconductor patterns SP1, SP2, and SP3 may be formed of or include silicon (Si), and the sacrificial layers SAL may be formed of or include silicon-germanium (SiGe). As another example, the peripheral channel pattern PCH may have a fin shape, as shown in FIG. 17 below.

A third source/drain pattern SD3 may be provided on the third active pattern AP3. A fourth source/drain pattern SD4 may be provided on the fourth active pattern AP4. The third source/drain pattern SD3 may be provided to have the same or similar features as the first source/drain pattern SD1. The fourth source/drain pattern SD4 may be provided to have the same or similar features as the second source/drain pattern SD2.

A peripheral gate electrode PGE may be provided to cross the peripheral channel pattern PCH and to extend in the first direction D1. The peripheral gate electrode PGE may be vertically overlapped with the peripheral channel pattern PCH. The peripheral gate electrode PGE may have a width that is larger than the gate electrode GE on the logic cell region LCR described above.

Referring back to FIG. 2G, the peripheral gate electrode PGE may be provided on a top surface and opposite side surfaces of the peripheral channel pattern PCH. That is, the transistor on the peripheral region PER may be a three-dimensional field effect transistor (e.g., FinFET) in which the peripheral gate electrode PGE is provided to three-dimensionally surround the channel pattern.

A peripheral gate insulating layer PGI may be interposed between the peripheral gate electrode PGE and the peripheral channel pattern PCH. The peripheral gate insulating layer PGI may include an oxide layer EG and a high-k dielectric layer HK on the oxide layer EG. The oxide layer EG may be thicker than the high-k dielectric layer HK. As an example, the oxide layer EG may include a silicon oxide layer. The high-k dielectric layer HK may be formed of or include a high-k dielectric material whose dielectric constant is higher than the oxide layer EG.

The oxide layer EG may conformally cover the top and side surfaces of the peripheral channel pattern PCH. It may be possible to prevent a portion of the oxide layer EG from being etched in an etching process for forming the separation pattern SEP, because the oxide layer EG is covered with a first sacrificial layer during the during an etching process, as will be described below. As a result, electric characteristics of the semiconductor device may be improved.

The separation patterns SEP may be provided between the active patterns AP3 and/or AP4 which are adjacent to each other. The first separation pattern SEP1 may be provided between the third active pattern AP3 on the third PMOSFET region PR3 and the third active pattern AP3 on the fourth PMOSFET region PR4. The second separation pattern SEP2 may be provided between the third active pattern AP3 and the fourth active pattern AP4 which are adjacent to each other.

The largest width of the first separation pattern SEP1 may be the first width W1. The largest width of the second separation pattern SEP2 may be the second width W2. The first width W1 may be larger than the second width W2.

A distance between the first separation pattern SEP1 and the third active pattern AP3 may be the first distance DD. Here, the first distance DI1 may be a distance between the first separation pattern SEP1 and the peripheral channel pattern PCH. In other words, a distance between the first separation pattern SEP1 and the peripheral channel pattern PCH on the third PMOSFET region PR3 may be substantially equal to a distance between the first separation pattern SEP1 and the peripheral channel pattern PCH on the fourth PMOSFET region PR4. A ratio of the distance between the first separation pattern SEP1 and the peripheral channel pattern PCH on the fourth PMOSFET region PR4 to the distance between the first separation pattern SEP1 and the peripheral channel pattern PCH on the third PMOSFET region PR3 may range from 0.9 to 1.1.

A distance between the second separation pattern SEP2 and the third active pattern AP3 and a distance between the second separation pattern SEP2 and the fourth active pattern AP4 may be the second distance D12. Here, the second distance DI2 may be a distance between the second separation pattern SEP2 and the peripheral channel pattern PCH. A ratio of a distance between the second separation pattern SEP2 and the peripheral channel pattern PCH of the fourth active pattern AP4 to a distance between the second separation pattern SEP2 and the peripheral channel pattern PCH of the third active pattern AP3 may range from 0.9 to 1.1. The first distance DI1 may be substantially equal to the second distance D12. A ratio of the second distance DI2 to the first distance DI1 may range from 0.9 to 1.1.

The peripheral gate electrode PGE may be divided into a plurality of portions by the separation pattern SEP and the gate cutting pattern CT. The gate cutting pattern CT may be interposed between the peripheral gate electrodes PGE on the third and fourth PMOSFET regions PR3 and PR4, which are aligned to each other in the first direction D1. The peripheral gate electrode PGE extending in the first direction D1 may be divided into a plurality of peripheral gate electrodes PGE by the separation patterns SEP and the gate cutting patterns CT.

The gate cutting pattern CT may be disposed at a position that is suitable for the division of the peripheral gate electrode PGE. The gate cutting pattern CT may be provided to penetrate the gate capping pattern GP and contact a top surface of one of the separation patterns SEP.

The active contacts AC may be provided to penetrate the first and second interlayer insulating layers 110 and 120, and may be electrically connected to the third and fourth source/drain patterns SD3 and SD4, respectively. The gate contact GC may be provided to penetrate the second interlayer insulating layer 120 and the gate capping pattern GP, and may be electrically connected to the peripheral gate electrode PGE. The first metal layer M1 may be provided on the second interlayer insulating layer 120. The second metal layer M2 may be provided on the first metal layer M1.

FIGS. 3A to 13D are sectional views illustrating a method of fabricating a semiconductor device, according to an example embodiment. FIGS. 3A, 4A, 5A, 8A, 9A, 10A, 11A, 12A, and 13A are sectional views, each of which is taken along the line A-A' of FIG. 1. FIGS. 10B, 11B, 12B, and 13B are sectional views, each of which is taken along the line B-B' of FIG. 1. FIGS. 10C, 11C, 12C, and 13C are sectional views, each of which is taken along the line C-C' of FIG. 1. FIGS. 3B, 4B, 5B, 6, 7, 8B, 9B, 10D, 12D, and 13D are sectional views, each of which is taken along the line D-D' of FIG. 1. Hereinafter, a fabrication method performed on the logic cell region LCR will be exemplarily described in more detail below.

Figure 3A:
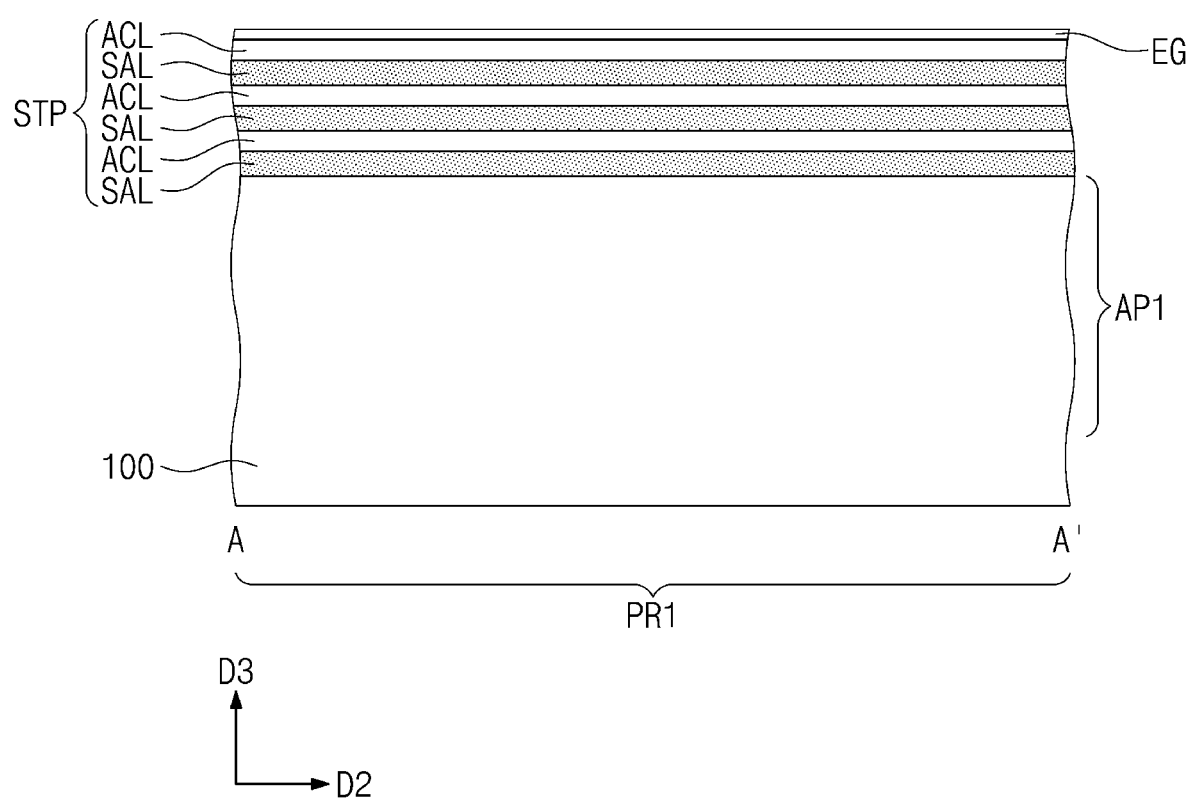
FIGS. 3A, 3B, 4A, 4B, 5A, 5B, 6, 7, 8A, 8B, 9A, 9B, 10A, 10B, 10C, 10D, 11A, 11B, 11C, 12A, 12B, 12C, 12D, 13A, 13B, 13C and 13D are sectional views illustrating a method of fabricating a semiconductor device, according to an example embodiment.
Figure 3B:
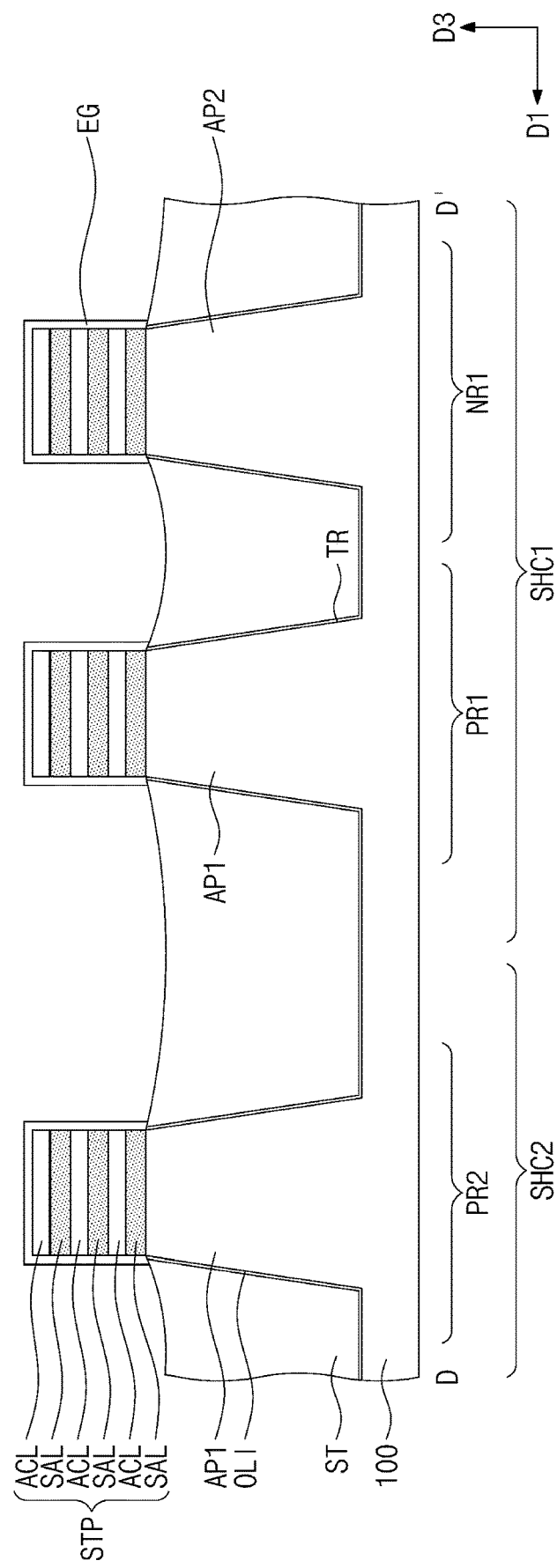

Referring to FIGS. 1, 3A, and 3B, the substrate 100 including the logic cell region LCR may be provided. The logic cell region LCR may include the first PMOSFET region PR1, the second PMOSFET region PR2, the first NMOSFET region NR1, and the second NMOSFET region NR2. The sacrificial layers SAL and active layers ACL may be alternately stacked on the substrate 100. The sacrificial layers SAL may be formed of or include one of silicon (Si), germanium (Ge), and silicon-germanium (SiGe), and the active layers ACL may be formed of or include another one of silicon (Si), germanium (Ge), and silicon-germanium (SiGe).

For example, the sacrificial layers SAL may be formed of or include silicon-germanium (SiGe), and the active layers ACL may be formed of or include silicon (Si). A germanium concentration of each of the sacrificial layers SAL may range from 10 at. % to 30 at. %.

Masks may be respectively formed on the first PMOSFET region PR1, the second PMOSFET region PR2, the first NMOSFET region NR1, and the second NMOSFET region NR2 of the substrate 100. The mask may have a line shape or a bar shape extending in the second direction D2.

A patterning process using the masks as an etch mask may be performed to form the trench TR defining the first and second active patterns AP1 and AP2. The first active patterns AP1 and the second active patterns AP2 may be respectively provided on the first and second PMOSFET regions PR1 and PR2 and the first and second NMOSFET regions NR1 and NR2. A stacking pattern STP may be formed on each of the first and second active patterns AP1 and AP2. The stacking pattern STP may include the sacrificial layers SAL and the active layers ACL, which are alternatingly stacked. The stacking pattern STP may be formed along with the first and second active patterns AP1 and AP2, during the patterning process. A width between the first active patterns AP1, which are adjacent to each other, may be larger than a width between the first and second active patterns AP1 and AP2, which are adjacent to each other.

The device isolation layer ST may be formed within the trench TR. In detail, an insulating layer, for example liner layer OLI, may be formed on the substrate 100. For example, the insulating layer may cover the first and second active patterns AP1 and AP2 and the stacking patterns STP. The device isolation layer ST may be formed by recessing the insulating layer to expose the stacking patterns STP. The device isolation layer ST may have a curved profile, for example a concave upper surface.

The device isolation layer ST may be formed of or include at least one of various insulating materials (e.g., silicon oxide). The stacking patterns STP may be placed on the device isolation layer ST and may be exposed to the outside of the device isolation layer ST. In other words, the stacking patterns STP may protrude vertically above the device isolation layer ST.

The oxide layer EG may be formed on, for example to cover, top and side surfaces of the stacking pattern STP. In an example embodiment, the oxide layer EG may include a silicon oxide layer. The oxide layer EG may be conformally formed on the stacking pattern STP.

Figure 4A:
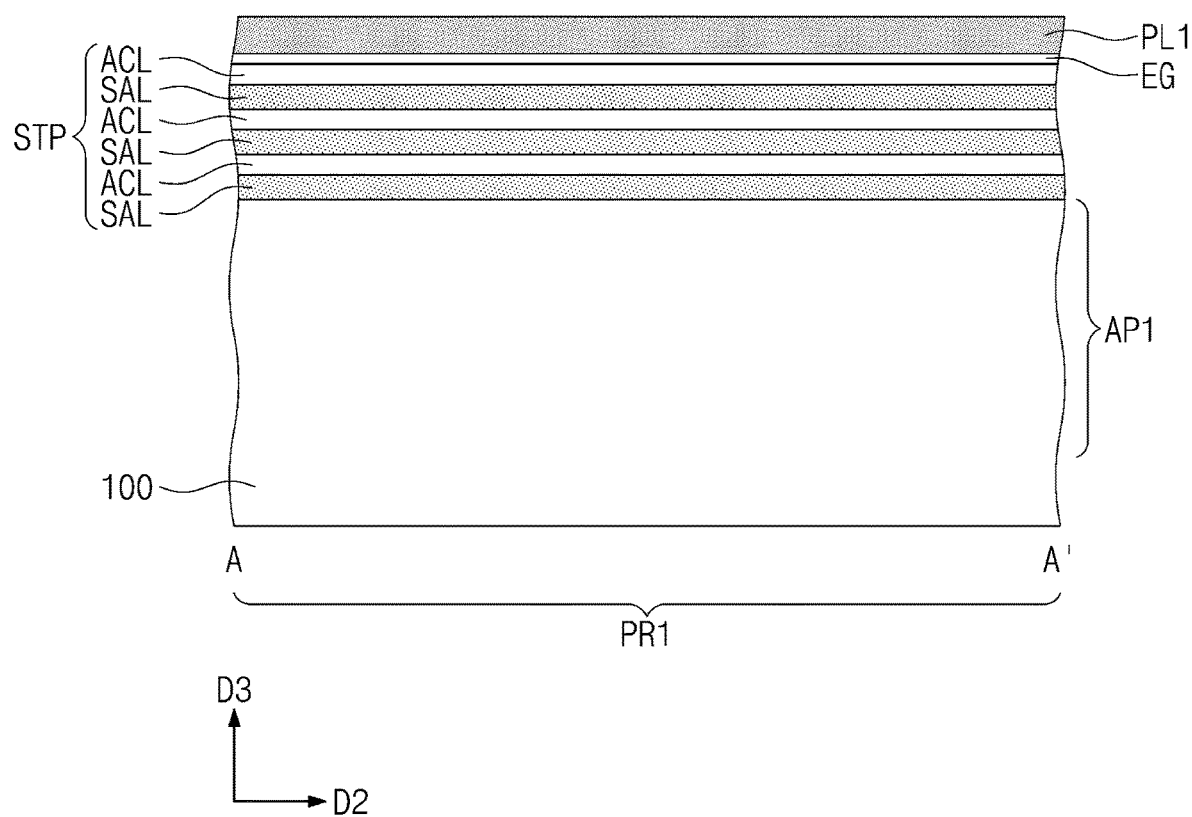
Figure 4B:
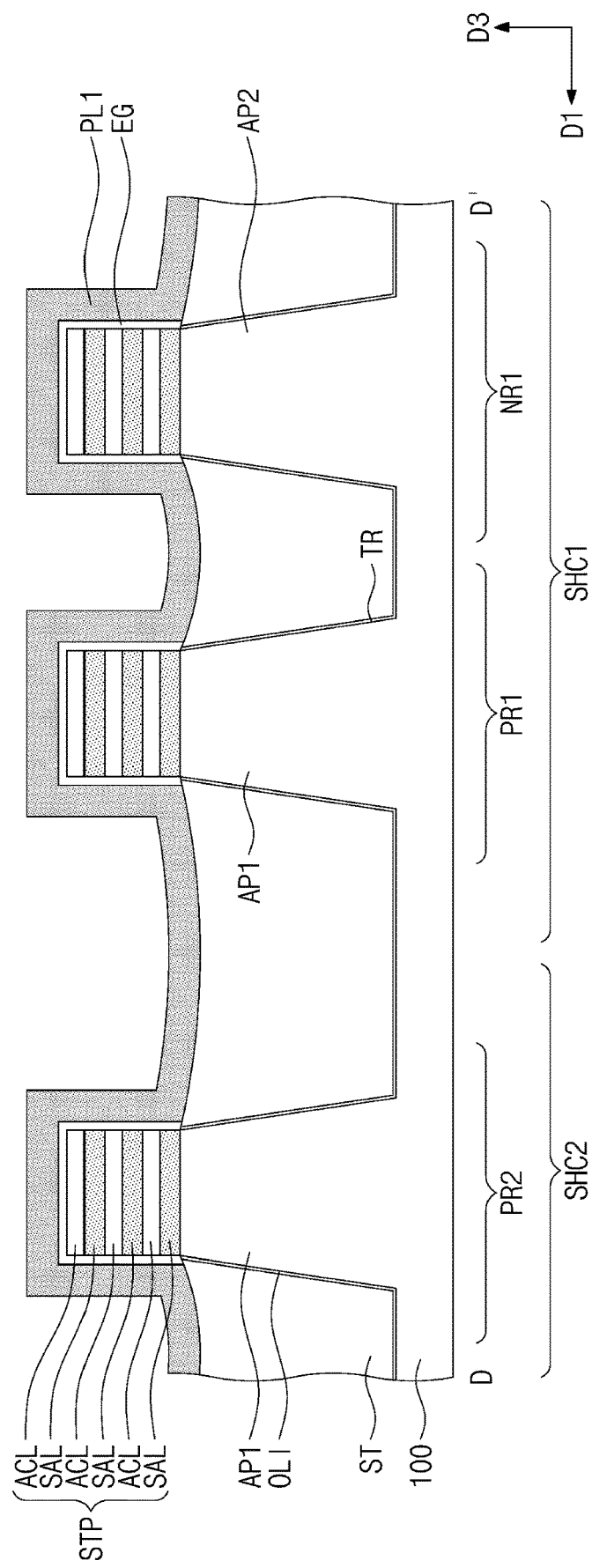

Referring to FIGS. 1, 4A, and 4B, a first sacrificial layer PL1 may be formed on the substrate 100. The first sacrificial layer PL1 may be formed of or include one of amorphous silicon or polycrystalline silicon. The first sacrificial layer PL1 may be conformally formed along the top surface of the device isolation layer ST and the top and side surfaces of the oxide layer EG.

Figure 5A:
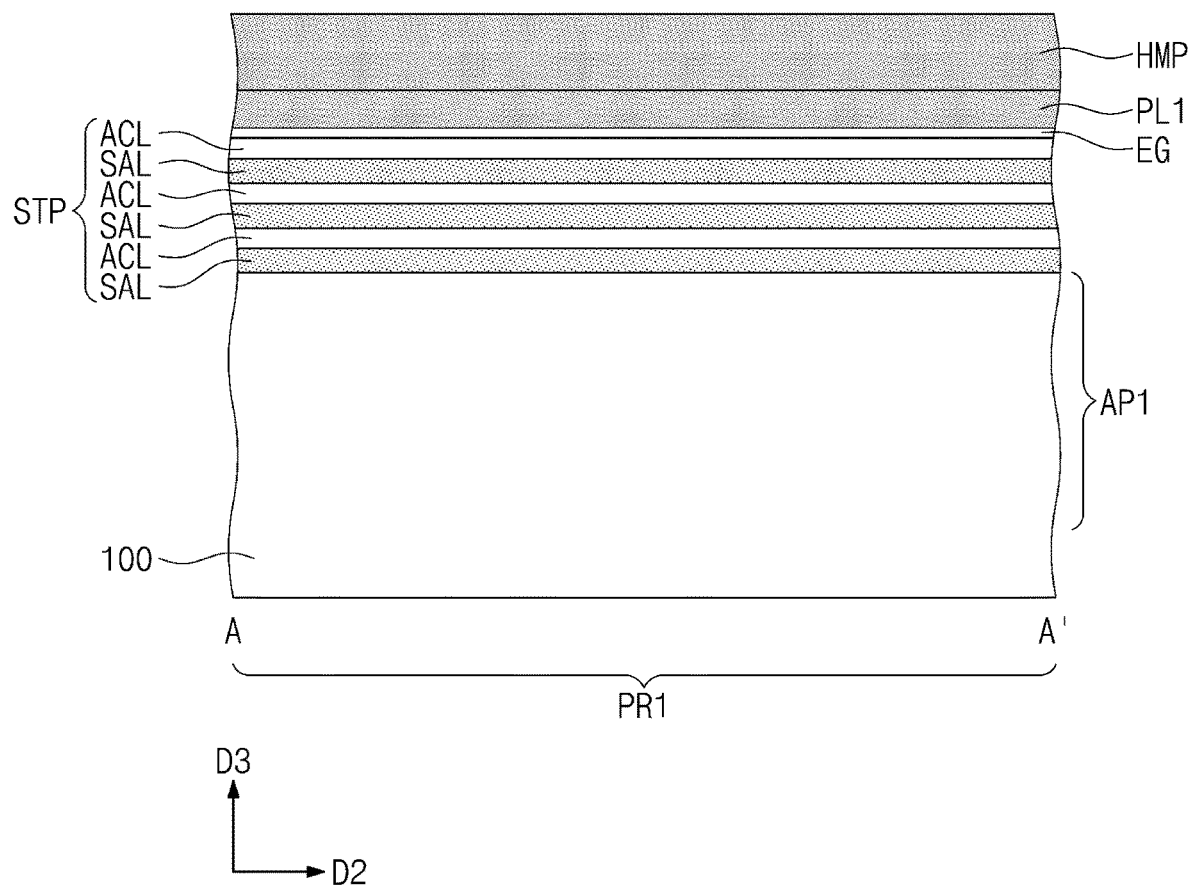
Figure 5B:
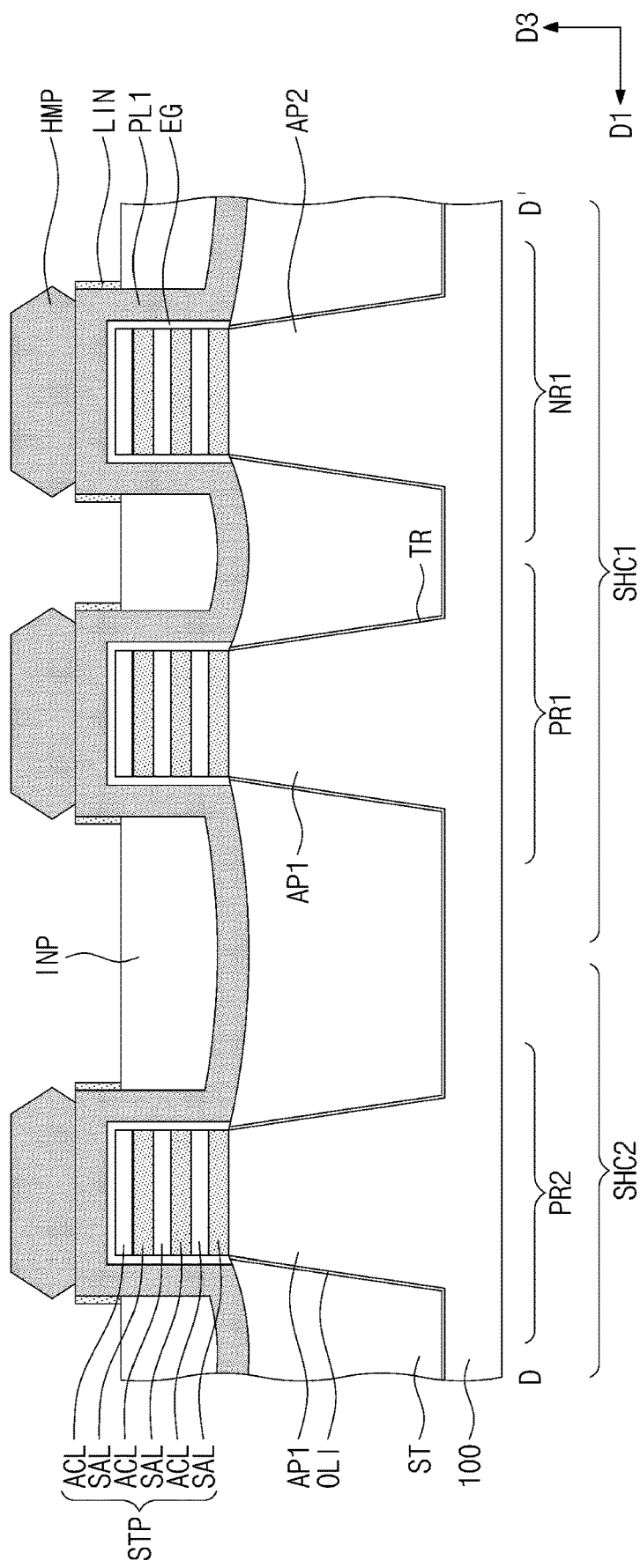

Referring to FIGS. 1, 5A, and 5B, an insulating pattern INP may be formed on the first sacrificial layer PL1. In an example embodiment, the insulating pattern INP may be formed of or include silicon oxide. As an example, a top surface of the insulating pattern INP may be located at a level lower than the topmost surface of the first sacrificial layer PL1. As another example, the top surface of the insulating pattern INP may be coplanar with the topmost surface of the first sacrificial layer PL1. The formation of the insulating pattern INP may include forming an insulating layer on the first sacrificial layer PL1 and performing an etch-back process on the insulating layer.

A liner layer LIN may be formed on a side surface of the first sacrificial layer PL1 exposed by (i.e., is above) the insulating pattern INP. As an example, the liner layer LIN may be formed of or include silicon nitride. Hard mask patterns HMP may be formed on the topmost surface of the first sacrificial layer PL1 exposed by the liner layer LIN. The hard mask patterns HMP may be formed by a selective epitaxial growth (SEG) process. The hard mask patterns HMP may be formed of or include the same material as the first sacrificial layer PL1.

Figure 6:
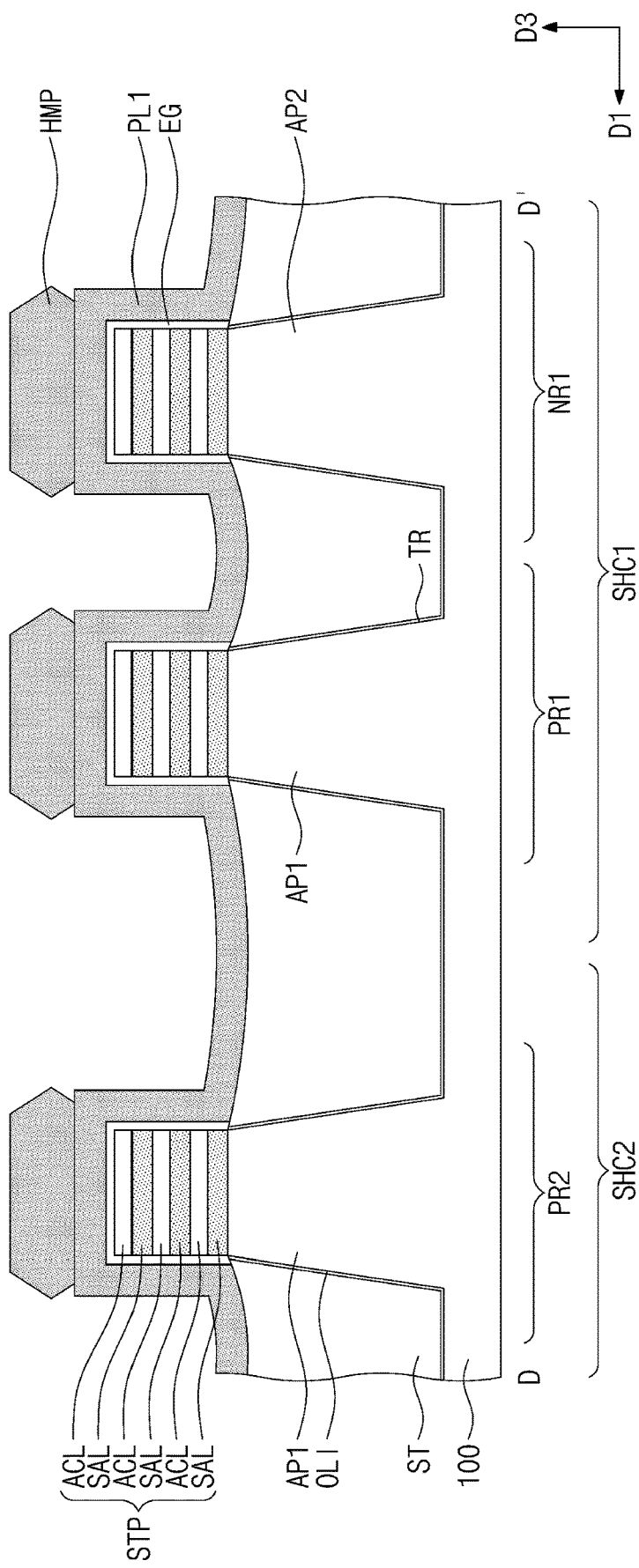

Referring to FIGS. 1 and 6, the liner layer LIN and the insulating pattern INP may be removed, after the formation of the hard mask patterns HMP.

Figure 7:
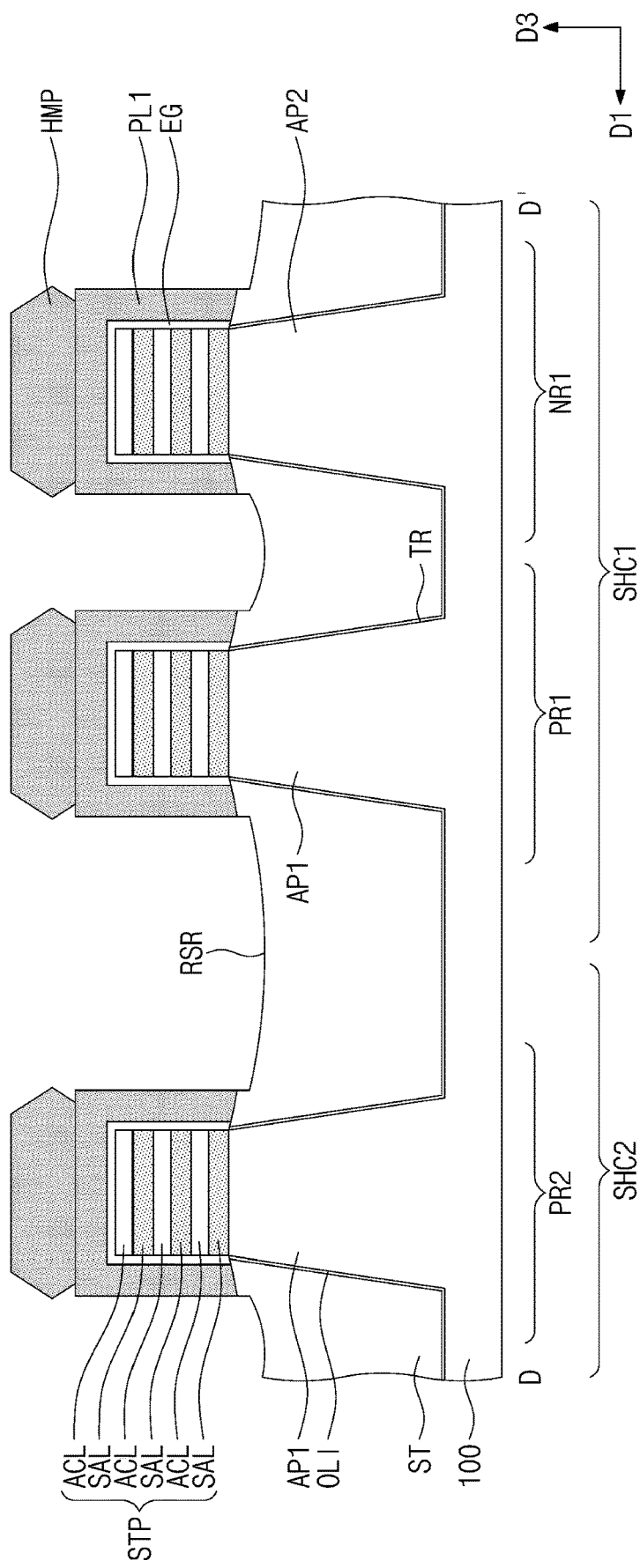

Referring to FIGS. 1 and 7, a portion of the first sacrificial layer PL1 and a portion of the device isolation layer ST may be removed using the hard mask patterns HMP as an etch mask. Recess regions RSR may be formed in the device isolation layer ST. A bottom surface of each of the recess regions RSR may have a curved profile. A remaining portion of the first sacrificial layer PL1 may be conformally provided on, and for example may conformally cover, the top and side surfaces of the oxide layer EG.

Figure 8A:
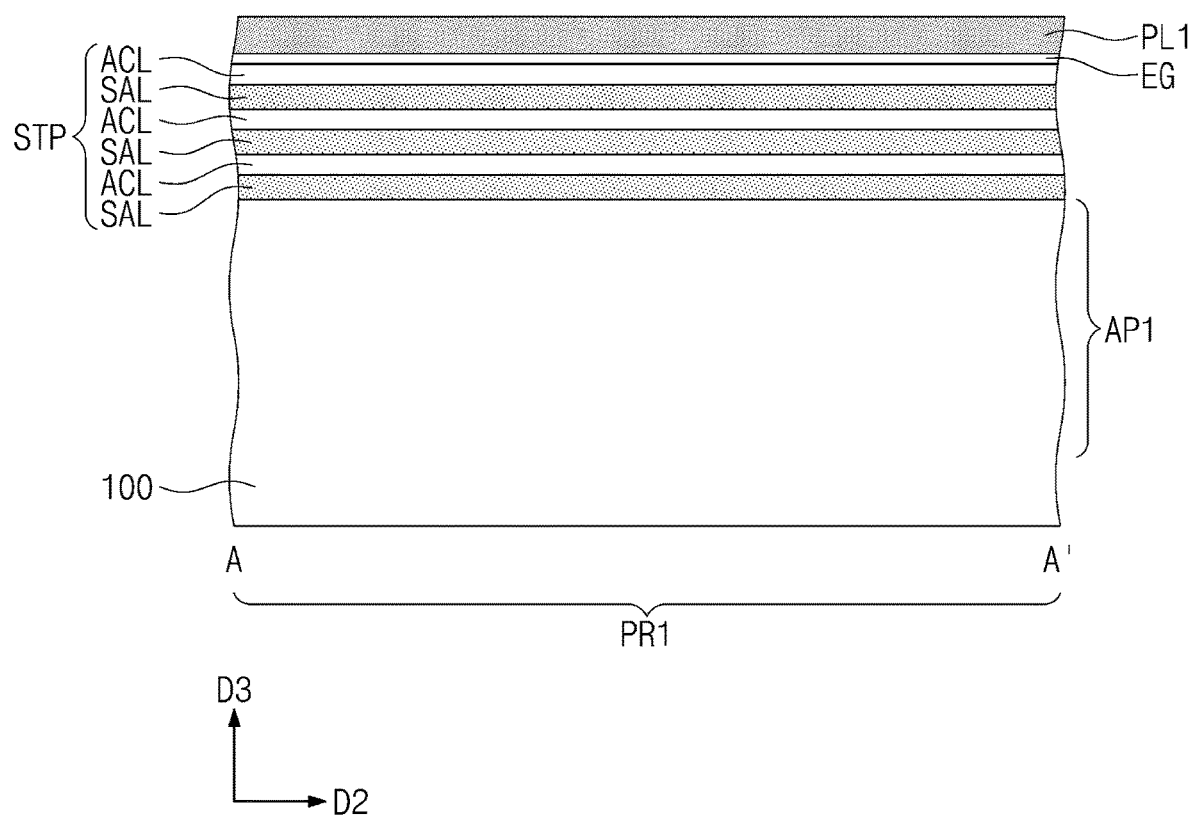
Figure 8B:
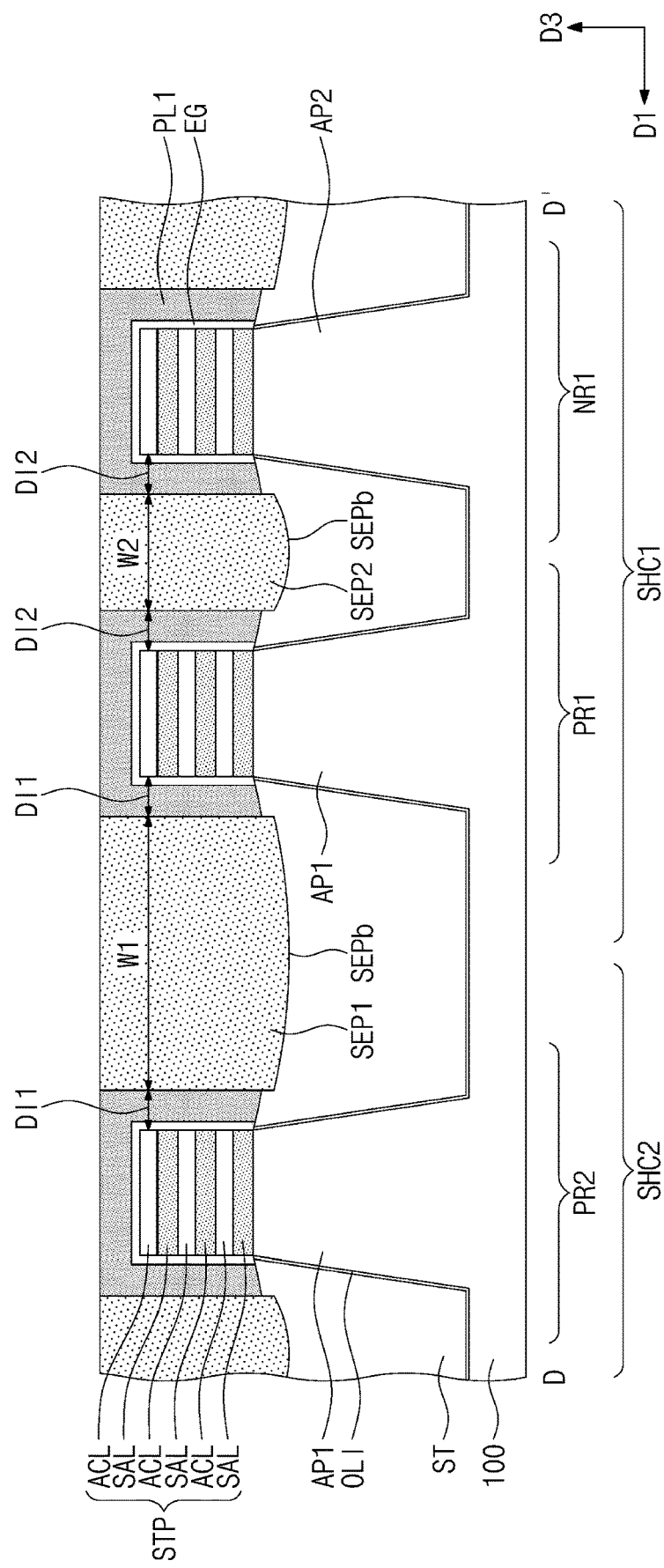

Referring to FIGS. 1, 8A, and 8B, the hard mask patterns HMP may be removed. Thereafter, the separation patterns SEP may be formed between the stacking patterns STP, which are adjacent to each other. The separation patterns SEP may be formed in a self-aligned manner by the first sacrificial layer PL1. As an example, each of the separation patterns SEP may be formed of or include at least one of silicon nitride, high-k dielectric materials, or low-k dielectric materials. Each of the separation patterns SEP may be formed to fill the recess region RSR. The formation of the separation patterns SEP may include forming an insulating material to fill the recess region RSR and performing a planarization process on the insulating material. The first sacrificial layer PL1 and the separation pattern SEP may have top surfaces that are coplanar with each other.

The separation patterns SEP may include the first separation pattern SEP1 and the second separation pattern SEP2. The first separation pattern SEP1 may be formed between the first active pattern AP1 on the first PMOSFET region PR1 and the first active pattern AP1 on the second PMOSFET region PR2. The second separation pattern SEP2 may be formed between the first and second active patterns AP1 and AP2, which are adjacent to each other.

The separation patterns SEP may be provided to penetrate an upper portion of the device isolation layer ST. The bottom surface SEPb of the separation pattern SEP may be located at a level that is lower than the bottom surface of the gate electrode GE and the top surface of the device isolation layer ST. The bottom surface SEPb of the separation pattern SEP may have a convex profile toward the device isolation layer ST. The bottom surface SEPb of the separation pattern SEP may have a curved profile.

The largest width of the first separation pattern SEP1 may be a first width W1. The largest width of the second separation pattern SEP2 may be a second width W2. The first width W1 may be larger than the second width W2. A distance between the first separation pattern SEP1 and the stacking pattern STP may be a first distance DI1. In other words, a distance between the first separation pattern SEP1 and the stacking pattern STP on the first PMOSFET region PR1 may be substantially equal to a distance between the first separation pattern SEP1 and the stacking pattern STP on the second PMOSFET region PR2. This may be because the first sacrificial layer PL1 is conformally formed and the separation patterns SEP are formed in a self-aligned manner using the first sacrificial layer PL1. A ratio of the distance between the first separation pattern SEP1 and the stacking pattern STP on the second PMOSFET region PR2 to the distance between the first separation pattern SEP1 and the stacking pattern STP on the first PMOSFET region PR1 may range from 0.9 to 1.1.

A distance between the second separation pattern SEP2 and the stacking pattern STP on the first active pattern AP1 and a distance between the second separation pattern SEP2 and the stacking pattern STP on the second active pattern AP2 may be the second distance DI2. In other words, the distance between the second separation pattern SEP2 and the stacking pattern STP on the first active pattern AP1 may be substantially equal to the distance between the second separation pattern SEP2 and the stacking pattern STP on the second active pattern AP2. A ratio of the distance between the second separation pattern SEP2 and the stacking pattern STP on the second active pattern AP2 to the distance between the second separation pattern SEP2 and the stacking pattern STP on the first active pattern AP1 may range from 0.9 to 1.1. Because the first sacrificial layer PL1 is conformally formed, the first distance DI1 may be substantially equal to the second distance DI2. A ratio of the second distance DI2 to the first distance DI1 may range from 0.9 to 1.1.

According to an example embodiment, because the separation pattern SEP is formed in a self-aligned manner, it may be possible to secure a sufficiently large distance between the separation pattern SEP and a channel pattern adjacent thereto. As a result, electric characteristics of the semiconductor device may be improved.

Figure 9A:
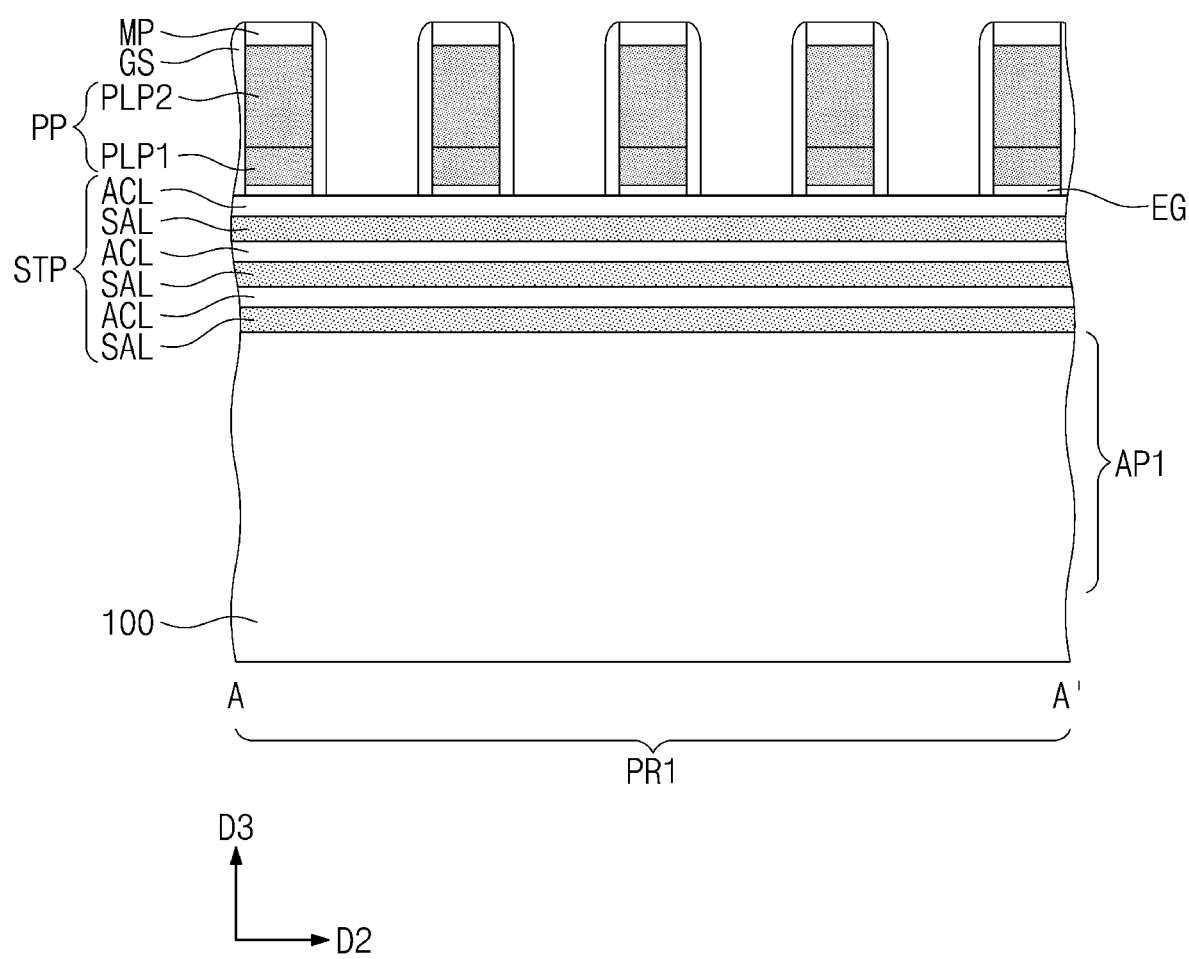
Figure 9B:
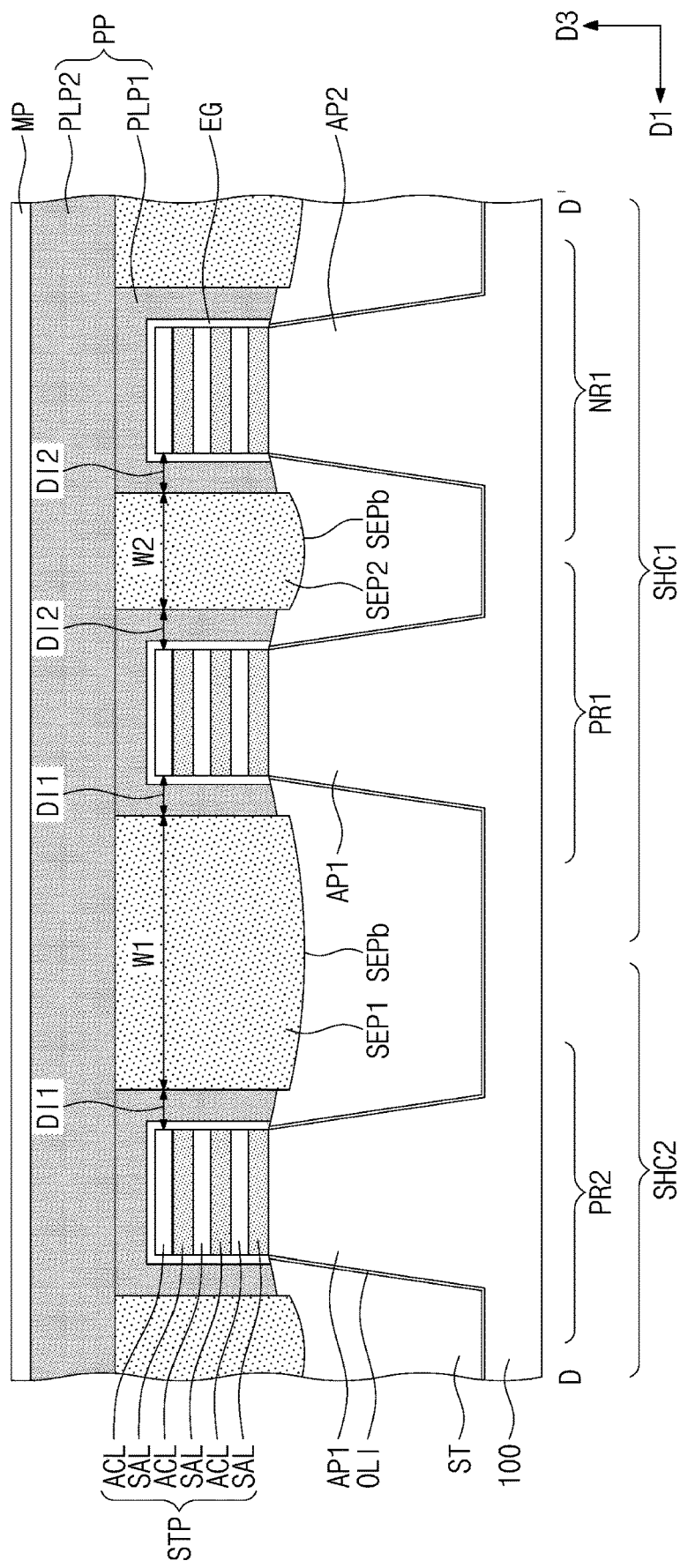
Figure 10A:
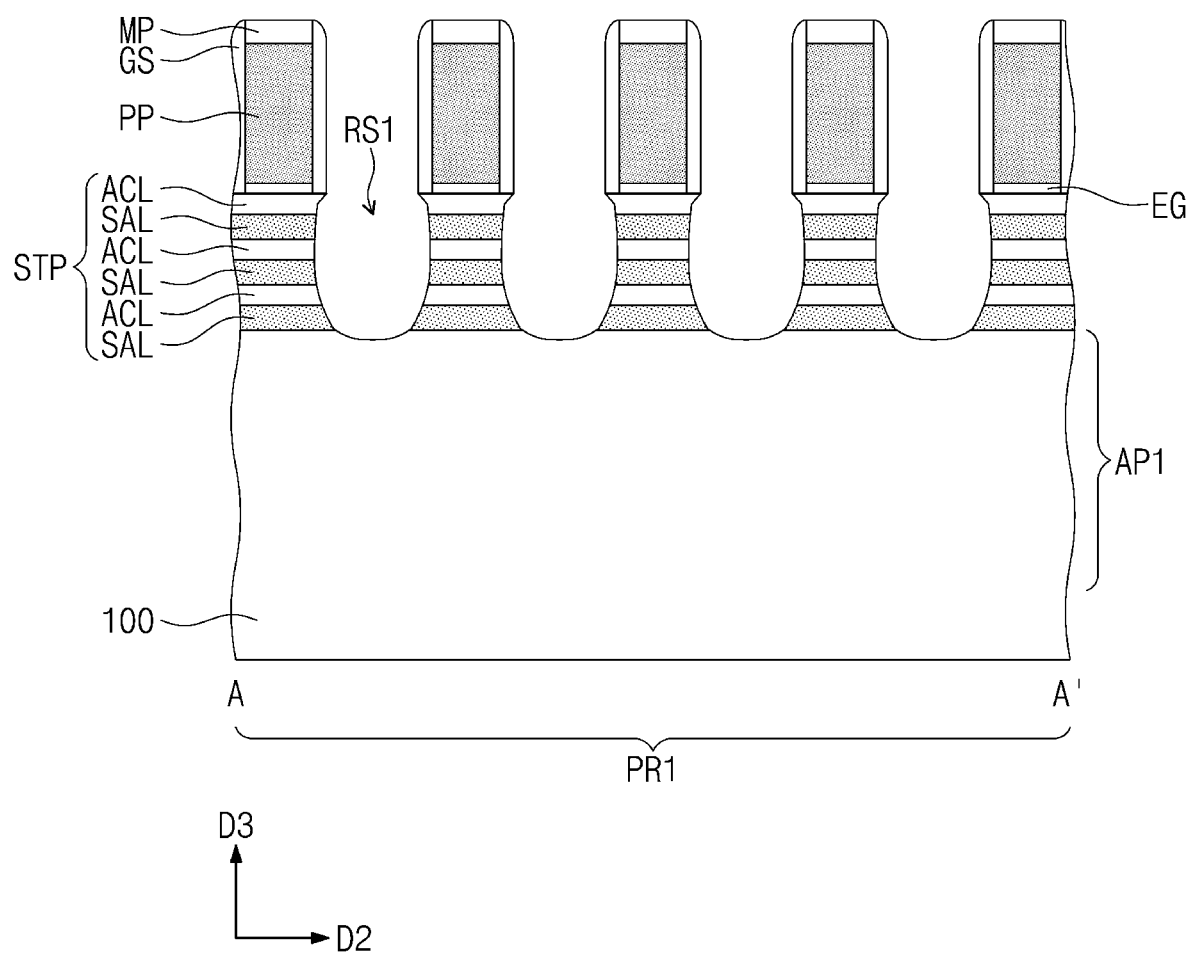
Figure 10B:
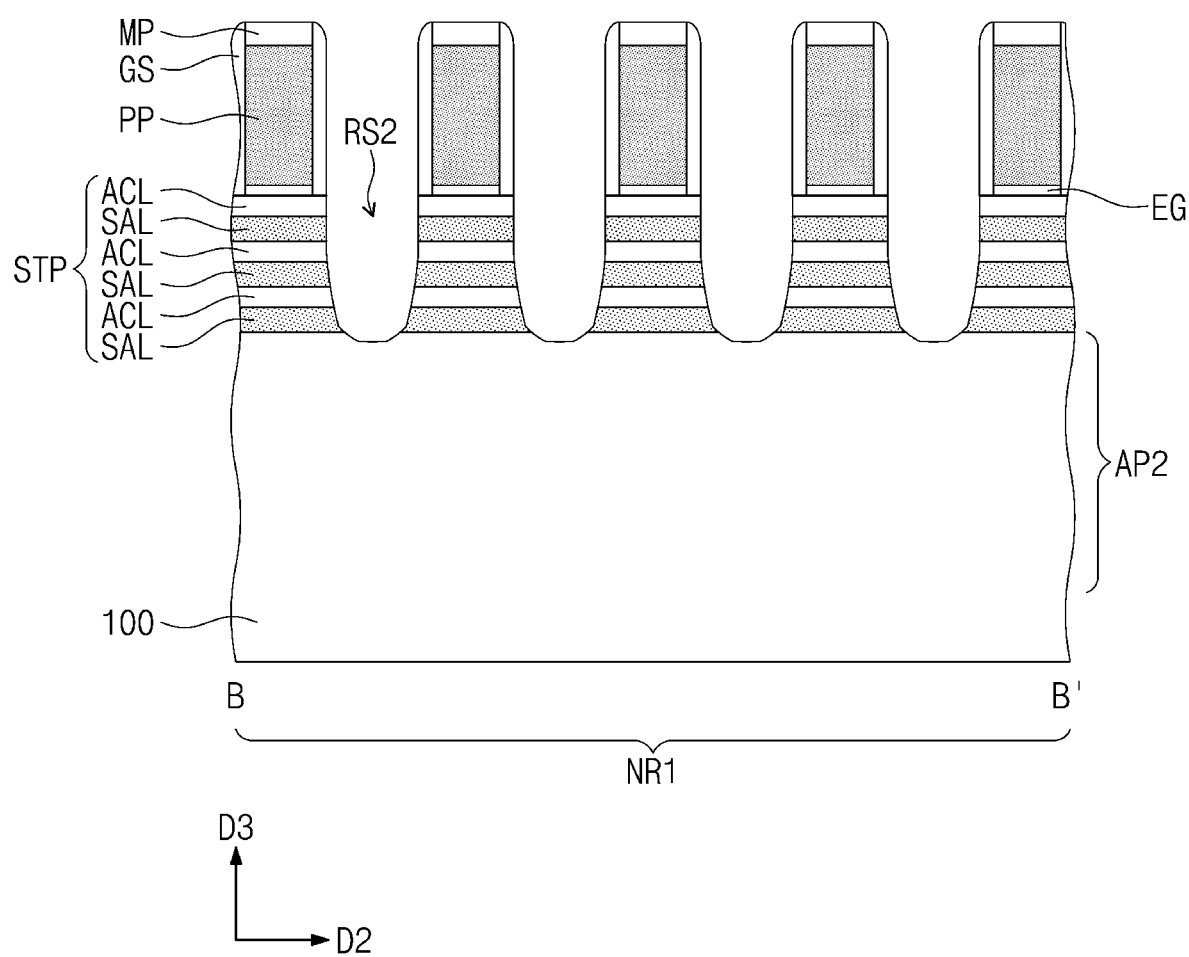
Figure 10C:
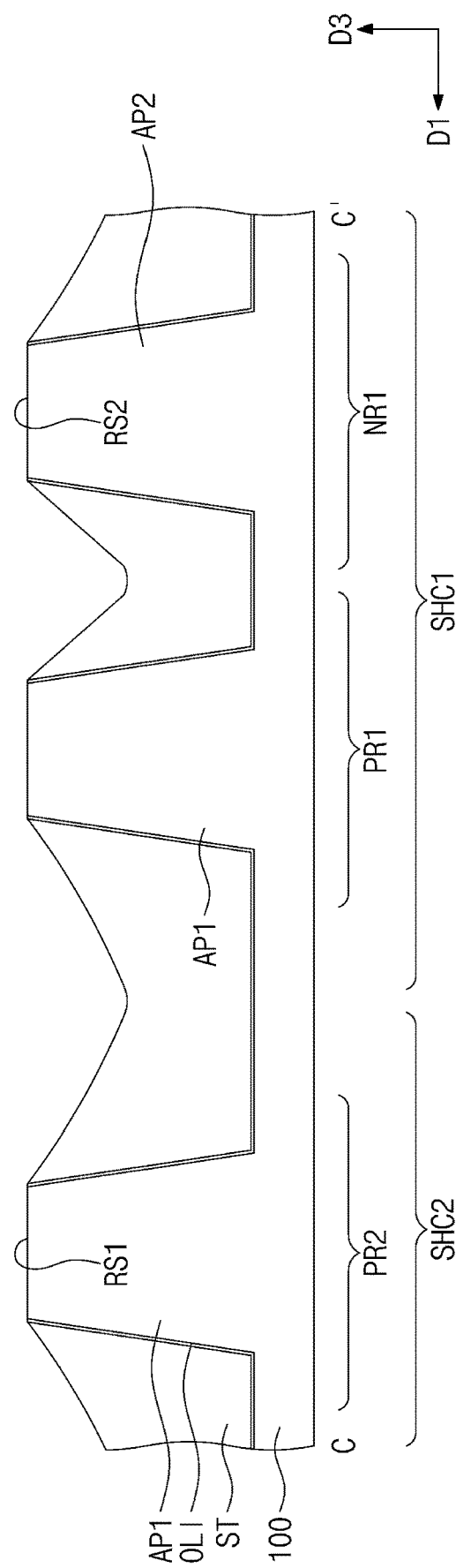
Figure 10D:
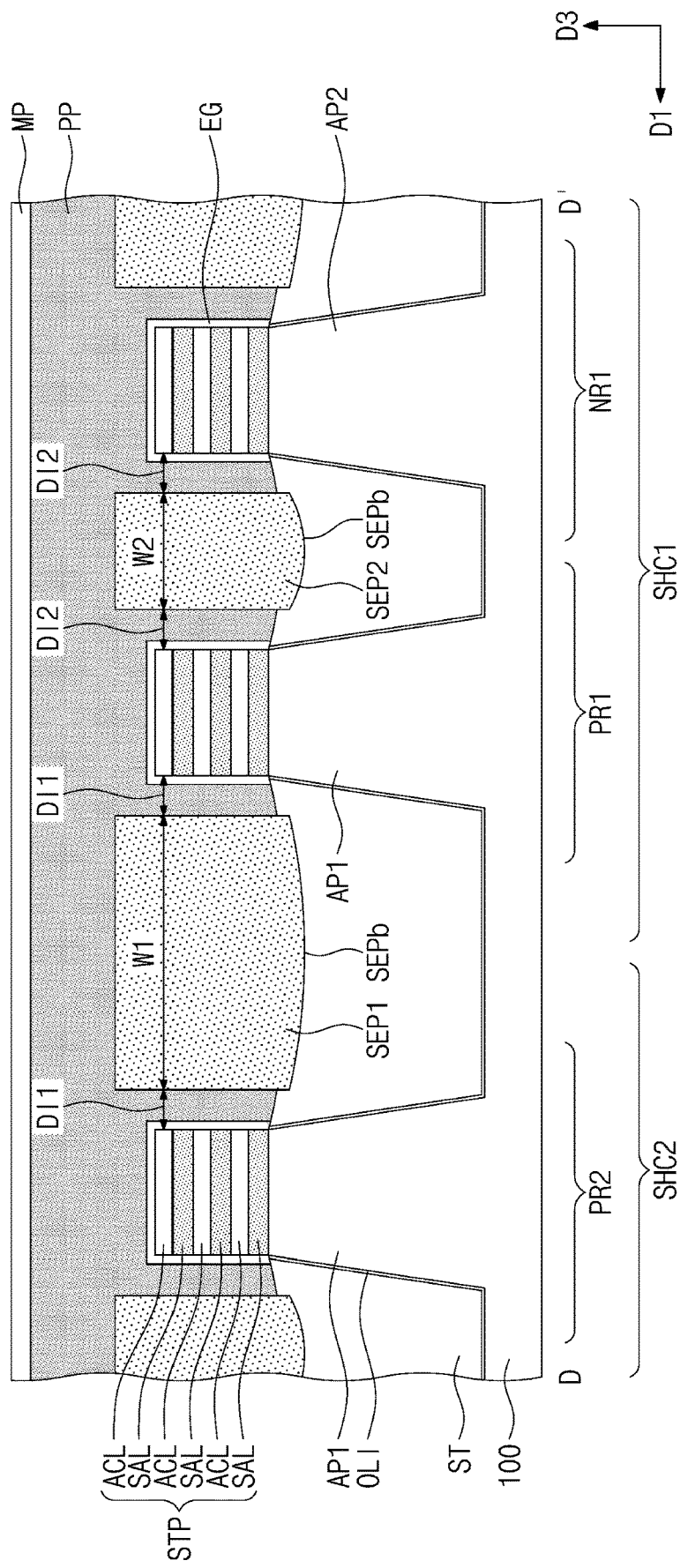

Referring to FIGS. 1, 9A, and 9B, a second sacrificial layer may be formed on the first sacrificial layer PL1 and the separation patterns SEP. The second sacrificial layer may be formed of or include the same material as the first sacrificial layer PL1. As an example, the second sacrificial layer may be formed of or include at least one of amorphous silicon or polycrystalline silicon. The second sacrificial layer may be formed on the substrate 100.

The first sacrificial layer PL1 and the second sacrificial layer may be patterned to form sacrificial gate patterns PP crossing the stacking patterns STP. In detail, the formation of the sacrificial gate patterns PP may include forming mask patterns MP on the second sacrificial layer and patterning the first and second sacrificial layers using the mask patterns MP as an etch mask. The oxide layer EG below the first sacrificial layer PL1 may also be patterned during patterning the sacrificial layer using the mask patterns MP.

The first sacrificial layer PL1 may be patterned to form a first sacrificial pattern PLP1. The second sacrificial layer may be patterned to form a second sacrificial pattern PLP2. The first sacrificial pattern PLP1 and the second sacrificial pattern PLP2 may constitute the sacrificial gate pattern PP.

A pair of the gate spacers GS may be formed on opposite side surfaces of each of the sacrificial gate patterns PP. The formation of the gate spacers GS may include conformally forming a gate spacer layer on the substrate 100 and anisotropically etching the gate spacer layer. In an example embodiment, the gate spacer layer may be formed of or include at least one of SiCN, SiCON, or SiN. Alternatively, the gate spacer layer may include at least two layers, each of which is formed of at least one of SiCN, SiCON, or SiN; that is, the gate spacer layer may have a multi-layered structure.

Referring to FIGS. 1 and 10A to 10D, the first recesses RS1 may be formed in the stacking pattern STP on the first active pattern AP1. The second recesses RS2 may be formed in the stacking pattern STP on the second active pattern AP2. The device isolation layer ST, which is located at both sides of each of the first and second active patterns AP1 and AP2, may be further recessed, during the formation of the first and second recesses RS1 and RS2 (e.g., see FIG. 10C).

In detail, the first recesses RS1 may be formed by etching the stacking pattern STP on the first active pattern AP1, using the mask patterns MP and the gate spacers GS as an etch mask. The first recess RS1 may be formed between a pair of the sacrificial gate patterns PP. The second recesses RS2 in the stacking pattern STP on the second active pattern AP2 may be formed by the same method as that for the first recesses RS1.

Referring to FIGS. 1 and 11A to 11C, the first source/drain patterns SD1 may be formed in the first recesses RS1, respectively. In detail, the first semiconductor layer SEL1 may be formed by performing a first SEG process using an inner surface of the first recess RS1 as a seed layer. The first semiconductor layer SEL1 may be grown using the first to third semiconductor patterns SP1, SP2, and SP3, the sacrificial layers SAL, and the substrate 100, which are exposed through the first recess RS1, as a seed layer. As an example, the first SEG process may include a chemical vapor deposition (CVD) process or a molecular beam epitaxy (MBE) process.

The first semiconductor layer SEL1 may be formed of or include a semiconductor material (e.g., SiGe) having a lattice constant greater than that of the substrate 100. The first semiconductor layer SEL1 may be provided to have a relatively low germanium concentration. In an example embodiment, the first semiconductor layer SEL1 may be provided to contain only silicon (Si) and not germanium (Ge). As an example, the germanium concentration of the first semiconductor layer SEL1 may range from 0 at. % to 10 at. %.

The second semiconductor layer SEL2 may be formed by performing a second SEG process on the first semiconductor layer SEL1. The second semiconductor layer SEL2 may be formed to completely fill the first recess RS1. The second semiconductor layer SEL2 may be provided to have a relatively high germanium concentration. As an example, the germanium concentration of the second semiconductor layer SEL2 may range from 30 at. % to 70 at. %.

The first and second semiconductor layers SEL1 and SEL2 may constitute the first source/drain pattern SD1. The first and second semiconductor layers SEL1 and SEL2 may be doped with impurities in situ during the first and second SEG processes. Alternatively, the first source/drain pattern SD1 may be doped with impurities, after the formation of the first source/drain pattern SD1. The first source/drain pattern SD1 may be doped to have a first conductivity type (e.g., p-type).

The second source/drain patterns SD2 may be formed in the second recesses RS2, respectively. In detail, the second source/drain pattern SD2 may be formed by a SEG process, in which an inner surface of the second recess RS2 is used as a seed layer. In an example embodiment, the second source/drain pattern SD2 may be formed of or include the same semiconductor material (e.g., Si) as the substrate 100. The second source/drain pattern SD2 may be doped to have a second conductivity type (e.g., n-type). The inner spacers IP may be respectively formed between the second source/drain pattern SD2 and the sacrificial layers SAL.

The first to third semiconductor patterns SP1, SP2, and SP3, which are sequentially stacked between adjacent ones of the first recesses RS1, may be formed from the active layers ACL. The first to third semiconductor patterns SP1, SP2, and SP3, which are sequentially stacked between adjacent ones of the second recesses RS2, may be formed from the active layers ACL.

The first to third semiconductor patterns SP1, SP2, and SP3 between adjacent ones of the first recesses RS1 may constitute the first channel pattern CH1. The first to third semiconductor patterns SP1, SP2, and SP3 between adjacent ones of the second recesses RS2 may constitute the second channel pattern CH2.

Referring to FIGS. 1 and 12A to 12D, the first interlayer insulating layer 110 may be formed to be provided on, and for example may cover, the first and second source/drain patterns SD1 and SD2, the mask patterns MP, and the gate spacers GS. In an example embodiment, the first interlayer insulating layer 110 may include a silicon oxide layer.

The first interlayer insulating layer 110 may be planarized to expose top surfaces of the sacrificial gate patterns PP. The planarization of the first interlayer insulating layer 110 may be performed using an etch-back or chemical-mechanical polishing (CMP) process. All of the mask patterns MP may be removed during the planarization process. As a result, the top surface of the first interlayer insulating layer 110 may be coplanar with the top surfaces of the sacrificial gate patterns PP and the top surfaces of the gate spacers GS.

The exposed sacrificial gate pattern PP and the oxide layer EG may be removed. Thus, an outer region ORG may be formed to expose the first and second channel patterns CH1 and CH2 (e.g., see FIG. 12D). As a result of the removal of the sacrificial gate pattern PP and the oxide layer EG, the sacrificial layers SAL may be exposed through the outer region ORG. The exposed sacrificial layers SAL may be selectively removed to form inner regions IRG (e.g., see FIG. 12D). In detail, by performing a process of selectively etching the sacrificial layers SAL, it may be possible to leave the first to third semiconductor patterns SP1, SP2, and SP3 and to remove only the sacrificial layers SAL. The etching process may be chosen to have a high etch rate for a material (e.g., SiGe) having a relatively high germanium concentration. For example, the etching process may have a high etch rate for silicon-germanium whose germanium concentration is higher than 10 at. %.

The sacrificial layers SAL on the first and second PMOSFET regions PR1 and PR2 and the first and second NMOSFET regions NR1 and NR2 may be removed during the etching process. The etching process may be a wet etching process. An etchant material, which is used in the etching process, may be chosen to quickly remove the sacrificial layer SAL having a relatively high germanium concentration. The first source/drain pattern SD1 on the first and second PMOSFET regions PR1 and PR2 may be protected from the etching process by the first semiconductor layer SEL1 having a relatively low germanium concentration.

Referring back to FIG. 12D, because the sacrificial layers SAL are selectively removed, the first to third semiconductor patterns SP1, SP2, and SP3, which are stacked to be spaced apart from each other, may be left on each of the first and second active patterns AP1 and AP2. Empty regions, which are formed by removing the sacrificial layers SAL, may form first to third inner regions IRG1, IRG2, and IRG3, respectively. In detail, the first inner region IRG1 may be formed between the active pattern AP1 or AP2 and the first semiconductor pattern SP1, the second inner region IRG2 may be formed between the first semiconductor pattern SP1 and the second semiconductor pattern SP2, and the third inner region IRG3 may be formed between the second semiconductor pattern SP2 and the third semiconductor pattern SP3.

Referring to FIGS. 1 and 13A to 13D, the gate insulating layer GI may be conformally formed on the exposed first to third semiconductor patterns SP1, SP2, and SP3. The gate electrode GE may be formed on the gate insulating layer GI. The gate capping pattern GP may be formed on the gate electrode GE. The gate insulating layer GI may be formed to be provided on, and for example may cover, the top and side surfaces of each of the separation patterns SEP.

The gate electrode GE may be formed to fill the first to third inner regions IRG1, IRG2, and IRG3 and the outer region ORG. The gate electrode GE may include the first, second, and third portions PO1, PO2, and PO3, which are formed to fill the first to third inner regions IRG1, IRG2, and IRG3, respectively. The gate electrode GE may include the fourth portion PO4, which is formed to fill the outer region ORG.

A distance between the first separation pattern SEP1 and the first active pattern AP1 may be the first distance DI1. Here, the first distance DI1 may be a distance between the first separation pattern SEP1 and the first channel pattern CH1. In other words, a distance between the first separation pattern SEP1 and the first channel pattern CH1 on the first PMOSFET region PR1 may be substantially equal to a distance between the first separation pattern SEP1 and the first channel pattern CH1 on the second PMOSFET region PR2. A ratio of the distance between the first separation pattern SEP1 and the first channel pattern CH1 on the second PMOSFET region PR2 to the distance between the first separation pattern SEP1 and the first channel pattern CH1 on the first PMOSFET region PR1 may range from 0.9 to 1.1.

A distance between the second separation pattern SEP2 and the first active pattern AP1 and a distance between the second separation pattern SEP2 and the second active pattern AP2 may be a second distance DI2. Here, the second distance DI2 may be a distance between the second separation pattern SEP2 and the first channel pattern CH1 and a distance between the second separation pattern SEP2 and the second channel pattern CH2. In other words, the distance between the second separation pattern SEP2 and the first channel pattern CH1 may be substantially equal to the distance between the second separation pattern SEP2 and the second channel pattern CH2. A ratio of the distance between the second separation pattern SEP2 and the second channel pattern CH2 to the distance between the second separation pattern SEP2 and the first channel pattern CH1 may range from 0.9 to 1.1. The first distance DI1 may be substantially equal to the second distance DI2. A ratio of the second distance DI2 to the first distance DI1 may range from 0.9 to 1.1.

The gate cutting pattern CT may be formed to penetrate the gate capping pattern GP, the gate electrode GE, and the gate insulating layer GI. The gate cutting patterns CT may be formed of or include at least one of various insulating materials (e.g., silicon oxide, silicon nitride, or combinations thereof).

The gate cutting pattern CT may be disposed on one of the separation patterns SEP. The gate cutting pattern CT may be disposed at a position that is suitable for the division of the gate electrode GE. The gate cutting pattern CT may be provided to penetrate the gate capping pattern GP and contact a top surface of one of the separation patterns SEP. The gate cutting pattern CT may gradually increase in width in the third direction D3. The smallest width of the gate cutting pattern CT disposed on the first separation pattern SEP1 may be the third width W3. The third width W3 may be different from the first width W1. As an example, the third width W3 may be smaller than the first width W1. The smallest width of the gate cutting pattern CT disposed on the second separation pattern SEP2 may be different from the second width W2. As an example, the smallest width of the gate cutting pattern CT disposed on the second separation pattern SEP2 may be smaller than the second width W2. As another example, the smallest width of the gate cutting pattern CT disposed on the second separation pattern SEP2 may be larger than the second width W2.

Referring back to FIGS. 1 and 2A to 2D, the second interlayer insulating layer 120 may be formed on the first interlayer insulating layer 110. The second interlayer insulating layer 120 may include a silicon oxide layer. The active contacts AC may be formed to penetrate the second interlayer insulating layer 120 and the first interlayer insulating layer 110 and to be electrically connected to the first and second source/drain patterns SD1 and SD2. The gate contact GC may be formed to penetrate the second interlayer insulating layer 120 and the gate capping pattern GP and to be electrically connected to the gate electrode GE.

A pair of the division structures DB may be formed at both sides of a logic cell LC. The division structure DB may be formed to penetrate the second interlayer insulating layer 120 and the gate electrode GE and may extend into the active pattern AP1 or AP2. The division structure DB may be formed of or include at least one of various insulating materials (e.g., silicon oxide or silicon nitride).

The third interlayer insulating layer 130 may be formed on the active contacts AC and the gate contacts GC. The first metal layer M1 may be formed in the third interlayer insulating layer 130. The fourth interlayer insulating layer 140 may be formed on the third interlayer insulating layer 130. The second metal layer M2 may be formed in the fourth interlayer insulating layer 140.

The process previously described with reference to FIGS. 3A to 13D may be performed on the peripheral region PER of the substrate 100. However, among the processes described with reference to FIGS. 12A to 12D, the process of removing the oxide layer EG and the sacrificial layers SAL on the peripheral region PER may be omitted. Thus, the oxide layer EG and the sacrificial layers SAL may be left on the peripheral region PER.

Figure 14:
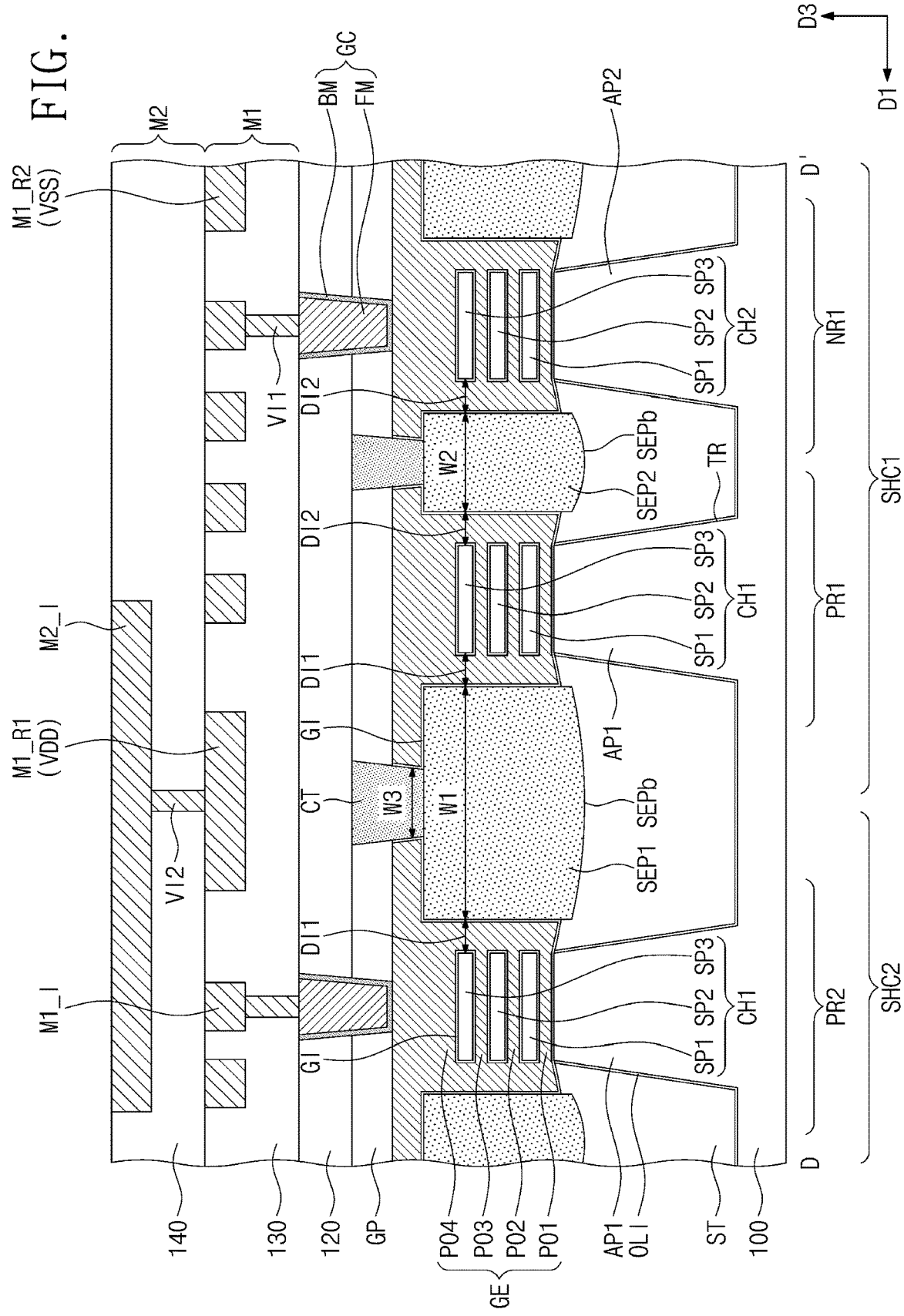
FIG. 14 is a sectional view taken along the line D-D' of FIG. 1 to illustrate a semiconductor device according to an example embodiment.

FIG. 14 is a sectional view taken along the line D-D' of FIG. 1 to illustrate a semiconductor device according to an example embodiment. For concise description, an element previously described with reference to FIGS. 1 and 2A to 2G may be identified by the same reference number without repeating an overlapping description thereof.

Referring to FIGS. 1 and 14, the gate insulating layer GI may extend into a region between the gate electrode GE and the gate cutting pattern CT, and may be in contact with a lower side surface of the gate cutting pattern CT. The gate cutting pattern CT may be spaced apart from the gate electrode GE by the gate insulating layer GI.

Figure 15:
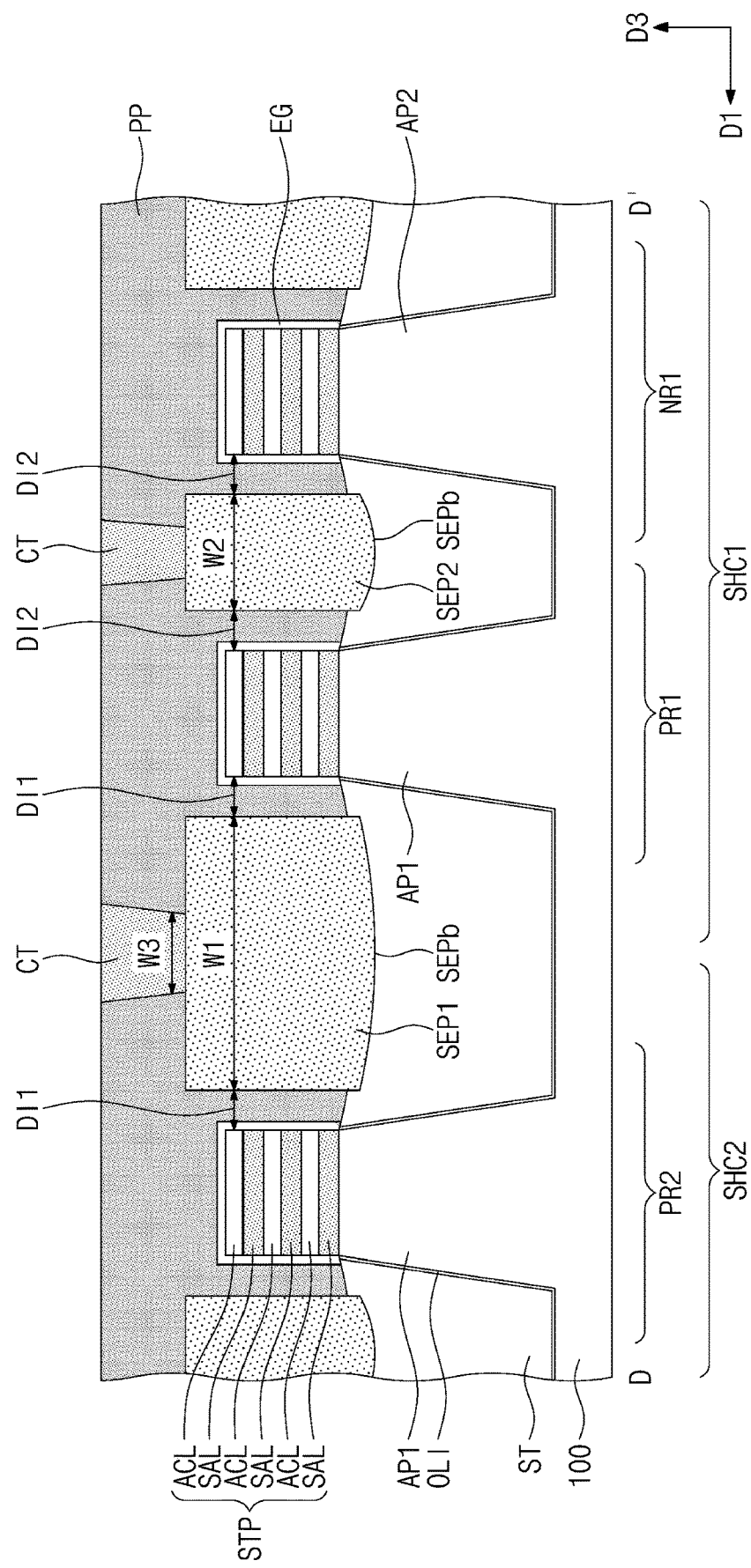
FIGS. 15 and 16 are sectional views, each of which is taken along the line D-D' of FIG. 1 to illustrate a method of fabricating a semiconductor device according to an example embodiment.
Figure 16:
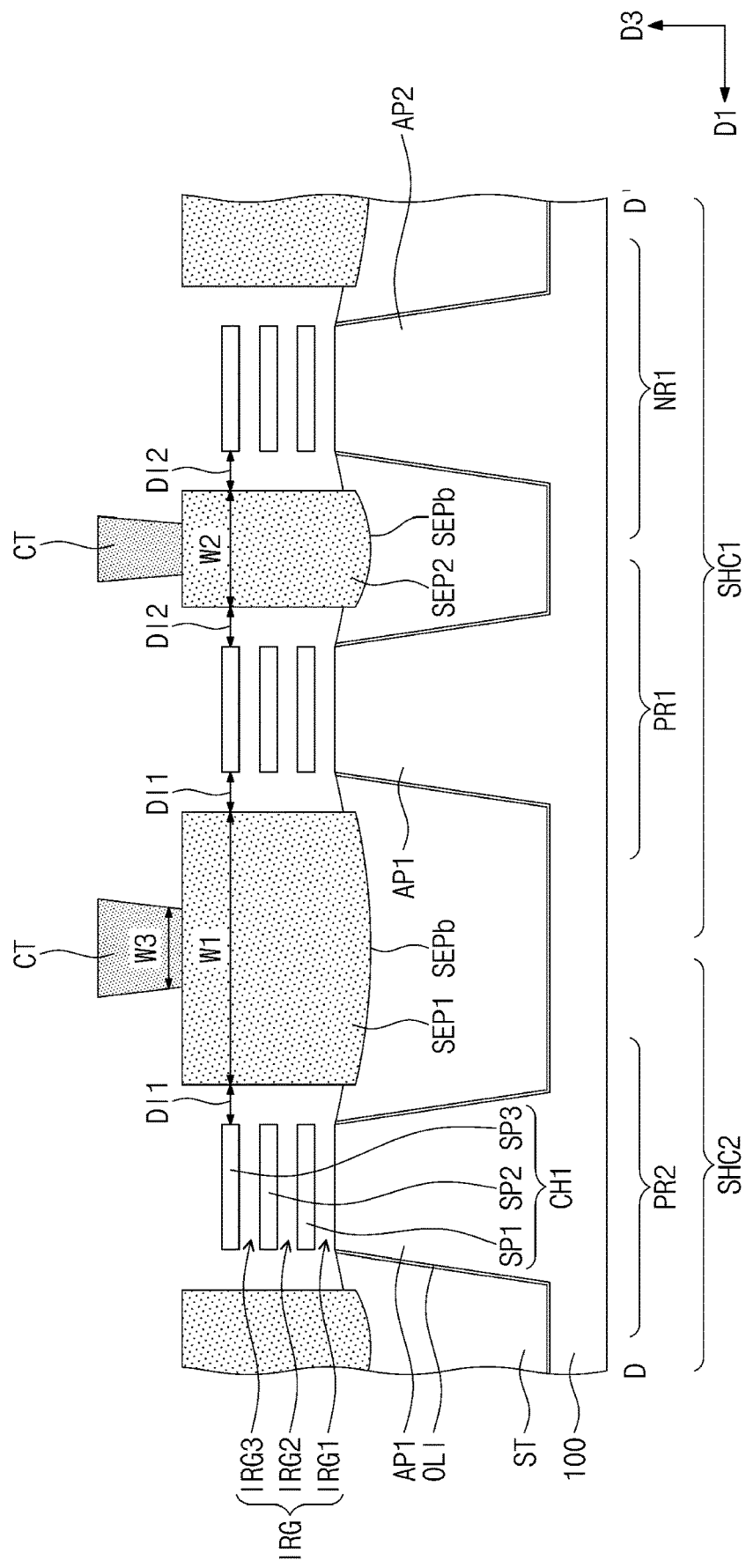

FIGS. 15 and 16 are sectional views, each of which is taken along the line D-D' of FIG. 1 to illustrate a method of fabricating a semiconductor device according to an example embodiment. For concise description, an element previously described with reference to FIGS. 3A to 13D may be identified by the same reference number without repeating an overlapping description thereof.

Figure 11A:
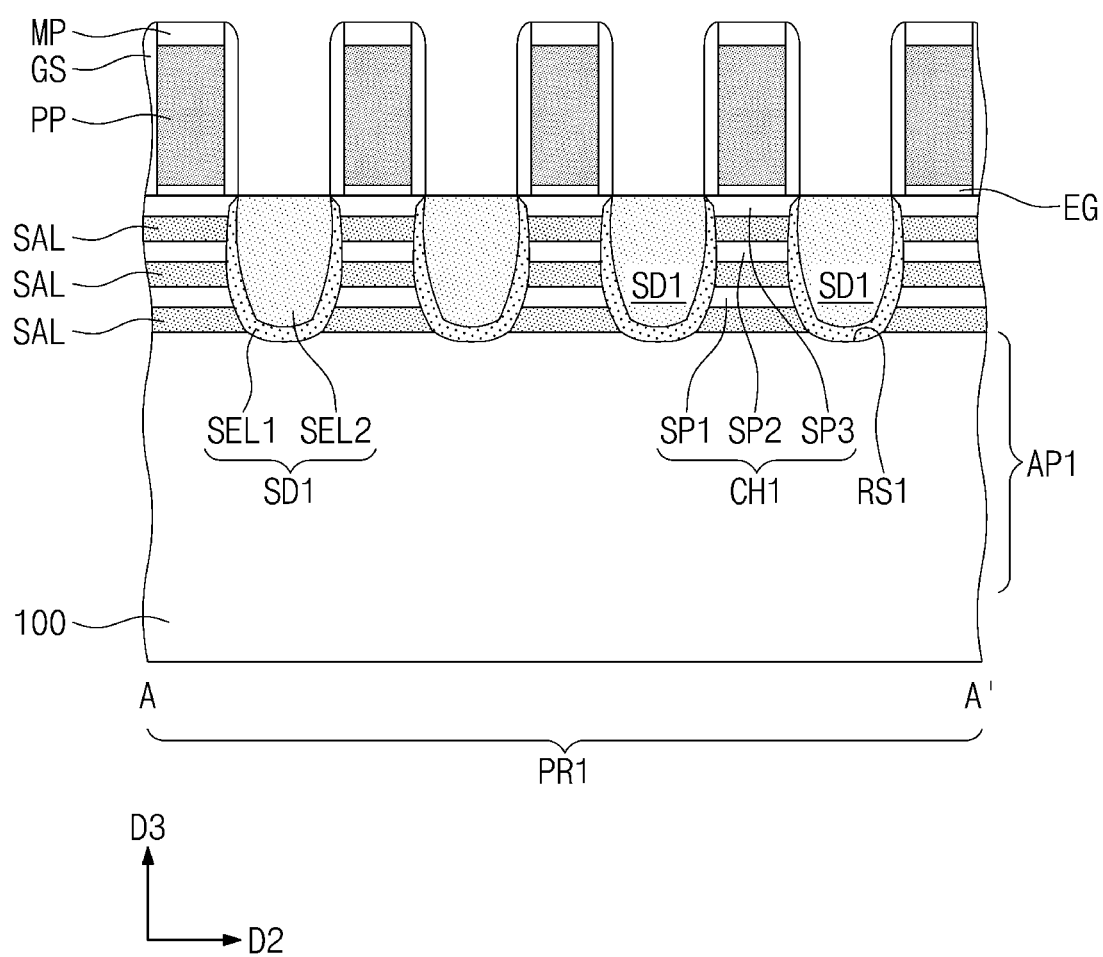
Figure 11B:
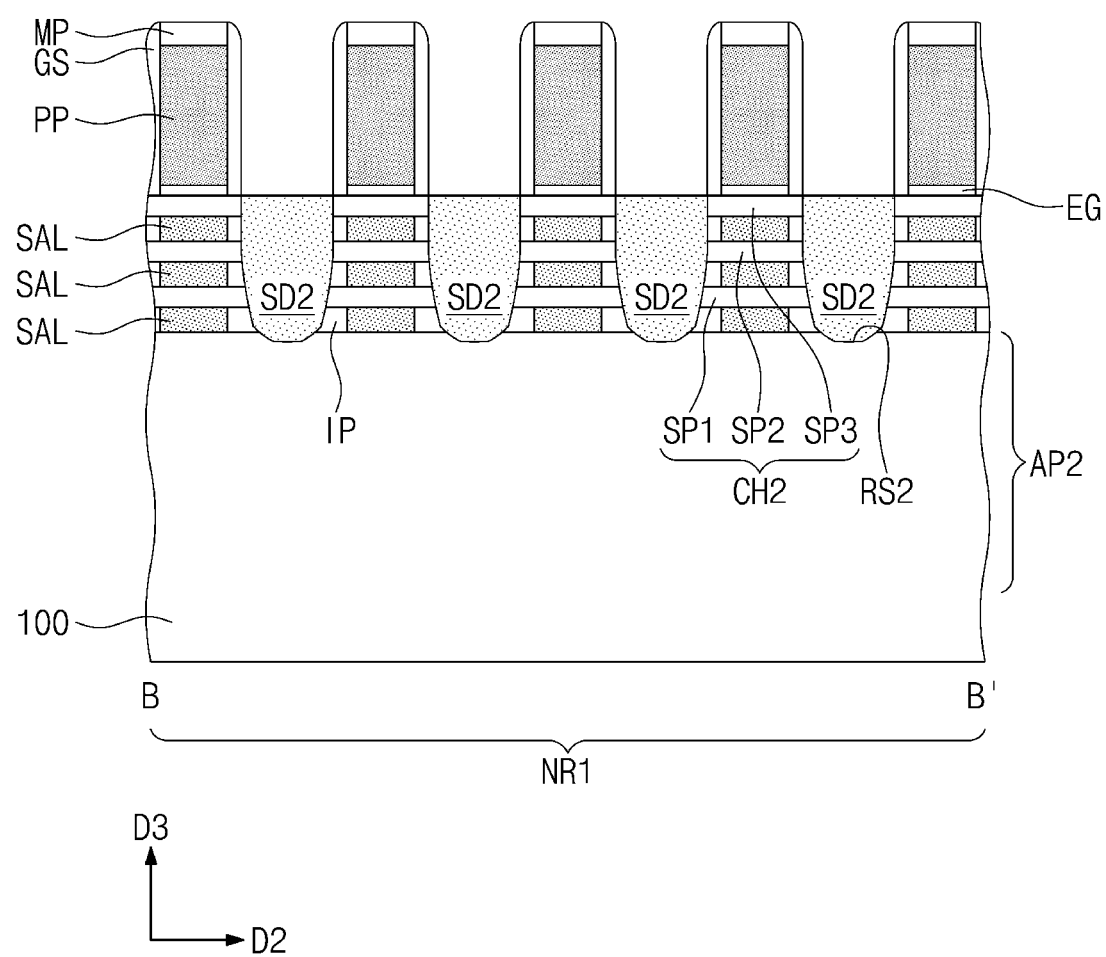
Figure 11C:
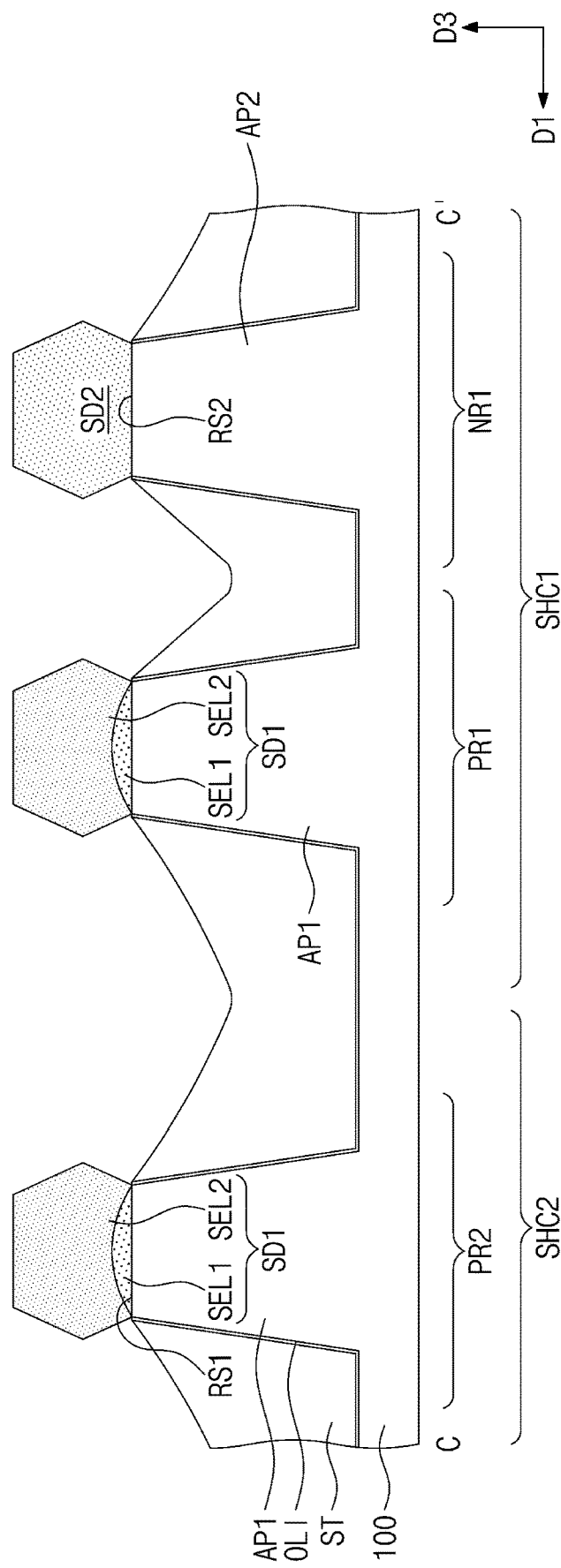
Figure 12A:
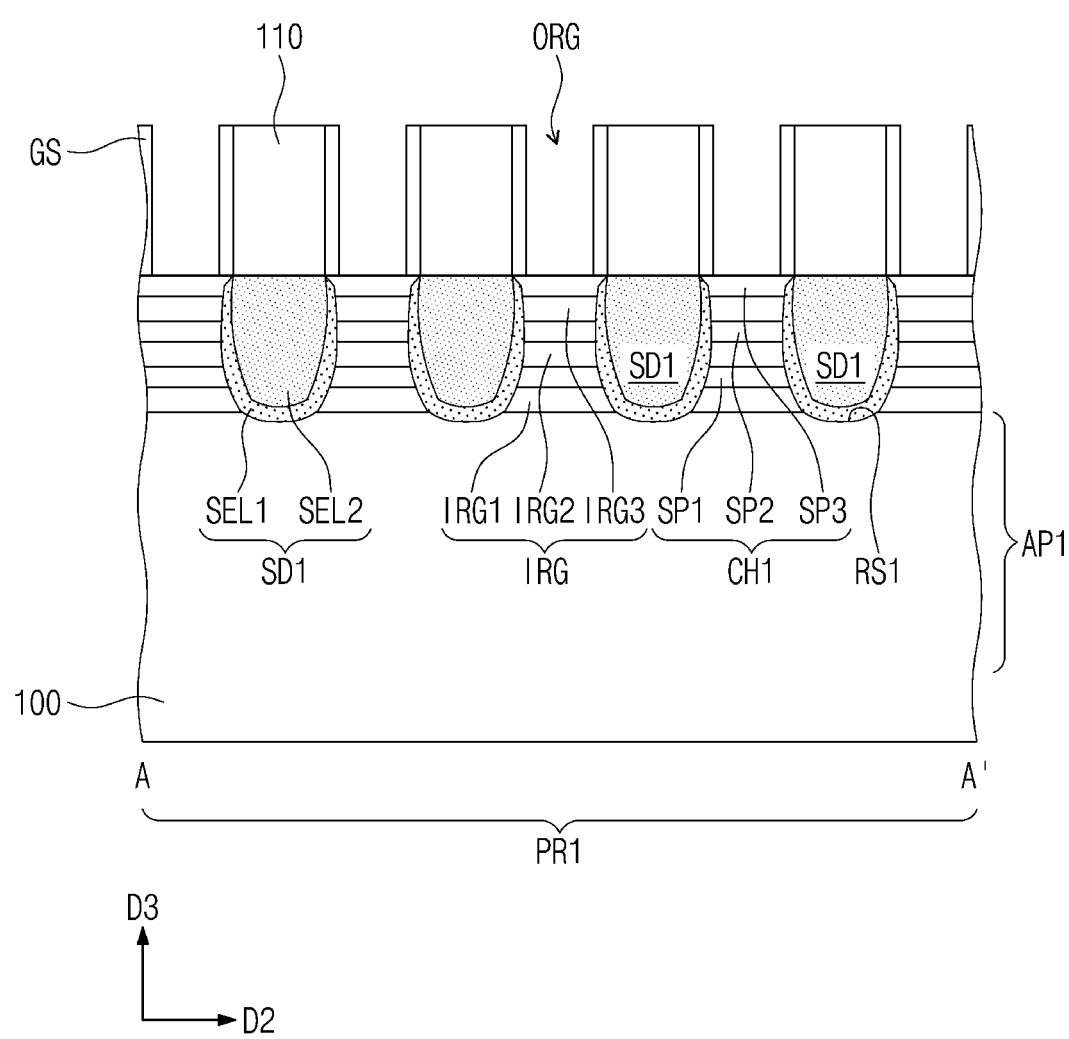
Figure 12B:
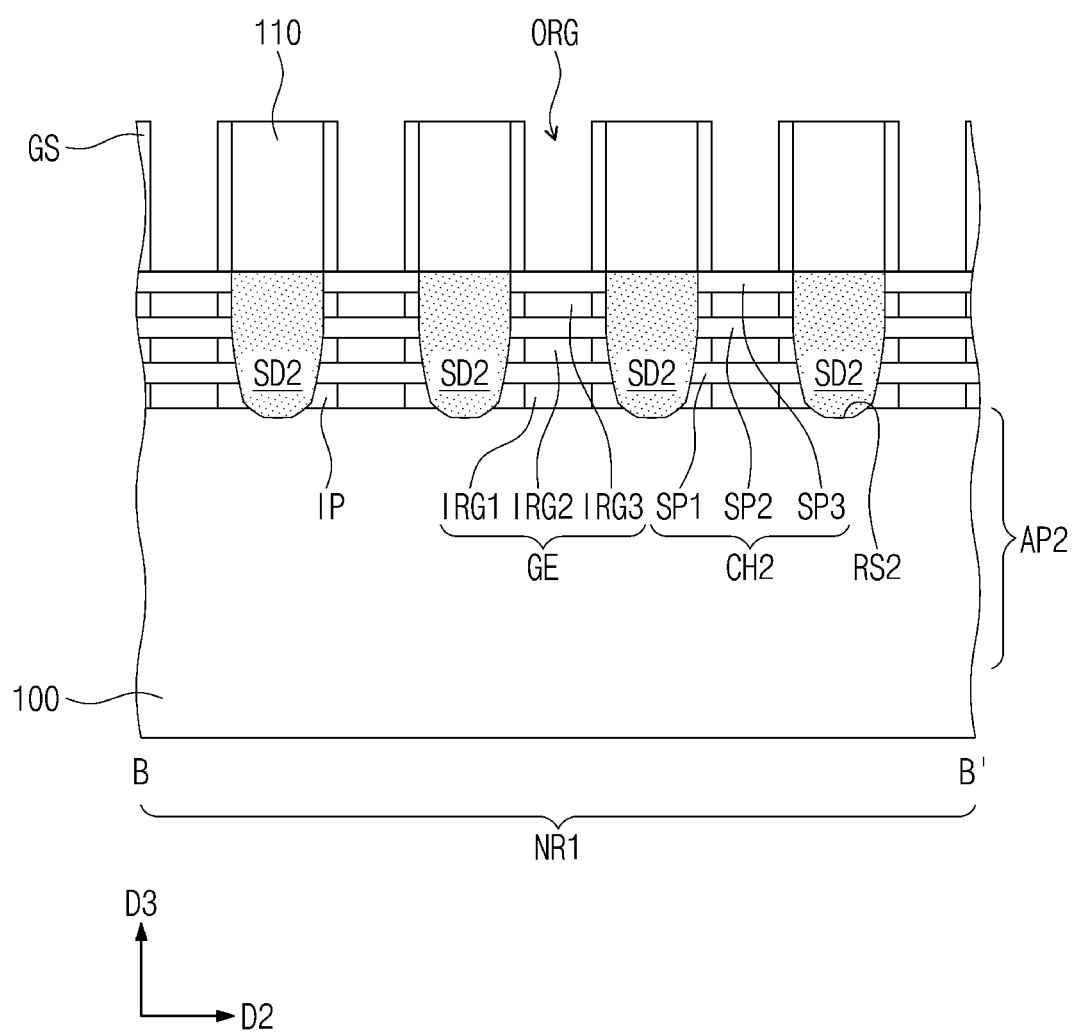
Figure 12C:
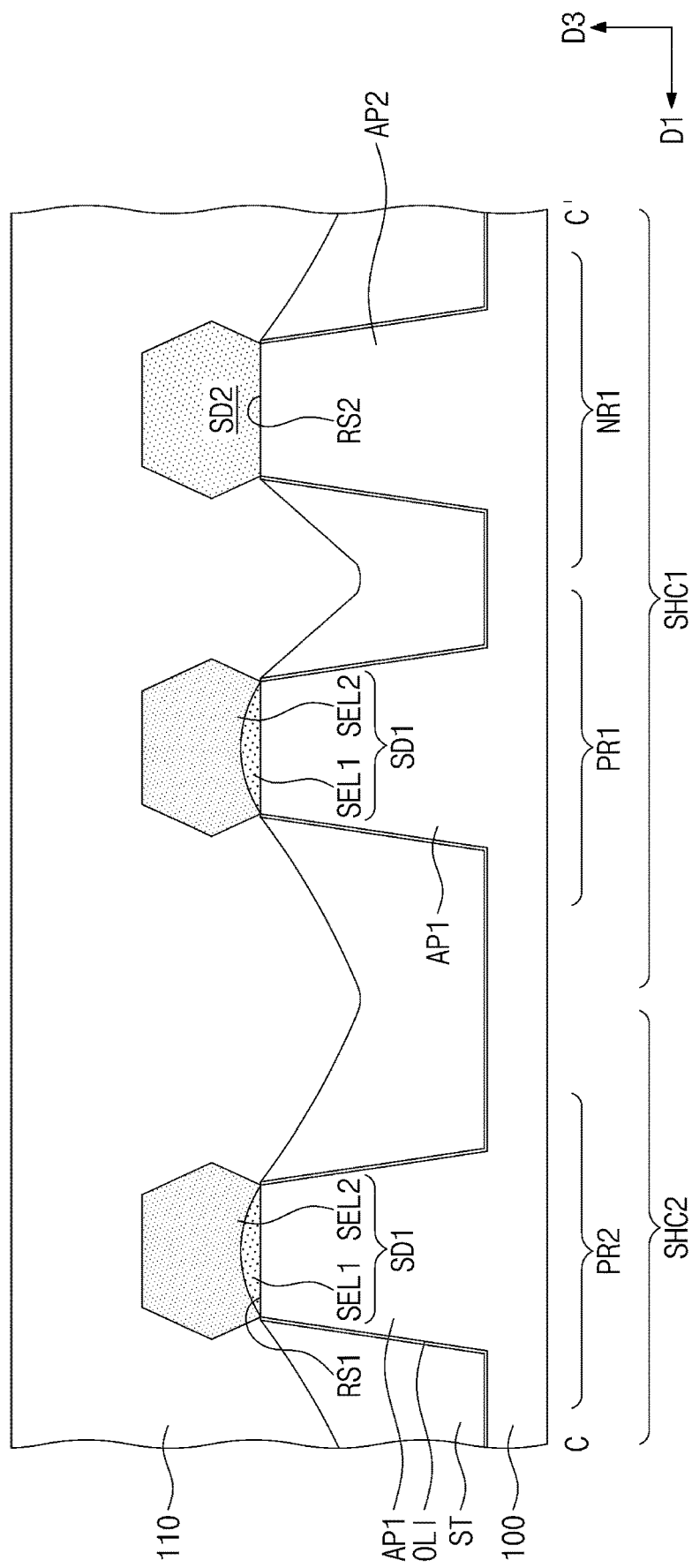
Figure 12D:
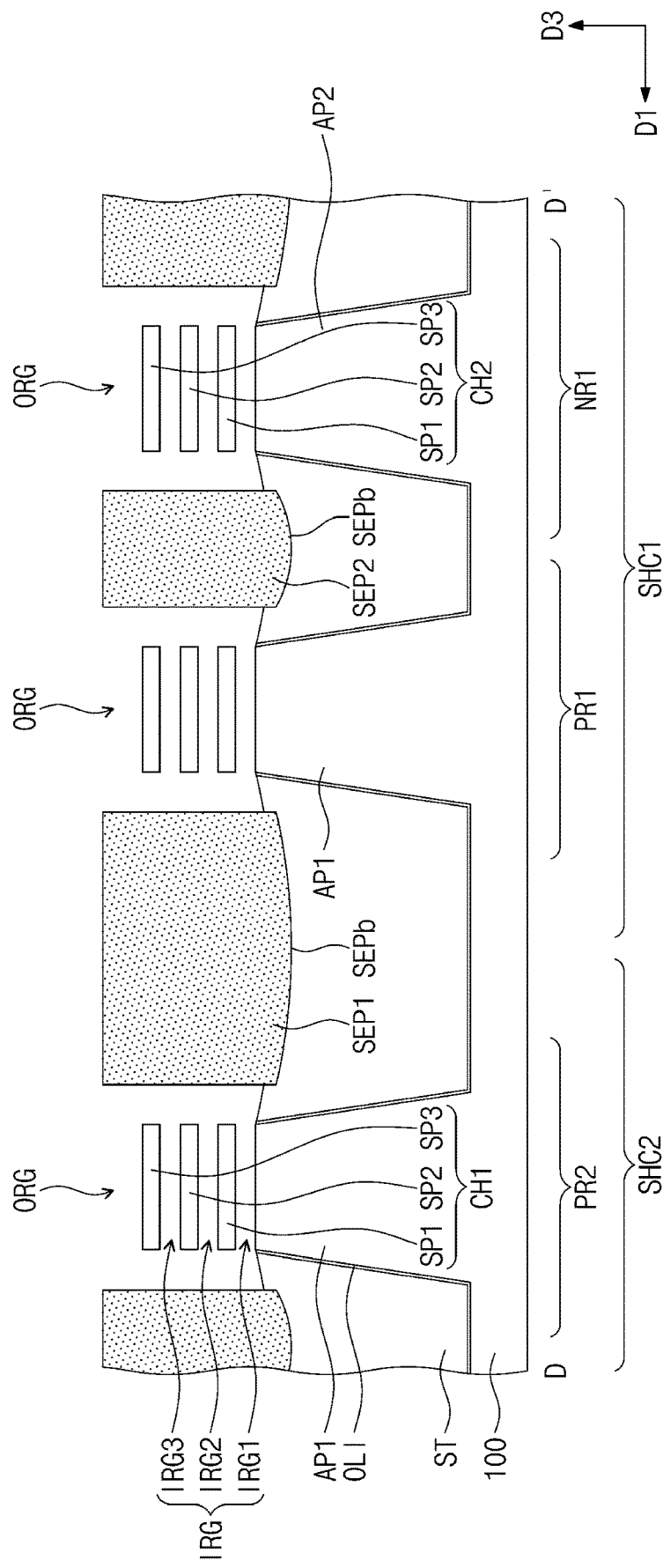
Figure 13A:
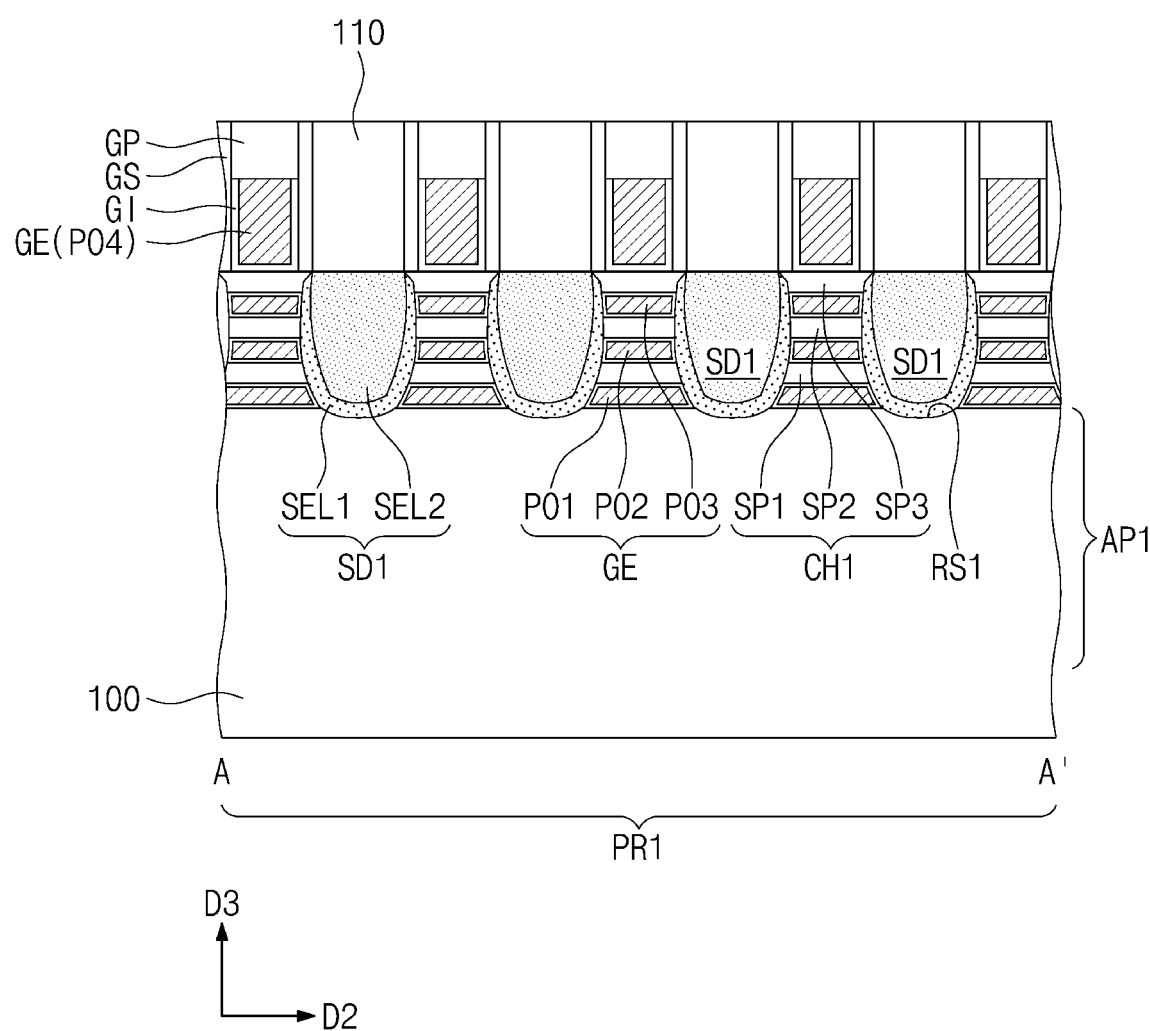
Figure 13B:
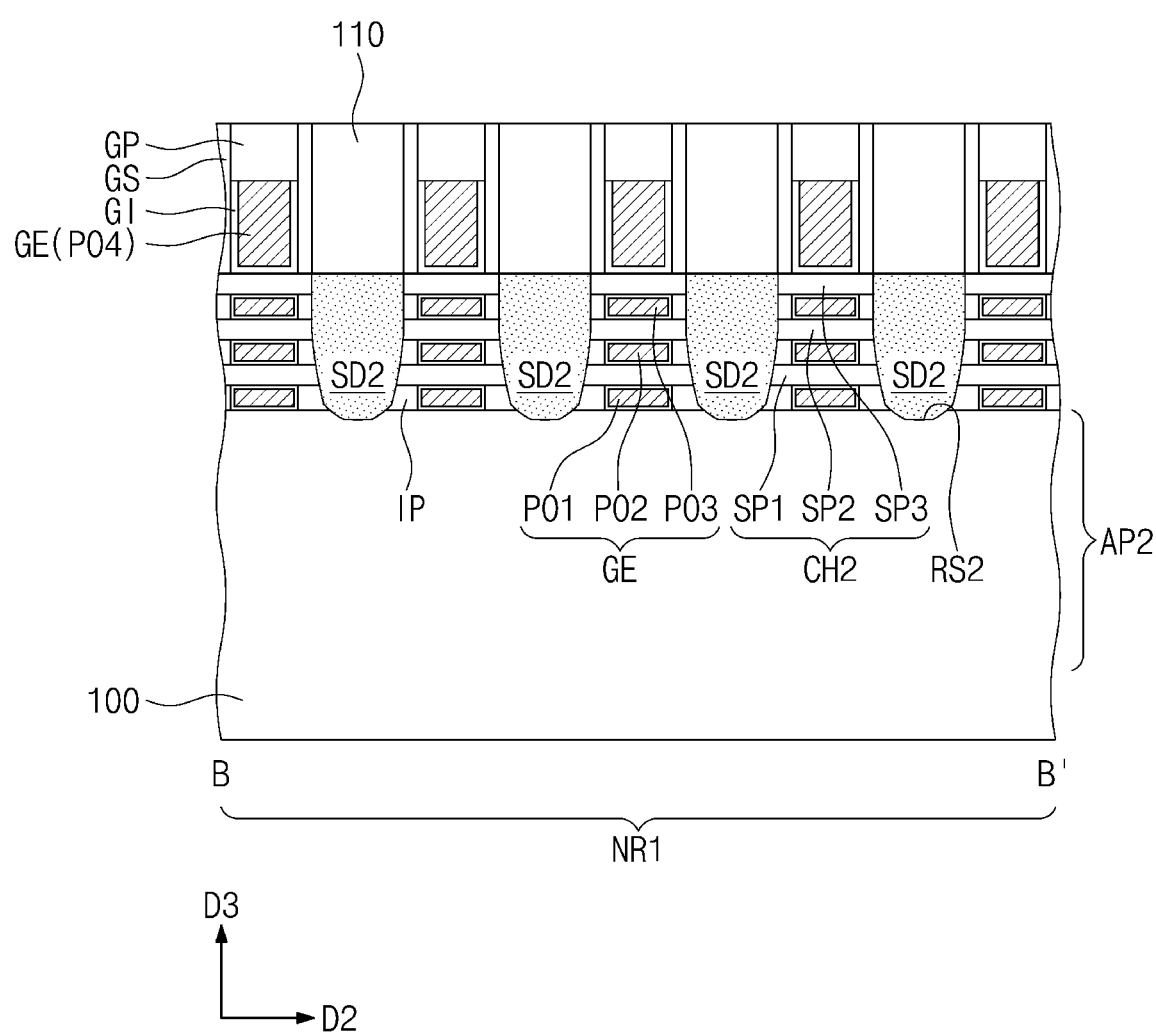
Figure 13C:
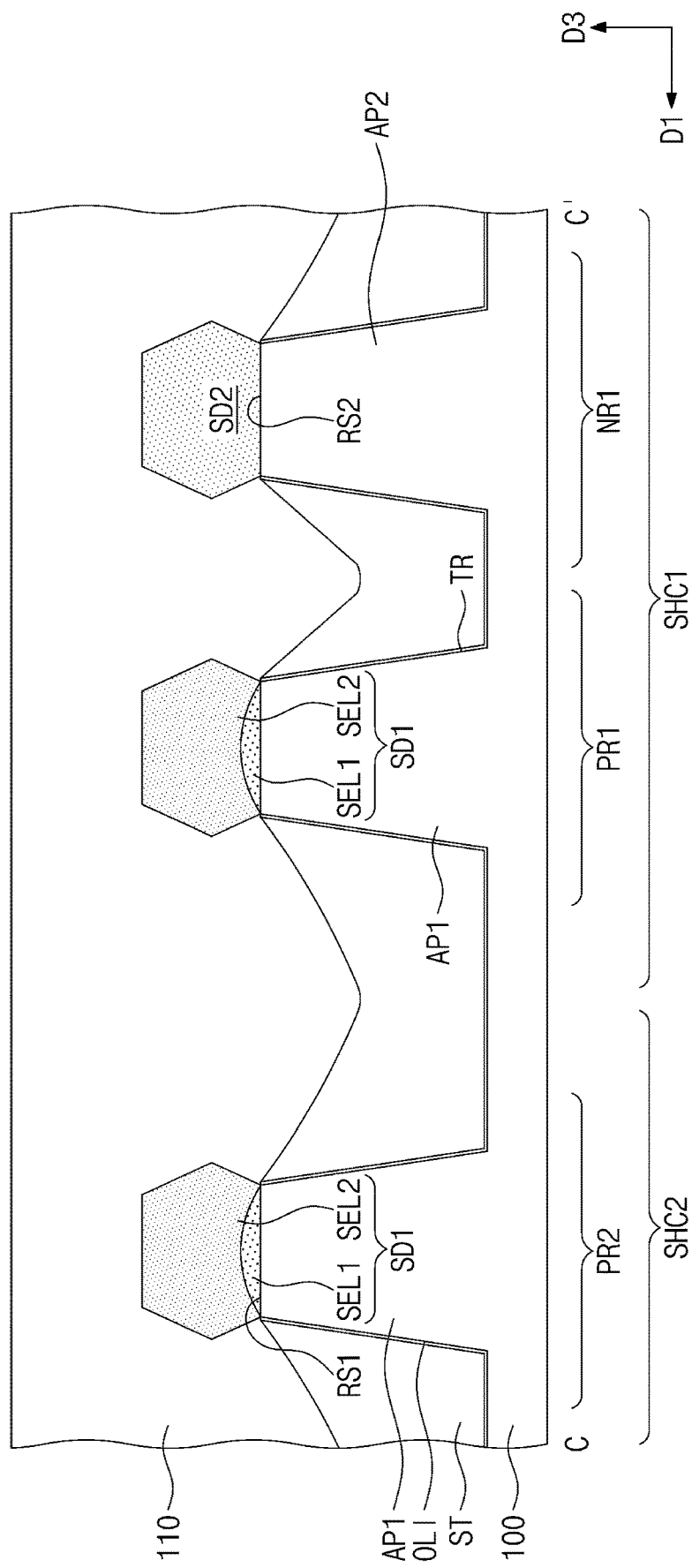
Figure 13D:
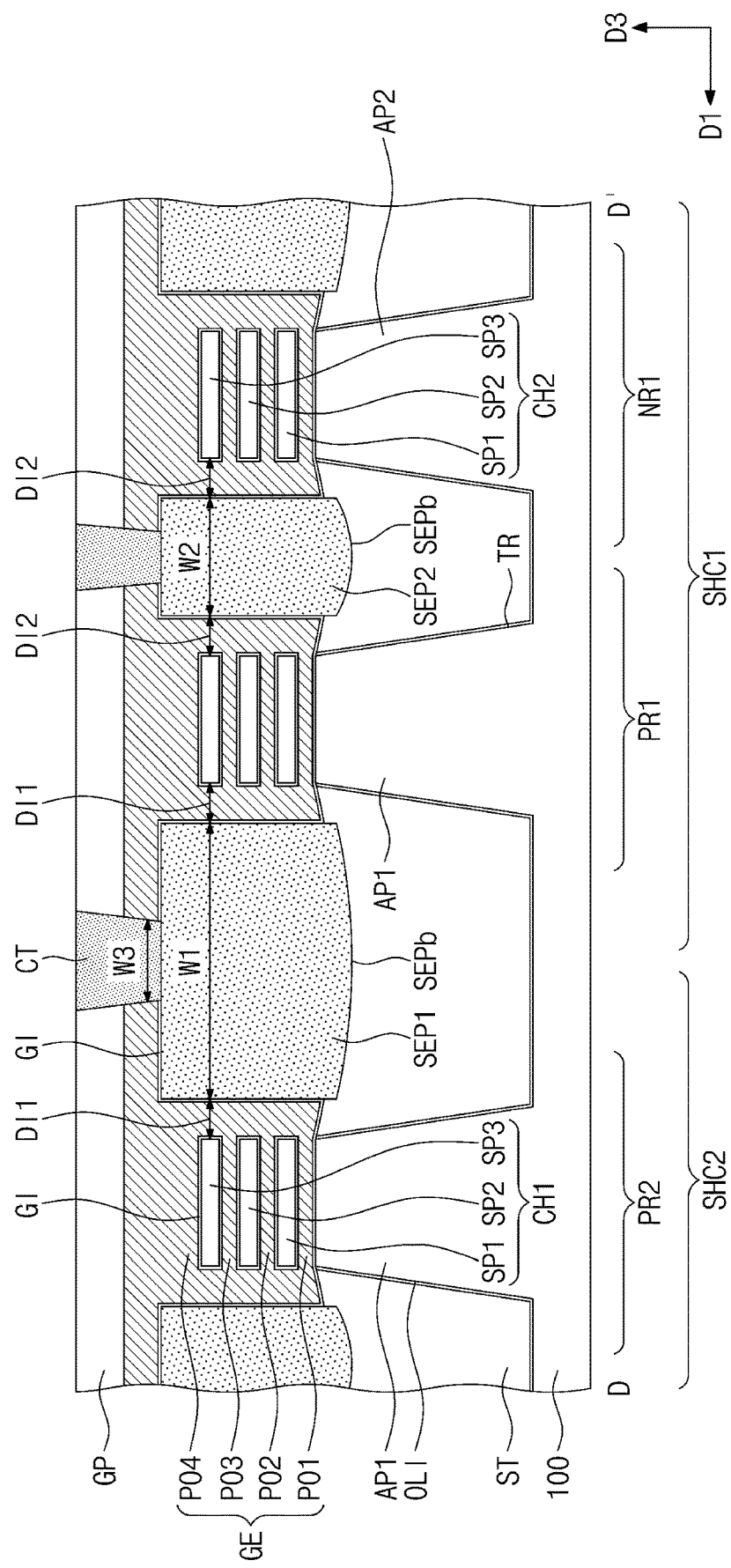

Referring to FIGS. 1 and 15, the mask pattern MP may be removed, after the process described with reference to FIGS. 11A to 11C, and then, the gate cutting pattern CT may be formed to penetrate the sacrificial gate pattern PP.

Referring to FIGS. 1 and 16, the exposed sacrificial gate pattern PP and the oxide layer EG may be removed.

Referring back to FIGS. 1 and 14, the gate insulating layer GI may be formed on, and for example may conformally cover, the exposed first to third semiconductor patterns SP1, SP2, and SP3 and a lower side surface of the exposed gate cutting pattern CT. The gate electrode GE may be formed on the gate insulating layer GI. The gate capping pattern GP may be formed on the gate electrode GE. The gate insulating layer GI may be provided on and, for example, may cover top and side surfaces of each of the separation patterns SEP. Thereafter, the process described with reference to FIGS. 2A to 2D may be performed. As a result, the semiconductor device may be fabricated to have the structure described with reference to FIG. 14.

FIG. 17 is a sectional view taken along the line D-D' of FIG. 1 to illustrate a semiconductor device according to an example embodiment. For concise description, an element previously described with reference to FIGS. 1 and 2A to 2G may be identified by the same reference number without repeating an overlapping description thereof.

Referring to FIGS. 1 and 17, a second trench TR2 may be formed in an upper portion of the substrate 100 to define the first PMOSFET region PR1, the second PMOSFET region PR2, the first NMOSFET region NR1, and the second NMOSFET region NR2. First trenches TR1 may be defined between adjacent ones of the first active patterns AP1 and between adjacent ones of the second active patterns AP2. The first trenches TR1 may be shallower than the second trench TR2.

The device isolation layer ST may be provided in the first and second trenches TR1 and TR2. An upper portion of each of the first and second active patterns AP1 and AP2 may be a portion vertically protruding to a level higher than the device isolation layer ST. The upper portion of each of the first and second active patterns AP1 and AP2 may have a fin shape. The device isolation layer ST may not cover the upper portion of each of the first and second active patterns AP1 and AP2. The device isolation layer ST may be provided on a lower side surface of each of the first and second active patterns AP1 and AP2.

According to an example embodiment, separation patterns may be formed in a self-aligned manner using a conformally-formed first sacrificial layer. If a gate cutting pattern is formed to penetrate a sacrificial gate pattern using a photolithography process as in a related technology, the gate cutting pattern may be formed too close to a channel pattern, due to a misalignment issue. In this case, a portion of the sacrificial gate pattern may not be removed or the gate cutting pattern may not be formed to completely penetrate the sacrificial gate pattern. Similarly, in the case where a gate electrode is formed and then the gate cutting pattern is formed to penetrate the gate electrode, the gate cutting pattern may be misaligned, and in this case, a work function metal of the gate electrode may be partially removed. By contrast, according to an example embodiment, because the separation pattern is formed in a self-aligned manner, it may be possible to secure a sufficiently large distance to each of the channel patterns and thereby prevent the afore-described problems. As a result, electric characteristics of a semiconductor device may be improved.

While example embodiments have been particularly shown and described, it will be understood by one of ordinary skill in the art that variations in form and detail may be made therein without departing from the spirit and scope of the attached claims.

What is claimed is:

1. A semiconductor device, comprising:
    a first active pattern, a second active pattern, and a third active pattern, which are provided on a logic cell region of a substrate and are spaced apart from each other in a first direction;
    a first gate electrode and a second gate electrode, which are aligned with each other along the first direction, the first gate electrode crossing the first active pattern and the second gate electrode crossing the second active pattern;
    a first separation pattern provided between the first active pattern and the second active pattern, wherein a bottom surface of the first separation pattern has a curved profile;
    a second separation pattern provided between the second active pattern and the third active pattern;
    a first gate insulating layer interposed between the first gate electrode and the first active pattern;
    a first gate cutting pattern, which is interposed between the first gate electrode and the second gate electrode and is in contact with a top surface of the first separation pattern; and
    a device isolation layer, which is provided on the substrate to define the first active pattern and the second active pattern, wherein the first separation pattern penetrates an upper portion of the device isolation layer,
    wherein a largest width of the first separation pattern along the first direction is larger than a largest width of the second separation pattern along the first direction, and
    wherein the first gate insulating layer extends between the first gate electrode and the first separation pattern, and is in contact with side and top surfaces of the first separation pattern.

2. The semiconductor device of claim 1, wherein the first gate insulating layer extends between the first gate electrode and the first gate cutting pattern, and is in contact with a lower side surface of the first gate cutting pattern.

3. The semiconductor device of claim 1, further comprising a second gate insulating layer interposed between the second active pattern and the second gate electrode,
    wherein the second gate insulating layer extends between the second gate electrode and the first separation pattern, and between the second gate electrode and the second separation pattern, and
    wherein the second gate insulating layer is in contact with side and top surfaces of the first separation pattern, and side and top surfaces of the second separation pattern.

4. The semiconductor device of claim 1, wherein a smallest width of the first gate cutting pattern along the first direction is different from a largest width of the first separation pattern along the first direction.

5. The semiconductor device of claim 1, wherein a distance along the first direction between the first separation pattern and the first active pattern is substantially equal to a distance along the first direction between the first separation pattern and the second active pattern.

6. The semiconductor device of claim 1, wherein a distance along the first direction between the first separation pattern and the first active pattern is substantially equal to a distance along the first direction between the second separation pattern and the second active pattern.

7. The semiconductor device of claim 1, wherein the semiconductor device comprises a fourth active pattern and a fifth active pattern, which are provided on a peripheral region of the substrate and are spaced apart from each other in the first direction,
    wherein each of the first to third active patterns comprises semiconductor patterns, which are stacked in an upper portion thereof to be spaced apart from each other along a third direction perpendicular to an upper surface of the substrate,
    wherein a peripheral channel pattern is provided in each of the fourth active pattern and the fifth active pattern, and
    wherein the peripheral channel pattern comprises semiconductor patterns, which are vertically stacked, and sacrificial layers, which are respectively interposed between the semiconductor patterns.

8. The semiconductor device of claim 7, further comprising a third separation pattern provided between the fourth active pattern and the fifth active pattern,
    wherein a largest width of the third separation pattern along the first direction is larger than a largest width of the second separation pattern along the first direction.

9. The semiconductor device of claim 7, further comprising:
    a peripheral gate electrode crossing the fourth active pattern; and
    a peripheral gate insulating layer provided between the peripheral gate electrode and the peripheral channel pattern, wherein the peripheral gate insulating layer comprises:
  an oxide layer provided on the peripheral channel pattern; and
  a high-k dielectric layer provided on the oxide layer, and
wherein the oxide layer is conformally provided on top and side surfaces of the peripheral channel pattern.

10. A semiconductor device, comprising:
a substrate comprising a peripheral region and a logic cell region;
a first active pattern and a second active pattern, which are provided on the logic cell region and are spaced apart from each other in a first direction;
a device isolation layer provided on the substrate between the first active pattern and the second active pattern;
a first gate electrode and a second gate electrode, which are aligned with each other along the first direction, the first active pattern crossing the first active pattern and the second gate electrode crossing the second active pattern;
a third active pattern provided on the peripheral region, the third active pattern comprising a peripheral channel pattern provided in an upper portion thereof;
a peripheral gate electrode crossing the third active pattern;
a peripheral gate insulating layer provided between the peripheral gate electrode and the peripheral channel pattern, the peripheral gate insulating layer comprising an oxide layer provided on the peripheral channel pattern and a high-k dielectric layer provided on the oxide layer;
a first separation pattern provided between the first active pattern and the second active pattern, and penetrating an upper portion of the device isolation layer; and
a gate cutting pattern interposed between the first gate electrode and the second gate electrode, and contacting the first separation pattern,
wherein the oxide layer is conformally provided on top and side surfaces of the peripheral channel pattern, and
wherein a bottom surface of the first separation pattern has a convex profile toward the device isolation layer.

11. The semiconductor device of claim 10, further comprising:
a fourth active pattern, which is provided on the logic cell region and is spaced apart from the second active pattern in the first direction, a distance between the first active pattern and the second active pattern along the first direction being larger than a distance between the second active pattern and the fourth active pattern along the first direction; and
a second separation pattern provided between the second active pattern and the fourth active pattern,
wherein a largest width of the first separation pattern along the first direction is larger than a largest width of the second separation pattern along the first direction.

12. The semiconductor device of claim 11, further comprising:
a fifth active pattern, which is provided on the peripheral region and is spaced apart from the third active pattern in the first direction; and
a third separation pattern provided between the third active pattern and the fifth active pattern,
wherein a largest width of the third separation pattern along the first direction is larger than a largest width of the second separation pattern along the first direction.

13. The semiconductor device of claim 11, wherein a distance between the first separation pattern and the first active pattern along the first direction is substantially equal to a distance between the second separation pattern and the second active pattern along the first direction.

14. The semiconductor device of claim 10, wherein a smallest width of the gate cutting pattern along the first direction is different from a largest width of the first separation pattern along the first direction.

15. A semiconductor device, comprising:
a substrate comprising a logic cell region;
a first active pattern, a second active pattern, and a third active pattern, which are provided on the logic cell region and are spaced apart from each other in a first direction;
a device isolation layer provided on the substrate between the first active pattern and the second active pattern, and between the second active pattern and the third active pattern;
a pair of first source/drain patterns provided on the first active pattern, a pair of second source/drain patterns provided on the second active pattern, and a pair of third source/drain patterns provided on the third active pattern;
a first channel pattern provided between the pair of first source/drain patterns, a second channel pattern provided between the pair of second source/drain patterns, and a third channel pattern provided between the pair of third source/drain patterns;
a first gate electrode provided on the first channel pattern;
a second gate electrode provided on the second channel pattern;
a first gate insulating layer interposed between the first channel pattern and the first gate electrode;
a second gate insulating layer interposed between the second channel pattern and the second gate electrode;
a first pair of gate spacers provided on sides of the first gate electrode and a second pair of gate spacers provided on sides of the second gate electrode;
a gate capping pattern provided on the first gate electrode and the second gate electrode;
a first separation pattern provided between the first active pattern and the second active pattern, and penetrating a first upper portion of the device isolation layer;
a second separation pattern provided between the second active pattern and the third active pattern, and penetrating a second upper portion of the device isolation layer;
a first interlayer insulating layer provided on the gate capping pattern;
a first gate cutting pattern, which is interposed between the first gate electrode and the second gate electrode, penetrates the gate capping pattern and is in contact with a top surface of the first separation pattern;
an active contact, which penetrates the first interlayer insulating layer and is electrically connected to one of the first to third source/drain patterns;
a gate contact, which penetrates the first interlayer insulating layer and the gate capping pattern, and is electrically connected to one of the first and second gate electrodes;
a second interlayer insulating layer provided on the first interlayer insulating layer;
a first metal layer, which is provided in the second interlayer insulating layer and is electrically connected to the active contact; and
a second metal layer provided on the first metal layer, wherein a largest width of the first separation pattern along the first direction is larger than a largest width of the second separation pattern along the first direction, and wherein the first gate insulating layer extends between the first gate electrode and the first separation pattern, and is in contact with side and top surfaces of the first separation pattern.

16. The semiconductor device of claim 15, wherein the first gate insulating layer extends between the first gate electrode and the first gate cutting pattern, and is in contact with a lower side surface of the first gate cutting pattern.

17. The semiconductor device of claim 15, wherein a bottom surface of the first separation pattern has a curved profile.

18. The semiconductor device of claim 15, wherein a ratio of a distance between the second separation pattern and the second channel pattern along the first direction to a distance between the first separation pattern and the first channel pattern along the first direction ranges from 0.9 to 1.1.

19. The semiconductor device of claim 15, wherein the semiconductor device further comprises:
   a fourth active pattern and a fifth active pattern, which are provided on a peripheral region of the substrate and are spaced apart from each other in the first direction;
   a third separation pattern provided between the fourth active pattern and the fifth active pattern; and
   a second gate cutting pattern in contact with a top surface of the third separation pattern, and
   wherein a largest width of the third separation pattern along the first direction is larger than a largest width of the second separation pattern along the first direction.

* * * * *